United States Patent
Park et al.

(10) Patent No.: US 9,431,610 B2
(45) Date of Patent: Aug. 30, 2016

(54) METHODS OF MANUFACTURING A PHASE CHANGE MEMORY DEVICE INCLUDING A HEAT SINK

(71) Applicant: Samsung Electronics Co., Ltd., Suwon-si, Gyeonggi-do (KR)

(72) Inventors: Tae-Jin Park, Yongin-si (KR); Yoon-Jong Song, Seoul (KR); Chil-Hee Chung, Seoul (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 14/868,350

(22) Filed: Sep. 28, 2015

(65) Prior Publication Data
US 2016/0020393 A1   Jan. 21, 2016

Related U.S. Application Data

(62) Division of application No. 13/749,646, filed on Jan. 24, 2013, now abandoned.

(30) Foreign Application Priority Data

Jun. 1, 2012   (KR) .................. 10-2012-0059323

(51) Int. Cl.
*H01L 45/00* (2006.01)
*H01L 27/24* (2006.01)

(52) U.S. Cl.
CPC ........ *H01L 45/1683* (2013.01); *H01L 27/2409* (2013.01); *H01L 27/2463* (2013.01); *H01L 45/06* (2013.01); *H01L 45/126* (2013.01); *H01L 45/1233* (2013.01); *H01L 45/1286* (2013.01); *H01L 45/144* (2013.01); *H01L 45/16* (2013.01); *H01L 45/1608* (2013.01)

(58) Field of Classification Search
CPC .................................................. H01L 45/1286
See application file for complete search history.

(56) References Cited

U.S. PATENT DOCUMENTS

| | | | |
|---|---|---|---|
| 7,601,995 B2 | 10/2009 | Happ et al. | |
| 7,754,522 B2 | 7/2010 | Liu | |
| 7,956,343 B2 | 6/2011 | Kwon et al. | |
| 2003/0151131 A1 | 8/2003 | Deeter et al. | |
| 2006/0133174 A1 | 6/2006 | Kim et al. | |
| 2007/0148855 A1 | 6/2007 | Chen et al. | |
| 2008/0165574 A1 | 7/2008 | Kim et al. | |
| 2009/0039333 A1 | 2/2009 | Chang et al. | |
| 2009/0194758 A1* | 8/2009 | Chen | G11C 11/5678 257/4 |
| 2009/0267045 A1 | 10/2009 | Chang et al. | |
| 2010/0059732 A1 | 3/2010 | Chang | |

(Continued)

FOREIGN PATENT DOCUMENTS

JP         2010087007 A    4/2010

*Primary Examiner* — Lex Malsawma
*Assistant Examiner* — Gardner W Swan
(74) *Attorney, Agent, or Firm* — Renaissance IP Law Group LLP

(57) ABSTRACT

A phase change memory device includes a phase change memory unit and a heat sink. The phase change memory unit includes a phase change material layer pattern, a lower electrode beneath the phase change material layer pattern configured to heat the phase change material layer pattern, and an upper electrode on the phase change material layer pattern. The heat sink configured to absorb heat from the phase change memory unit. The heat sink has a top surface lower than a top surface of the upper electrode and is spaced apart from the phase change memory unit.

7 Claims, 86 Drawing Sheets

(56) References Cited

U.S. PATENT DOCUMENTS

| | | |
|---|---|---|
| 2010/0061145 A1 | 3/2010 | Weis |
| 2010/0096610 A1 | 4/2010 | Wang et al. |
| 2010/0203672 A1 | 8/2010 | Eun et al. |
| 2010/0264395 A1 | 10/2010 | Liu |
| 2010/0288993 A1 | 11/2010 | Rho |
| 2011/0220858 A1 | 9/2011 | Hwang et al. |
| 2013/0134371 A1 | 5/2013 | Park |

* cited by examiner

1ST DIRECTION ⊗ → 2ND DIRECTION

2ND DIRECTION ⊗ → 1ST DIRECTION

1ST DIRECTION ⊗  ⟶ 2ND DIRECTION

2ND DIRECTION ⊗  ⟶ 1ST DIRECTION

1ST DIRECTION    2ND DIRECTION

1ST DIRECTION ⊗ → 2ND DIRECTION

2ND DIRECTION ⊗ → 1ST DIRECTION

1ST DIRECTION  2ND DIRECTION

1ST DIRECTION ⊗ → 2ND DIRECTION

2ND DIRECTION ⊗ → 1ST DIRECTION

1ST DIRECTION ⊗ → 2ND DIRECTION

2ND DIRECTION ⊗ → 1ST DIRECTION

METHODS OF MANUFACTURING A PHASE CHANGE MEMORY DEVICE INCLUDING A HEAT SINK

CROSS-REFERENCE TO RELATED APPLICATIONS

This U.S. non-provisional patent application is a divisional of U.S. patent application Ser. No. 13/749,646, filed Jan. 24, 2013 which application claims priority under 35 USC §119 to Korean Patent Application No. 10-2012-0059323, filed on Jun. 1, 2012 in the Korean Intellectual Property Office (KIPO), the contents of which are herein incorporated by reference in their entirety.

BACKGROUND

1. Field

Embodiments relate to a phase change memory device and a method of manufacturing the same. More particularly, example embodiments relate to a phase change memory device having a heat sink and a method of manufacturing the same.

2. Description of the Related Art

In a phase change memory device, Joule heat generated in a lower electrode and/or a phase change material layer in a memory cell may affect the crystallization of a phase change material layer in adjacent memory cells to cause a thermal crosstalk. In order to solve the problem, a heat sink absorbing Joule heat has been developed, however, there is no efficient method of forming and/or arranging the heat sink.

SUMMARY

Some embodiments provide a phase change memory device having a heat sink efficiently arranged.

Some embodiments provide a method of manufacturing a phase change memory device having a heat sink efficiently arranged.

According to some embodiments, there is provided a phase change memory device including a phase change memory unit and a heat sink. The phase change memory unit includes a phase change material layer pattern, a lower electrode beneath the phase change material layer pattern heating the phase change material layer pattern, and an upper electrode on the phase change material layer pattern. The heat sink absorbs heat from the phase change memory unit. The heat sink has a top surface lower than a top surface of the upper electrode and is spaced apart from the phase change memory unit.

In some embodiments, the heat sink may include a metal, and the phase change memory device may further include an insulation layer electrically insulating the heat sink from the phase change memory unit.

In some embodiments, the heat sink may include titanium nitride.

In some embodiments, the top surface of the heat sink may be lower than a bottom surface of the upper electrode.

In some embodiments, the top surface of the heat sink may be higher than a top surface of the lower electrode.

In some embodiments, a bottom surface of the heat sink may be lower than a bottom surface of the lower electrode.

In some embodiments, the phase change memory device may further include a contact plug on the lower electrode, and a bottom surface of the heat sink may be lower than a top surface of the contact plug.

In some embodiments, a bottom surface of the phase change material layer pattern may have a shape and an area substantially the same as those of the lower electrode.

In some embodiments, a bottom surface of the lower electrode may have an area larger than that of a top surface thereof, and the lower electrode may have a vertical cross-section of an "L" shape.

In some embodiments, the lower electrode may have a vertical cross-section of a bar shape.

According to some embodiments, there is provided a phase change memory device including a plurality of word lines, a plurality of diodes, phase change material layer patterns, upper electrodes, a first heat sink, and bit lines. The word lines are arranged in a first direction, each of which extends in a second direction substantially perpendicular to the first direction. The diodes are arranged in the second direction on each word line. The lower electrodes are electrically connected to the diodes, respectively. The phase change material layer patterns are on the lower electrodes, respectively. The upper electrodes are arranged in the second direction, each of which extends on the phase change material layer patterns arranged in the first direction. The first heat sink is adjacent to the lower electrodes and the phase change material layer patterns. The first heat sink has a top surface lower than a bottom surface of the upper electrodes and does not contact the phase change material layer patterns. The bit lines are electrically connected to the upper electrodes, each of which extends in the first direction.

According to some embodiments, there is provided a method of manufacturing a phase change memory device. In the method, a lower electrode is formed on a substrate. A first insulation layer is formed on the substrate to cover the lower electrode. A heat sink is formed on a portion of the first insulation layer adjacent to the lower electrode. A second insulation layer is formed on the first insulation layer to cover the heat sink. Upper portions of the first and second insulation layers are removed to expose the lower electrode. An upper portion of the exposed lower electrode is removed to form a recess. A phase change material layer pattern is formed to fill the recess. An upper electrode is formed on the phase change material layer pattern.

In some embodiments, a plurality of lower electrodes may be formed both in the first and second directions to form a lower electrode array, and a plurality of upper electrodes may be formed in the second direction. Each upper electrode may extend in the first direction. A plurality of heat sinks may be formed between structures arranged in the first direction each of which includes the first lower electrodes and the first phase change material layer patterns disposed in the second direction. Each heat sink may extend in the second direction.

In some embodiments, prior to forming the lower electrode, a plurality of word lines electrically connected to the plurality of lower electrodes may be further formed. The word lines may be formed in the first direction, and each word line may extend in the second direction. Additionally, after forming the upper electrode, bit lines electrically connected to the upper electrodes, respectively, may be further formed. Each bit line may extend in the first direction.

In some embodiments, when the heat sink is formed, a metal layer may be formed on the first insulation layer to sufficiently fill a space between the lower electrodes, and an upper portion of the metal layer may be removed to form the heat sink filling a lower portion of the space.

According to some embodiments, the heat sink may be formed between the lower electrodes spaced apart from each other at a relatively short distance, so that the thermal disturbance between cells may be substantially reduced. Additionally, the heat sink may be electrically insulated and spaced apart from the phase change memory unit including the lower electrode, the phase change material layer pattern and the upper electrode, and thus an undesired conduction path may not be formed. Furthermore, the heat sink may be formed adjacent to the plug under the lower electrode, so that heat from the phase change memory unit may be easily transferred to the plug, thereby enhancing the absorption of heat.

BRIEF DESCRIPTION OF THE DRAWINGS

Embodiments will be more clearly understood from the following detailed description taken in conjunction with the accompanying drawings.

FIG. 1 is a perspective view illustrating a phase change memory device in accordance with some embodiments.

FIG. 132 is a perspective view illustrating a phase change memory device in accordance with some embodiments.

DESCRIPTION OF EMBODIMENTS

Figure 1:
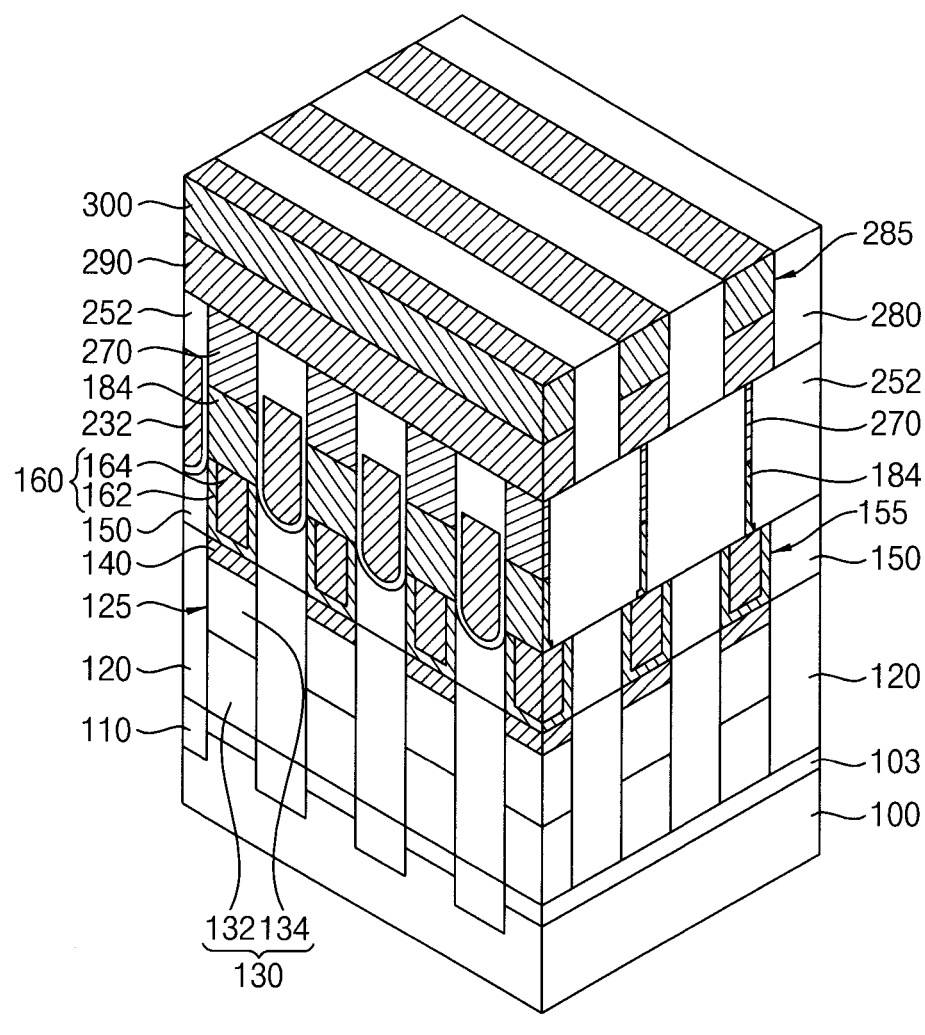
FIGS. 1 to 132 represent non-limiting embodiments as described herein.

Various embodiments will be described more fully hereinafter with reference to the accompanying drawings, in which some embodiments are shown. The present inventive concept may, however, be embodied in many different forms and should not be construed as limited to the particular embodiments set forth herein. Rather, these embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
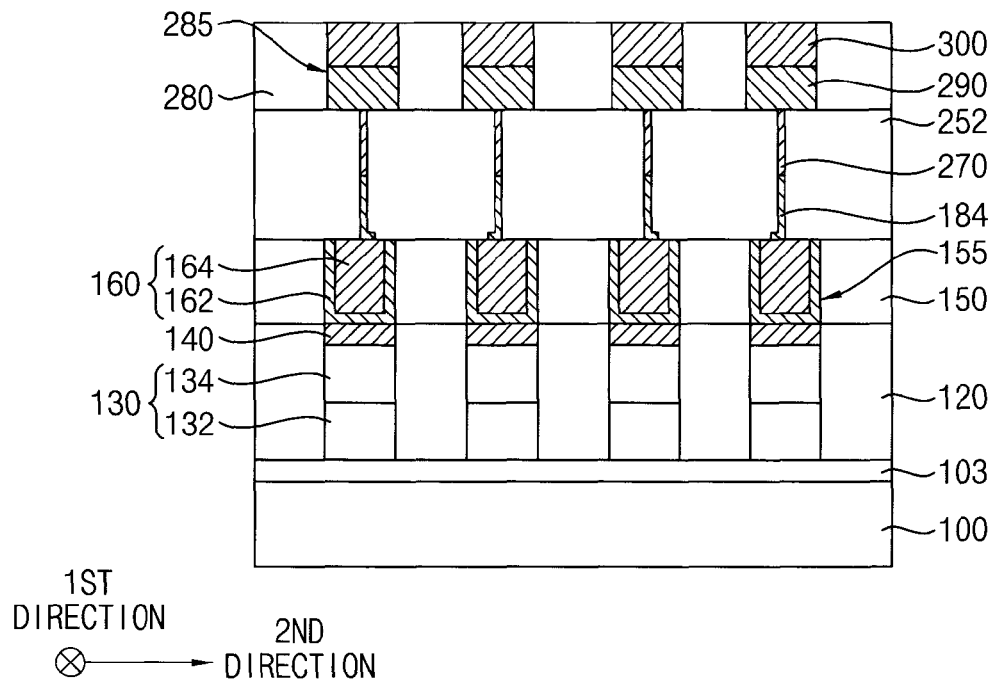
FIGS. 2 and 3 are cross-sectional views illustrating the phase change memory device of FIG. 1.
Figure 3:
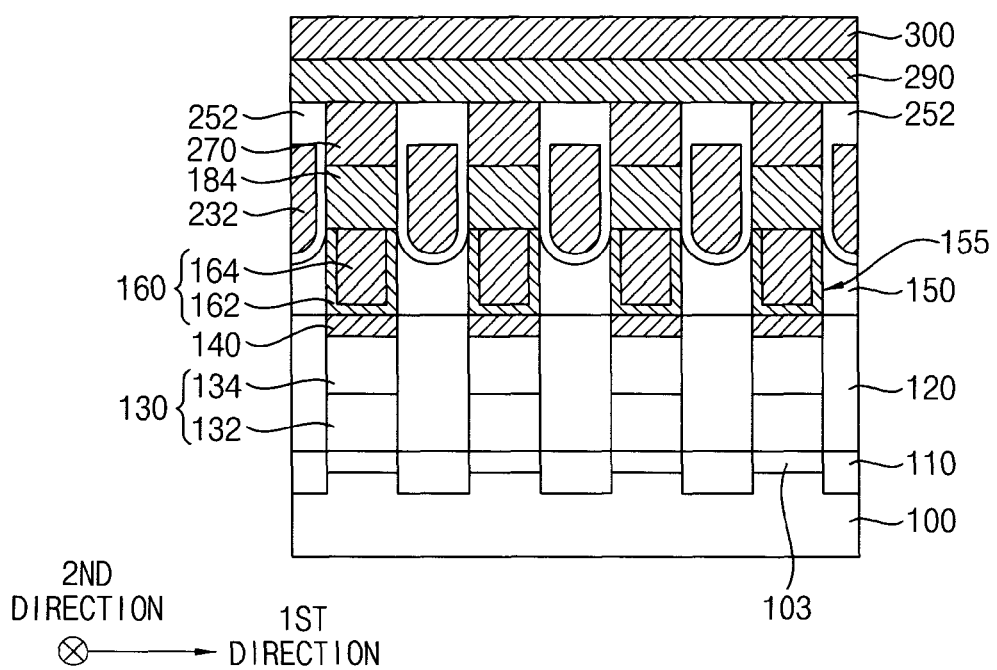
Figure 4:
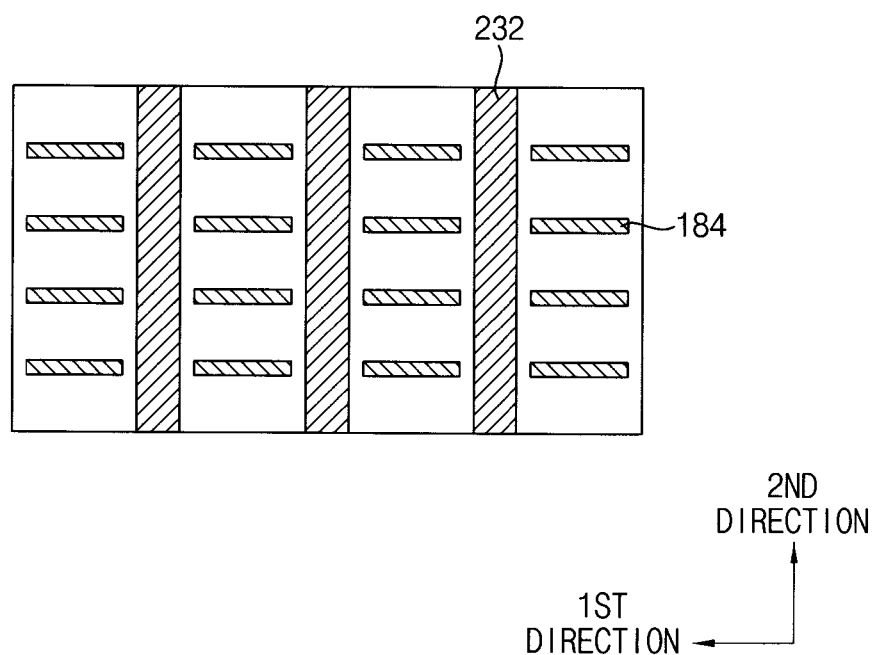
FIG. 4 is a plan view illustrating the positional relationship between lower electrodes and heat sinks of the phase change memory device.

FIG. 1 is a perspective view illustrating a phase change memory device in accordance with some embodiments, FIGS. 2 and 3 are cross-sectional views illustrating the phase change memory device of FIG. 1, and FIG. 4 is a plan view illustrating the positional relationship between lower electrodes and heat sinks of the phase change memory device. FIG. 2 is a cross-sectional view taken along a second direction, and FIG. 3 is a cross-sectional view taken along a first direction substantially perpendicular to the second direction. Particularly, the second direction is a direction in which a word line of the phase change memory device extends, and the first direction is a direction in which a bit line of the phase change memory device extends. The definition of the first and second directions may be applied to all drawings hereinafter.

Referring to FIGS. 1 to 4, the phase change memory device may include a phase change memory unit and a first heat sink 232. The phase change memory device may further include a word line 103, a switching element and a first bit line 300. Furthermore, the phase change memory device may include a plug 160 and an ohmic pattern 140.

The word line 103 may be formed at an upper portion of the substrate 100.

The substrate 100 may be a silicon substrate, a germanium substrate, a silicon-germanium substrate, a silicon on insulator (SOI) substrate, a germanium on insulator (GOI) substrate, etc. The substrate 100 may include a cell region in which memory cells may be formed and a peripheral region in which peripheral circuits may be formed. In FIGS. 1 to 4, only the cell region is shown.

The substrate 100 may be divided into an active region and a field region by the isolation layer pattern 110. That is, a region of the substrate 100, on which the isolation layer pattern 110 is formed, may be defined as the field region, and a region of the substrate 100, on which no isolation layer pattern 110 is formed, may be defined as the active region. In some embodiments, the isolation layer pattern 110 may extend in a second direction substantially parallel to a top surface of the substrate 100, and a plurality of isolation layer patterns 110 may be formed in a first direction substantially perpendicular to the second direction. Thus, the active region may extend in the second direction, and a plurality of active regions may be formed in the first direction. The isolation layer pattern 110 may include a silicon oxide, e.g., borophospho silicate glass (BPSG), phospho silicate glass (PSG), undoped silicate glass (USG), flowable oxide (FOX), tetra ethyl ortho silicate (TEOS), plasma enhanced tetra ethyl ortho silicate (PE-TEOS), high density plasma chemical vapor deposition (HDP-CVD) oxide, etc.

The word line 103 may be formed at an upper portion of each active region of the substrate 100. Thus, the word line 103 may extend in the second direction, and a plurality of word lines 103 may be formed in the first direction. In some embodiments, the word line 103 may include first impurities. The first impurities may include n-type impurities, e.g., phosphorus, arsenic, etc., or p-type impurities, e.g., boron, gallium, etc. In an example embodiment, the first impurities may be n-type impurities. A well region (not shown) having impurities of the other conductive type may be further formed under the word line 103 in the substrate 100.

The switching element may be a diode 130 or a transistor (not shown), and the diode 130 is shown in FIGS. 1 to 4. In some embodiments, the diode 130 may be formed through a first insulation layer 120 on the substrate 100 and fill a portion of a first opening 125, e.g., a lower portion thereof to be electrically connected to the word line 103. In some embodiments, the diode 130 may have a solid cylindrical shape or a polyprism shape, e.g., having multiple flat surfaces extending along a direction perpendicular to 1st and 2nd directions.

The first insulation layer 120 may include an oxide, e.g., silicon oxide.

In some embodiments, a plurality of first openings 125 may be formed on each of the word lines 103 in the second direction. The word lines 103 may be formed in the first direction, and thus the first openings 125 may be formed both in the first and second directions to form a first opening array. Accordingly, a plurality of diodes 130 filling the lower portions of the first openings 125 may be formed both in the first and second directions to form a diode array.

Each diode 130 may include a lower diode layer 132 and an upper diode layer 134. In some embodiments, the lower and upper diodes 132 and 134 may include polysilicon doped with second and third impurities, respectively. In some embodiments, the second impurities may be n-type impurities, e.g., phosphorous or arsenic, and the third impurities may be p-type impurities, e.g., boron or gallium.

The ohmic pattern 140 may fill the remaining portion of the first opening 125, e.g., an upper portion of the first opening 125 and on the diode 130. Thus, a plurality of ohmic patterns 140 may be formed both in the first and second directions to form ohmic pattern arrays. In some embodiments, the ohmic pattern 140 may have a solid cylindrical shape or a polyprism shape.

In some embodiments, the ohmic pattern 140 may include a metal silicide, e.g., cobalt silicide, nickel silicide, or tungsten silicide. The ohmic pattern 140 may reduce the contact resistance between the diode 130 and the plug 160. In some embodiments, the ohmic pattern 140 may be omitted and the diode 130 and the plug 160 may be directly coupled to each other.

The plug 160 may fill a corresponding one of a plurality of second openings 155 formed through a second insulation layer 150 on the first insulation layer 120 and in communication with respective ones of the plurality of first openings 125. Thus, the plug 160 may be electrically connected the ohmic pattern 140. In some embodiments, the plug 160 may have a solid cylindrical shape or a polyprism shape.

In some embodiments, the second insulation layer 150 may include an oxide, e.g., silicon oxide.

In some embodiments, a plurality of second openings 155 may be formed both in the first and second directions to form a second opening array. Thus, a plurality of plugs 160 may be formed both in the first and second directions to form a plug array.

In some embodiments, the plug 160 may include a first bather layer pattern 162 on a bottom and a sidewall of the second opening 155, and a first conductive layer pattern 164 filling a remaining portion of the second opening 155 and being formed on the first barrier layer pattern 162. Thus, the first barrier layer pattern 162 may surround a sidewall and a bottom of the first conductive layer pattern 164. The first barrier layer pattern 162 may include a metal or a metal nitride, e.g., titanium, or titanium nitride, and the first conductive layer pattern 164 may include a low resistance metal, e.g., copper, tungsten, or aluminum. In an example embodiment, the plug 160 may be omitted.

The phase change memory unit may include a first lower electrode 184, a first phase change material layer pattern 270 and a first upper electrode 290. In some embodiments, a plurality of phase change memory units may be formed both in the first and second directions to form a phase change memory unit array. A plurality of first lower electrodes 184 may be formed both in the first and second directions to have an island shape and be spaced apart from each other, and a plurality of first phase change material layer patterns 270 may be formed both in the first and second directions to have an island shape and be spaced apart from each other, too. Thus, a first lower electrode array and a first phase change material layer pattern array may be defined. However, each first upper electrode 290 may extend in the first direction, and a plurality of first electrodes 290 may be formed in the second direction. Thus, a first upper electrode column may be defined. That is, the first upper electrode 290 may have a substantially linear shape or a bar shape extending in the first direction, and thus the phase change memory units arranged in the first direction may not have a first upper electrode 290 physically distinguished from each other. However, the phase change memory units may be distinguished from each other according to the phase change of the first phase change material layer pattern 270 when the corresponding first lower electrode 184 is heated.

The first lower electrode 184 may be formed on the plug 160 and beneath the first phase change material layer pattern 270 to heat the first phase change material layer pattern 270, and thus the phase change may occur in the first phase change material layer pattern 270. In some embodiments, the first lower electrode 184 may have a cross-sectional shape along the first direction that may be substantially a rectangle or trapezoid with a bottom side greater than a top side.

The first lower electrode 184 may have a cross-sectional shape along the second direction that may be substantially an "L" shape. As the first lower electrode 184 may have the "L" shape, the contact area between the first lower electrode 184 and the first phase change material layer pattern 270 thereon may be relatively small, while the contact area between the first lower electrode 184 and the plug 160 therebeneath may be relatively large. As a result, the first phase change material layer pattern 270 may be efficiently heated even with a small current. In some embodiments, in the first lower electrode array, the first lower electrodes 184 in the odd-numbered column in the second direction may have a cross-section of an "L" shape, while the first lower electrode 184 in the even-numbered column in the second direction may have a cross-section of a reverse "L" shape, e.g., a "J-like" shape.

In some embodiments, a first width of the first lower electrode 184 along the first direction may be greater than a second width thereof along the second direction, and a first distance between the first lower electrodes 184 along the first direction may be less than a second distance therebetween along the second direction.

In some embodiments, the first lower electrode 184 may include a metal, or a metal compound, e.g., a metal nitride or a metal silicon nitride. For example, the first lower electrode 184 may include tungsten, aluminum, copper, tantalum, titanium, molybdenum, niobium, zirconium, tungsten nitride, niobium nitride, zirconium nitride, tantalum aluminum nitride, titanium aluminum nitride, molybdenum aluminum nitride, zirconium aluminum nitride, molybdenum titanium nitride, tungsten boron nitride, titanium boron nitride, tungsten silicon nitride, tantalum silicon nitride, titanium silicon nitride, molybdenum silicon nitride, zirconium silicon nitride, etc. These may be used alone or in a combination thereof.

The first phase change material layer pattern 270 may be formed on the first lower electrode 184, and a bottom surface thereof may have a shape and an area substantially the same as those of a top surface of the first lower electrode 184. That is, the first phase change material layer pattern 270 may have a cross-sectional shape along the first direction that is substantially a rectangular shape or a trapezoidal shape and a cross-sectional shape along the second direction that is substantially a bar shape. In some embodiments, the first phase change material layer pattern 270 may have a first width along the first direction greater than a second width thereof along the second direction, and a first distance between the first phase change material layer patterns 270 along the first direction may be less than a second distance between the first phase change material layer patterns 270 along the second direction.

Sidewalls of the first lower electrodes 184 and the first phase change material layer patterns 270 may be surrounded by a sixth insulation layer pattern 252. The sixth insulation layer pattern 252 may be formed on the second insulation layer 150 and portions of the plugs 160. In some embodiments, as illustrated in FIG. 3, the sixth insulation layer pattern 252 may cover upper sidewalls of the plugs 160, and a bottom surface of the sixth insulation layer pattern 252 may thus be lower than top surfaces of the plugs 160. Particularly, the sixth insulation layer pattern 252 may be formed between upper sidewalls of the plugs 160 adjacent to each other in the first direction, and the bottom surface of the sixth insulation layer pattern 252 may be lower than the top surfaces of the plugs 160.

The sixth insulation layer pattern 252 may include a nitride, e.g., silicon nitride.

The first upper electrode 290 may contact the first phase change material layer pattern 270 and be formed on the sixth insulation layer pattern 252. The upper electrode 290 may include a metal, e.g., titanium, tantalum, tungsten, etc., or a metal compound, e.g., titanium carbide, tantalum carbide, titanium nitride, tantalum nitride, tungsten nitride, titanium carbonitride, tantalum carbonitride, tungsten carbonitride, titanium oxynitride, tantalum oxynitride, tungsten oxynitride, titanium silicon nitride, tantalum silicon nitride, tungsten silicon nitride, etc.

The first bit line 300 may be formed on the first upper electrode 290. In some embodiments, the first bit line 300 may have a substantially linear or bar shape extending in the first direction, and a plurality of first bit lines 300 may be formed in the second direction.

In some embodiments, the first bit line 300 may include a metal, e.g., copper, aluminum, tungsten, etc. In an example embodiment, the first bit line 300 may further have a barrier layer pattern (not shown) including a metal nitride.

In some embodiments, sidewalls of the first electrode layer 290 and the first bit line 300 may be surrounded by an eighth insulation layer 280 on the sixth insulation layer pattern 252. That is, the first upper electrode 290 and the first bit line 300 may fill a fourth opening 285 formed through the eighth insulation layer 280 and exposes a top surface of the first phase change material layer pattern 270 and a portion of a top surface of the sixth insulation layer pattern 252. The eighth insulation layer 280 may include an oxide, e.g., silicon oxide or a nitride, e.g., silicon nitride.

The first heat sink 232 may extend in the second direction, and a plurality of first heat sinks 232 may be formed in the first direction. The first heat sink 232 may be formed between structures arranged in the first direction each of which may include the first lower electrodes 184 and the first phase change material layer patterns 270 disposed in the second direction and portions of the sixth insulation layer pattern 252 therebetween. The first heat sink 232 may be connected to a heat release pattern (not shown), and the heat release pattern may release heat absorbed by the first heat sink 232 toward outside.

In some embodiments, a top surface of the first heat sink 232 may be lower than a top surface of the first upper electrode 290. Further, the top surface of the first heat sink 232 may be lower than a top surface of the first phase change material layer pattern 270, and thus may be lower than a bottom surface of the first upper electrode 290. Accordingly, the first heat sink 232 may be spaced apart from the first upper electrode 290. Additionally, the top surface of the first heat sink 232 may be higher than a bottom surface of the first phase change material layer pattern 270, and a bottom surface of the first heat sink 232 may be lower than a bottom surface of the first lower electrode 184. Accordingly, the first heat sink 232 may be formed adjacent to an interface between the first lower electrode 184 and the first phase change material layer pattern 270 in which an exothermic reaction occurs very vigorously as the first lower electrode 184 heats the first phase change material layer pattern 270, and may absorb the heat effectively. As a result, the undesired phase change of the first phase change material layer pattern 270 due to the heat generated in adjacent memory cells or adjacent memory phase change material layer patterns 270 may be substantially reduced.

In some embodiments, the bottom surface of the first heat sink 232 may be lower than a bottom surface of the lower electrode 184, and thus may be adjacent to an upper portion of the plug 160 beneath the first lower electrode 184. The first barrier layer pattern 162 may include a metal or a metal nitride of a high thermal conductivity, e.g., titanium, titanium nitride, etc., so that a portion of the heat absorbed by the first heat sink 232 may be easily transferred to the first barrier layer pattern 162.

The first heat sink 232 may include a metal or a metal nitride of a high thermal conductivity, e.g., silver, copper, lead, tin, magnesium, zinc, iron, gold, aluminum, iridium, molybdenum, nickel, platinum, beryllium, cadmium, cobalt, titanium, tungsten, titanium nitride, tungsten nitride, etc. The first heat sink 232 may include a material that may be easily wet-etched among the metal or the metal nitride, e.g., titanium nitride.

However, the first heat sink 232 may be surrounded by the sixth insulation layer pattern 252, and thus may be electrically insulated from adjacent phase change memory units, i.e., the first lower electrode 184, the first phase change material layer pattern 270 and the first upper electrode 290. That is, the first heat sink 232 and the phase change memory unit may be spaced apart from each other by the sixth insulation layer pattern 252. Additionally, the first heat sink 232 may be electrically insulated from the plug 160 by the sixth insulation layer pattern 252.

As illustrated above, the phase change memory device may include the first heat sink 232 adjacent to the interface between the first lower electrode 184 and the first phase change material layer pattern 270, so that the undesired phase change of the adjacent phase change memory units at the interface due to the exothermic reaction may be substantially reduced. Particularly, the first heat sink 232 may be formed between the first lower electrodes 184 spaced apart from each other by a smaller distance in the first direction than in the second direction, so that the release or absorption of the heat may be enhanced. Additionally, the first heat sink 232 may be electrically insulated from the phase change memory unit by the sixth insulation layer pattern 252, so that an undesired conductive path may not be formed.

The first heat sink 232 may include a material blocking heat transfer beside a metal or a metal compound, e.g., air, so that the thermal disturbance may be substantially reduced.

FIGS. 5 to 34 are cross-sectional views illustrating a method of manufacturing a phase change memory device in accordance with some embodiments. FIGS. 5, 7, 9, 11, 13, 15, 17, 19, 21, 23, 25, 27, 29, 31 and 33 are cross-sectional views taken along the second direction, and FIGS. 6, 8, 10, 12, 14, 16, 18, 20, 22, 24, 26, 28, 30, 32 and 34 are cross-sectional views taken along the first direction. This method may be used in manufacturing the phase change memory device of FIGS. 1 to 4, however, may not be limited thereto.

Figure 5:
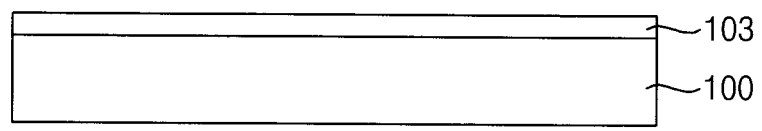
FIGS. 5 to 34 are cross-sectional views illustrating a method of manufacturing a phase change memory device in accordance with some embodiments.
Figure 5:
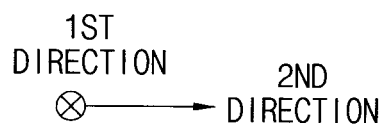
Figure 6:
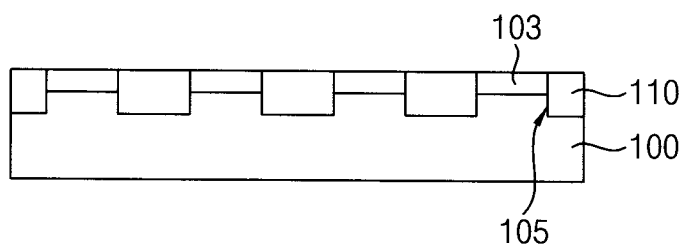
Figure 6:
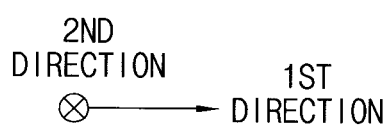

Referring to FIGS. 5 and 6, first impurities may be implanted into an upper portion of a substrate 100 to form an impurity region, and an isolation layer pattern 110 may be formed at an upper portion of the substrate 100 to divide the substrate 100 into an active region and a field region, and word lines 103 may be formed from the impurity region.

The substrate 100 may be a silicon substrate, a germanium substrate, a silicon-on-insulator (SOI) substrate, a germanium-on-insulator (GOI) substrate, etc.

In some embodiments, the first impurities may be implanted by an ion implantation process. The first impurities may include n-type impurities, e.g., phosphorus, arsenic, etc., or p-type impurities, e.g., boron, gallium, etc. In an example embodiment, the first impurities may be n-type impurities. A well region (not shown) doped with impurities of conduction type different from that of the first impurities may be further formed under the impurity region.

In some embodiments, the isolation layer pattern 110 may be formed by a shallow trench isolation (STI) process. Particularly, trenches 105 may be formed on the substrate 100, an isolation layer may be formed on the substrate 100 to sufficiently fill the trenches 105, and an upper portion of the isolation layer may be planarized until a top surface of the substrate 100 may be exposed to form the isolation layer pattern 110. The isolation layer may be formed to include an oxide, e.g., boro phospho silicate glass (BPSG), phospho silicate glass (PSG), undoped silicate glass (USG), flowable oxide (FOX), tetra ethyl ortho silicate (TEOS), plasma enhanced tetra ethyl ortho silicate (PE-TEOS), high density plasma chemical vapor deposition (HDP-CVD) oxide, etc. In some embodiments, the planarization process may be formed by a chemical mechanical polishing (CMP) process and/or an etch back process. In some embodiments, the isolation layer pattern 110 may be formed to extend in a second direction substantially parallel to the top surface of the substrate 100, and a plurality of isolation layer patterns 110 may be formed in a first direction substantially perpendicular to the second direction. Thus, the active region may be also formed to extend in the second direction, and a plurality of active regions may be formed in the first direction.

In some embodiments, the isolation layer patterns 110 may be formed to have a bottom surface lower than that of the impurity region, and thus the impurity region may be divided into a plurality of word lines 103 by the isolation layer patterns 110. In some embodiments, each word line 103 may extend in the second direction, and a plurality of word lines 103 may be formed in the first direction.

Alternatively, the isolation layer pattern 110 may be formed first by an STI process, and an ion implantation process may be formed to form the word lines 103.

Figure 7:
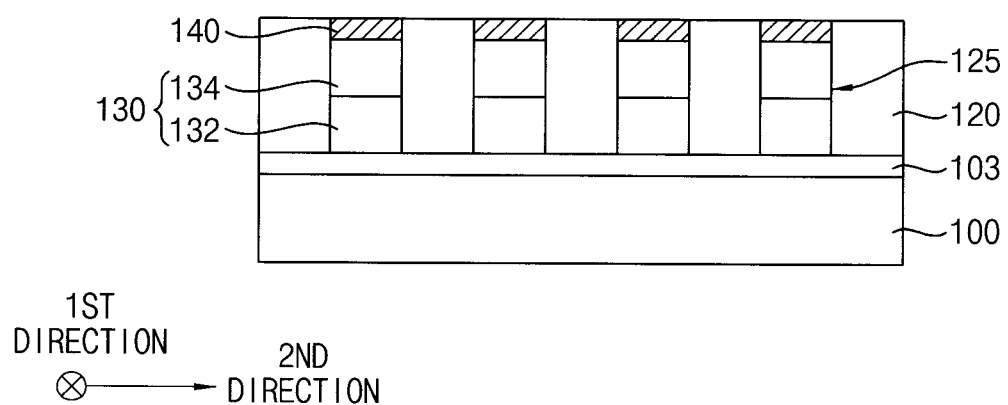
Figure 8:
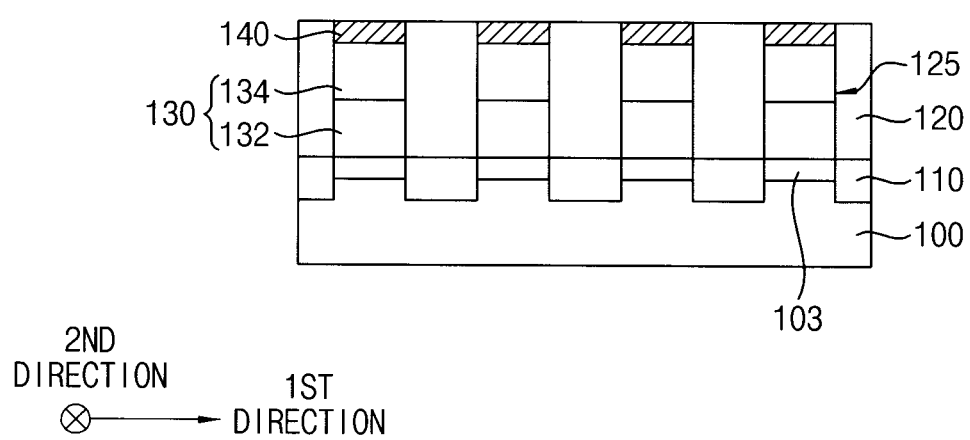

Referring to FIGS. 7 and 8, a first insulation layer 120 may be formed on the isolation layer pattern 110 and the word lines 103, and the first insulation layer 120 may be partially removed to form first openings 125 exposing top surfaces of the word lines 103. A diode 130 and an ohmic pattern 140 may be formed to fill each opening 125.

In some embodiments, a plurality of first openings 125 may be formed on each word line 103 extending in the second direction. According as the plurality of word lines 103 may be formed in the first direction, a plurality of first openings 125 may be also formed in the first direction. That is, a plurality of first openings 125 may be formed both in the first and second directions to form a first opening array.

The first insulation layer may be formed to include an oxide, e.g., silicon oxide.

In some embodiments, a selective epitaxial growth (SEG) process may be formed using the exposed top surfaces of the word lines 130 as a seed layer to form a silicon layer filling the first openings 125, and second and third impurities may be implanted into lower and upper portions of the silicon layer to form the diode 130. The lower portion of the silicon layer doped with the second impurities and the upper portion of the silicon layer doped with the first impurities may be defined as a lower diode layer 132 and an upper diode layer 134, respectively. Before implanting the second and third impurities thereinto, a planarization process may be performed on a top surface of the silicon layer so that a top surface of the diode 130 may have a height substantially the same as that of the first insulation layer 120.

In an example embodiment, the second impurities may include n-type impurities, e.g., phosphorous, arsenic, etc., and the third impurities may include p-type impurities, e.g., boron, gallium, etc.

The ohmic pattern 140 may be formed by forming a metal layer on the diode 130 and the first insulation layer 120 and by performing a heat treatment thereon so that the metal layer and the diode 130 may be reacted with each other. A portion of the metal layer that has not been reacted with the diode 130 may be removed. In some embodiments, the metal layer may be formed to include, e.g., cobalt, nickel, tungsten, etc. Thus, the ohmic pattern 140 may be formed to include a metal silicide, e.g., cobalt silicide, nickel silicide, tungsten silicide, etc. Alternatively, the ohmic pattern 140 may be formed by directly implanting metal ion into an upper portion of the diode 130. The ohmic pattern 140 may reduce a contact resistance between the diode 130 and a plug 160 subsequently formed (refer to FIGS. 9 and 10), and may be omitted.

The diode 130 and the ohmic pattern 140 may be formed in each first opening 125, and thus a plurality of diodes 130 and a plurality of ohmic patterns 140 may be formed to define a diode array and an ohmic pattern array, respectively.

Figure 9:
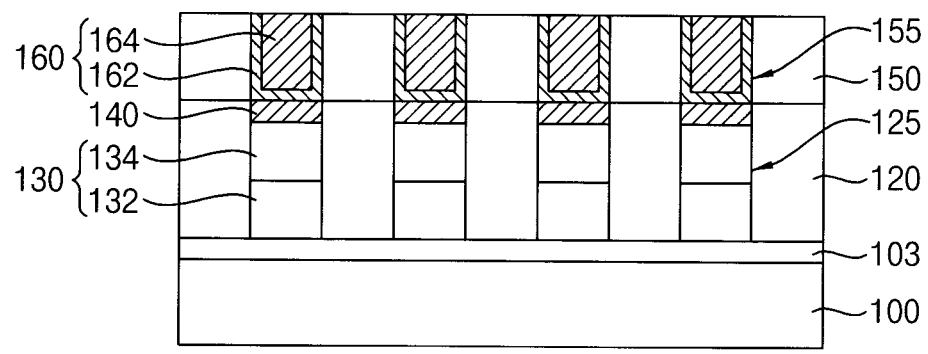
Figure 10:
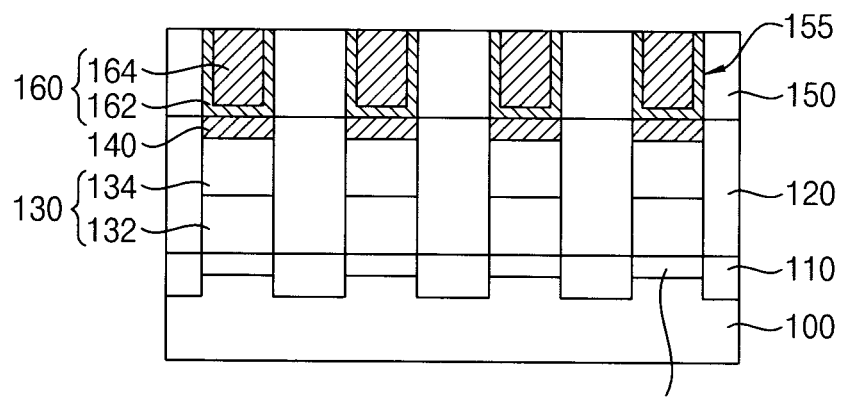

Referring to FIGS. 9 and 10, a second insulation layer 150 may be formed on the first insulation layer 120 and the ohmic patterns 140, and the second insulation layer 150 may be partially removed to form second openings 155 exposing the ohmic patterns 140. The plug 160 may be formed to fill each second opening 155. According as the first openings 125 may define the first opening array, a plurality of second openings 155 may be formed both in the first and second directions to define a second opening array.

The second insulation layer 150 may be formed to include an oxide, e.g., silicon oxide.

In some embodiments, the plug 160 may be formed by forming a first barrier layer on the exposed top surfaces of the ohmic patterns 140, sidewalls of the second openings 155 and a top surface of the second insulation layer 150, by forming a first conductive layer on the first barrier layer to sufficiently fill remaining portions of the second openings 155, and by planarizing the first conductive layer and the first barrier layer until a top surface of the second insulation layer 150 may be exposed. Thus, the plug 160 may be formed to include a first barrier layer pattern 162 and a first conductive layer pattern 164, and the first barrier layer pattern 162 may surround a sidewall and a bottom of the first conductive layer pattern 164. The first barrier layer may be formed to include a metal or a metal nitride, e.g., titanium, titanium nitride, and the first conductive layer may be formed to include a low resistance metal, e.g., copper, tungsten, aluminum, etc. In an example embodiment, the plug 160 may not be formed but omitted.

The plug 160 may be formed in each second opening 155, and thus a plurality of plugs 160 may be formed both in the first and second directions to define a plug array.

Figure 11:
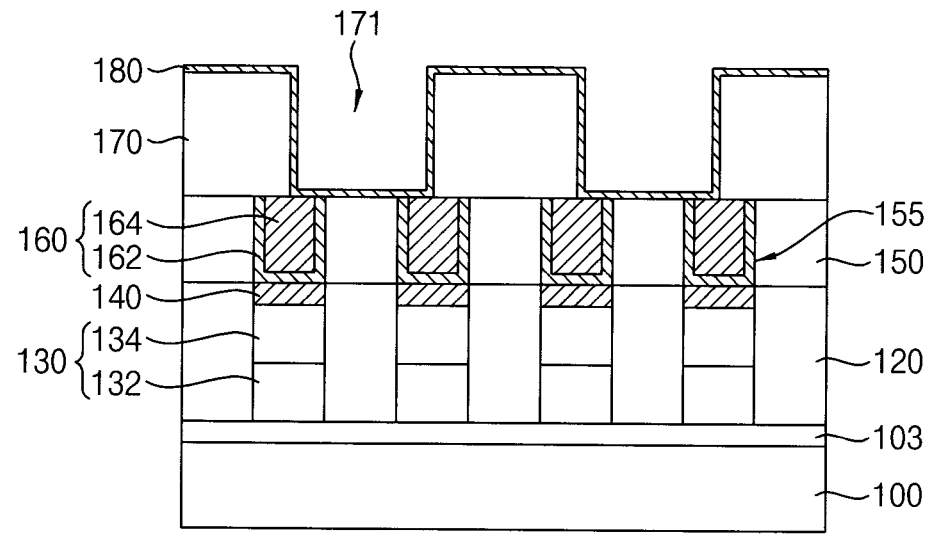
Figure 12:
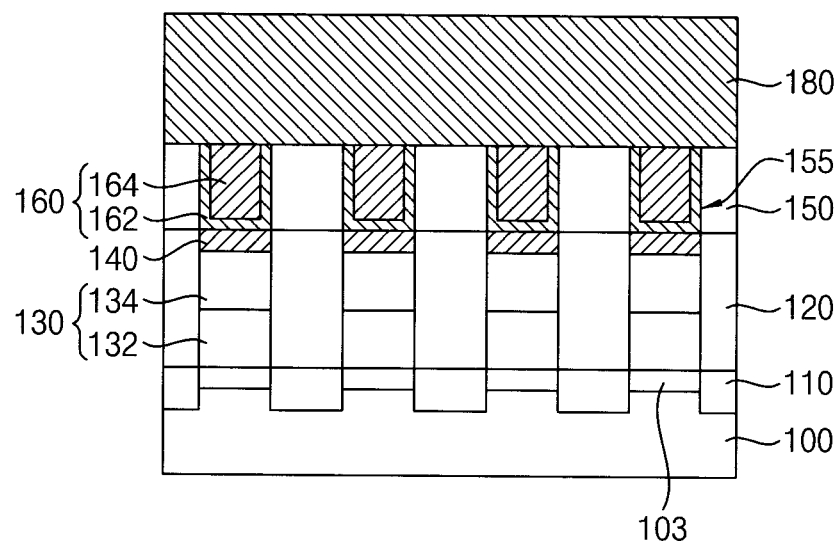

Referring to FIGS. 11 and 12, a third insulation layer 170 may be formed on the second insulation layer 150 and the plugs 160, the third insulation layer 170 may be partially removed to form a third opening 171 exposing top surfaces of the plug 160 and the second insulation layer 150, and a first lower electrode layer 180 may be formed on the exposed top surfaces of the plug 160 and the second insulation layer 150, a sidewall of the third opening 171 and a top surface of the third insulation layer 170.

The third insulation layer 170 may be formed to include a nitride, e.g., silicon nitride.

In some embodiments, the third opening 171 may be formed to extend in the first direction, and a plurality of third openings 171 may be formed in the second direction. Two plugs 160 adjacent to each other in the second direction may be exposed by the same third opening 171.

The first lower electrode layer 180 may be formed to include a metal or a metal compound such as a metal nitride or a metal silicon nitride. For example, the first lower electrode layer 180 may be formed to include a metal such as tungsten, aluminum, copper, tantalum, titanium, molybdenum, niobium, zirconium, etc., a metal nitride such as tungsten nitride, aluminum nitride, tantalum nitride, titanium nitride, molybdenum nitride, niobium nitride, zirconium nitride, tantalum aluminum nitride, titanium aluminum nitride, molybdenum aluminum nitride, zirconium aluminum nitride, molybdenum titanium nitride, tungsten boron nitride, titanium boron nitride, etc., or a metal silicon nitride such as tungsten silicon nitride, tantalum silicon nitride, titanium silicon nitride, molybdenum silicon nitride, zirconium silicon nitride, etc. These may be used alone or in a combination thereof. The first lower electrode layer 180 may be formed by a chemical vapor deposition (CVD) process, an atomic layer deposition (ALD) process, a sputtering process, an electron beam deposition (EBD) process, etc. In an example embodiment, the first lower electrode layer 180 may be conformally formed on the exposed top surfaces of the plugs 160 and the second insulation layer 150, the sidewall of the third opening 171 and the top surface of the third insulation layer 170.

Figure 13:
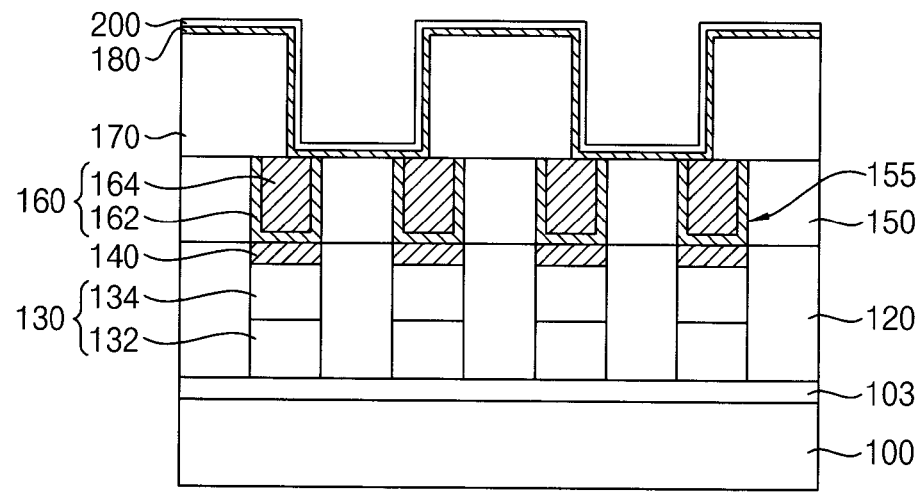
Figure 14:
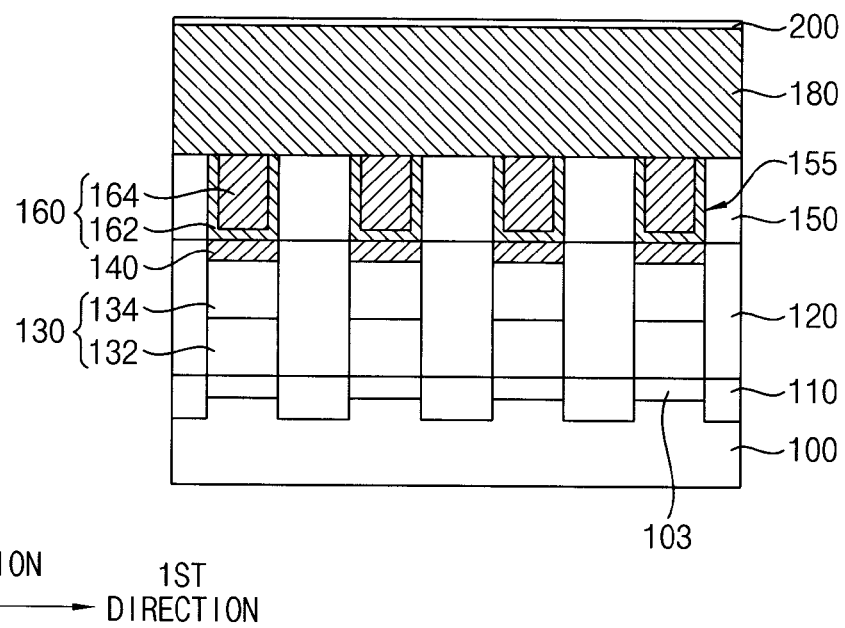

Referring to FIGS. 13 and 14, a spacer layer 200 may be formed on the first lower electrode layer 180.

The spacer layer 200 may be formed to include a nitride, e.g., silicon nitride, and may be formed to include a material substantially the same as that of the third insulation layer 170.

Figure 15:
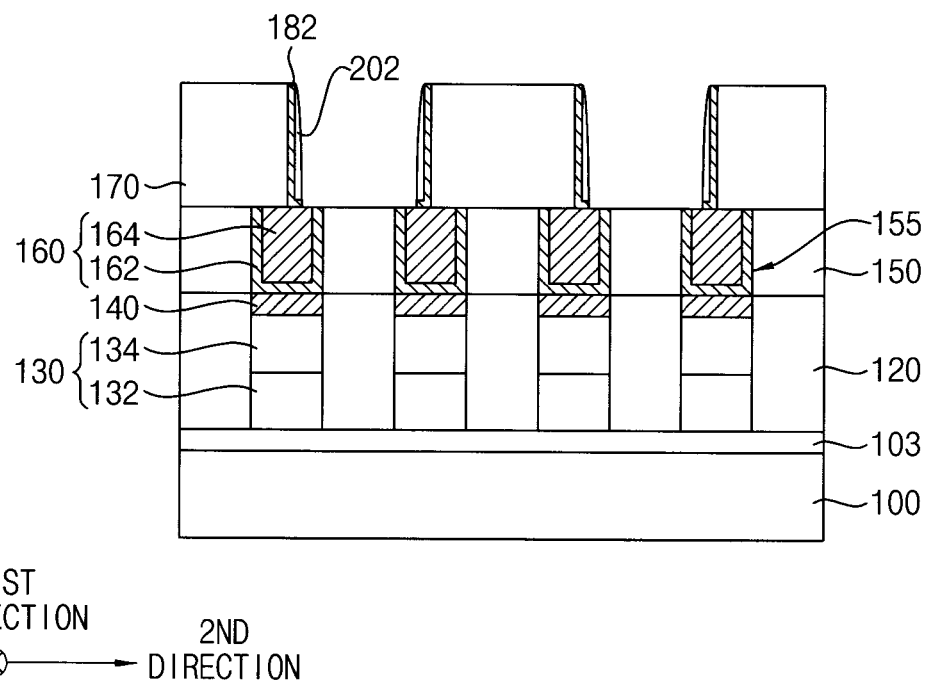
Figure 16:
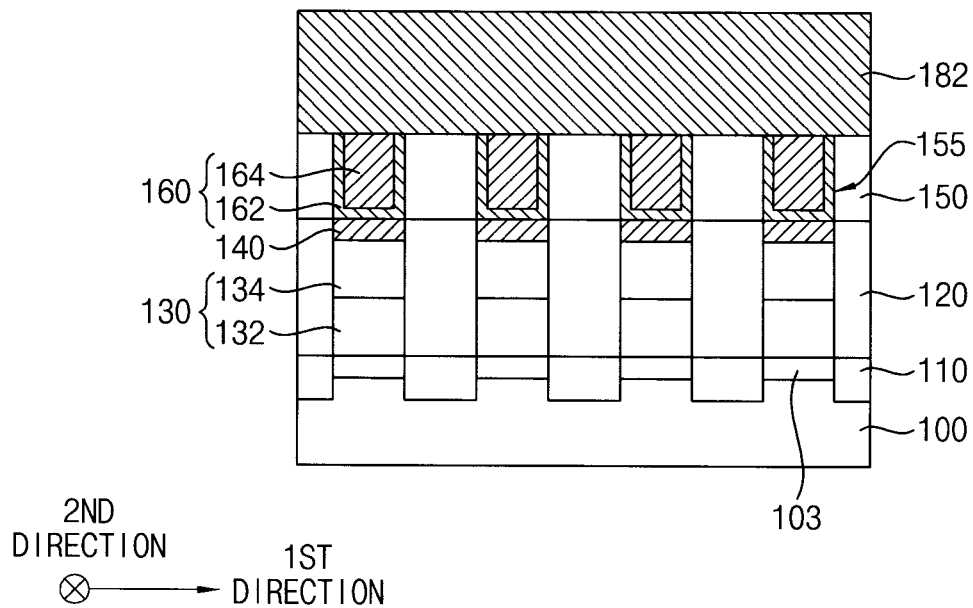

Referring to FIGS. 15 and 16, the spacer layer 200 may be etched to form a spacer 202, and the first lower electrode layer 180 may be etched using the spacer 200 as an etching mask to form a first lower electrode layer pattern 182.

In some embodiments, the spacer layer 200 may be anisotropically etched to form the spacer 202, and the spacer 202 may be formed to extend in the first direction adjacent to the sidewall of the third opening 171. Thus, two spacers 202 may be formed in one third opening 171, and according as a plurality of third openings 171 may be formed in the second direction, a plurality of spacers 202 may be also formed in the second direction.

The first lower electrode layer pattern 182 may be formed to extend in the first direction on the sidewall of the third opening 171, and a plurality of first lower electrode layer patterns 182 may be formed in the second direction. Each first lower electrode layer pattern 182 may have a cross-sectional shape along the second direction that may be substantially an "L" shape or a "J-like" shape. That is, the first lower electrode layer pattern 182 may be conformally formed on the sidewall of the third opening 171 and the exposed top surface of the plug 160, and may have the cross-section of an "L" shape. Thus, a contact area between the first lower electrode layer pattern 182 and a first phase change material layer pattern 270 subsequently formed (refer to FIGS. 33 and 34) may be reduced while a contact area between the first lower electrode layer pattern 182 and the plug 160 may be increased, so that the first phase change material layer pattern 270 may be efficiently heated even with a small current.

Figure 17:
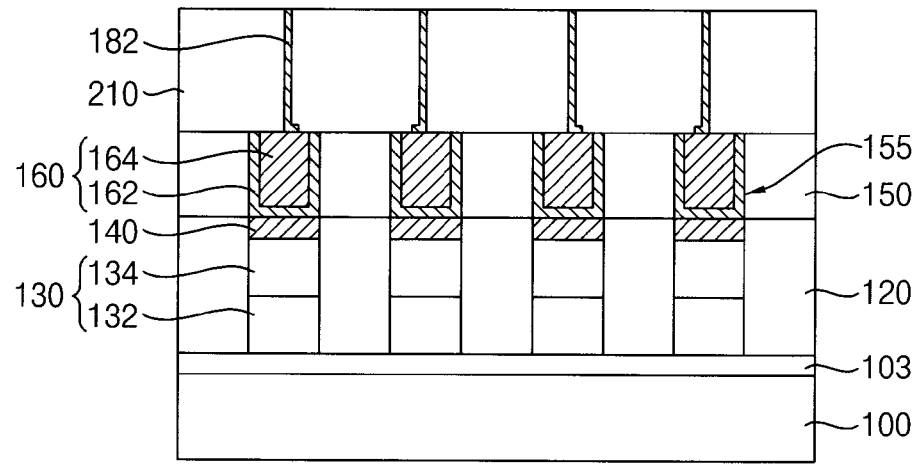
Figure 18:
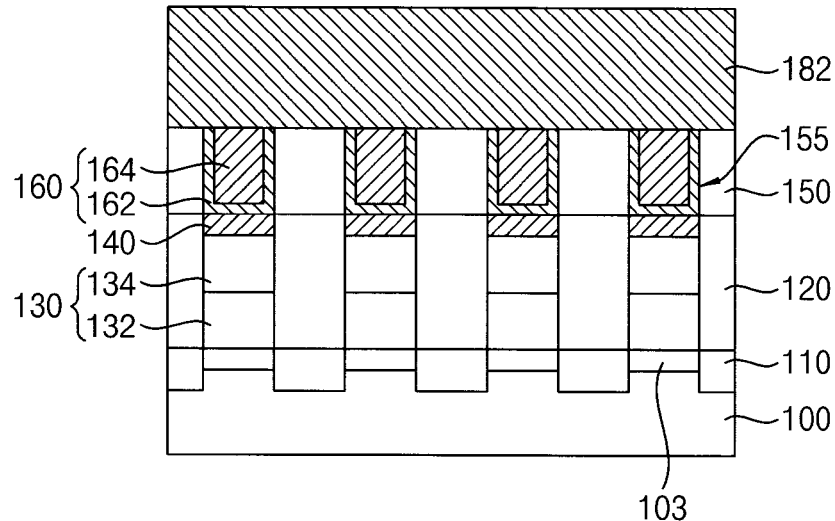

Referring to FIGS. 17 and 18, a fourth insulation layer 210 sufficiently filling a remaining portion of the third opening 171 may be formed on the exposed top surfaces of the plugs 160 and the second insulation layer 150, the spacers 202, the first lower electrode layer patterns 182 and a top surface of the third insulation layer 170, and may be planarized until top surfaces of the first lower electrode layer patterns 182 may be exposed.

The fourth insulation layer 210 may be formed to include a nitride, e.g., silicon nitride, and may be formed to include a material substantially the same as that of the spacer 202 and the third insulation layer 170. Thus, the fourth insulation layer 210, the spacer 202 and the third insulation layer 170 may be merged, and hereinafter, the merged layer may be referred to simply as a fourth insulation layer 210. The fourth insulation layer 210 may surround sidewalls of the first lower electrode layer patterns 182 and formed on the plugs 160 and the second insulation layer 150.

Figure 19:
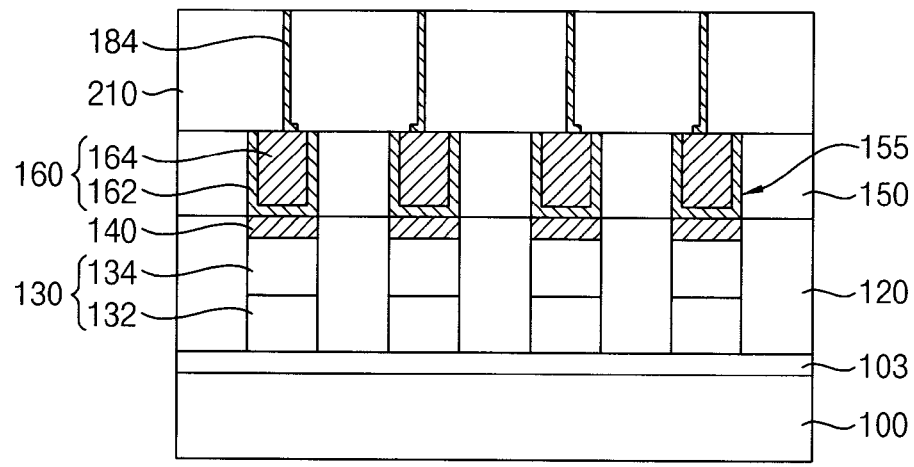
Figure 20:
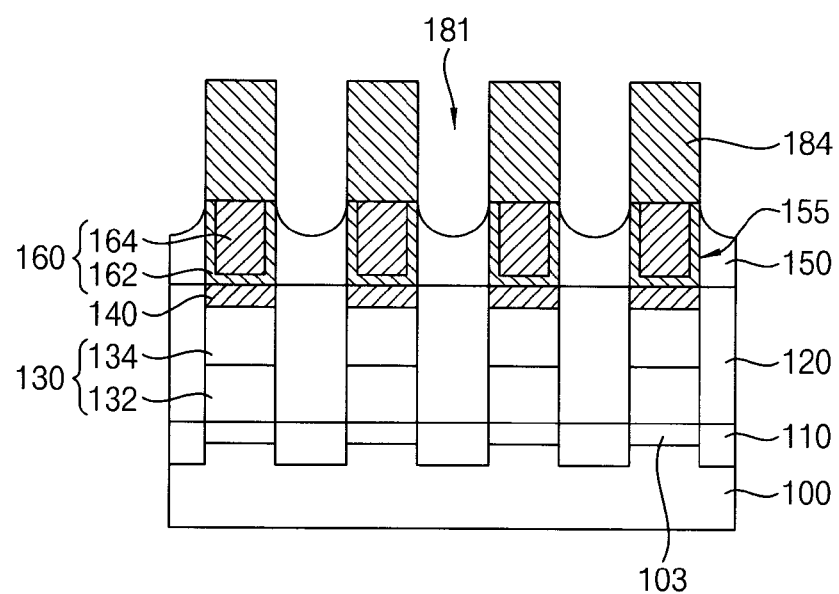

Referring to FIGS. 19 and 20, the first lower electrode layer pattern 182 may be partially removed to form a first recess 181.

In some embodiments, the first recess 181 may be formed to extend in the second direction, and a plurality of first recesses 181 may be formed in the first direction. Thus, a plurality of first lower electrodes 184 may be formed from one first lower electrode layer pattern 182 in the first direction, and the first lower electrodes 184 may have an island shape from each other. The plurality of first lower electrode layer patterns 182 may be formed in the second direction, and thus a plurality of first lower electrodes 184 may be also formed in the second direction. As a result, a plurality of first lower electrodes 184 may be formed both in the first and second directions to define a first lower electrode array.

Each first lower electrode 184 may have a cross-sectional shape along the first direction that may be substantially a rectangle. Alternatively, when the first recess 181 may be formed to have a lower portion narrower than an upper portion, each first lower electrode 184 may have a cross-sectional shape along the first direction that may be substantially a trapezoid with a bottom surface wider than a top surface. In some embodiments, each first lower electrode 184 may have a first width along the first direction wider than a second width along the second direction, and a first distance between adjacent first lower electrodes 184 in the first direction may be smaller than a second distance between adjacent to first lower electrodes 184 in the second direction.

The first recess 181 may be formed by a dry etching process. In some embodiments, during the dry etching process, an upper portion of the second insulation layer 150 may be also removed. Even though there may be a difference in the amount of etching according to the etching selectivity between the second insulation layer 150 including silicon oxide and the first lower electrode layer pattern 182 including a metal or a metal nitride, the upper portion of the second insulation layer 150 may be also removed during the dry etching process. In an example embodiment, after the etching process for removing the first lower electrode layer pattern 182 has been completed so that the second insulation layer 150 may be exposed, a dry etching process for partially removing the second insulation layer 150 may be further performed so that the first recess 181 may be formed adjacent to the first barrier layer pattern 162 of the plug 160 including a material of a high thermal conductivity, e.g., titanium or titanium nitride. Thus, the heat absorbed by a first heat sink 232 subsequently formed (refer to FIG. 26) may be easily transferred to the first barrier layer pattern 162.

Figure 21:
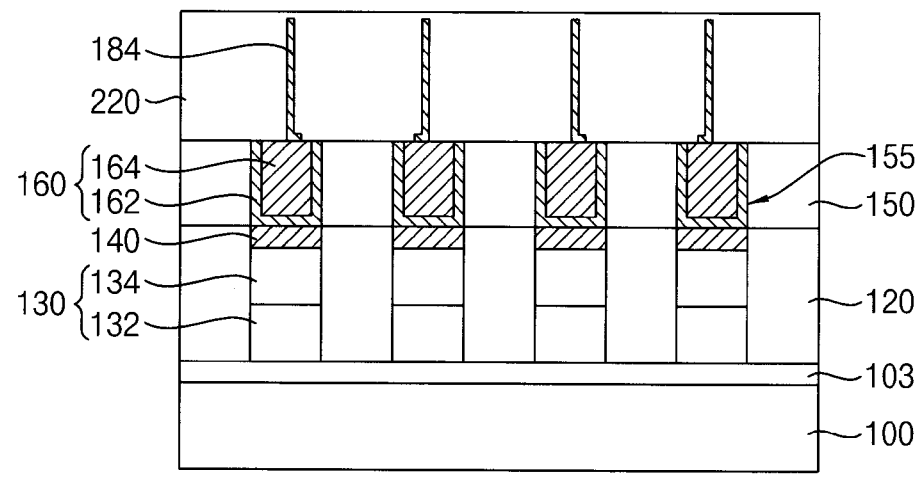
Figure 22:
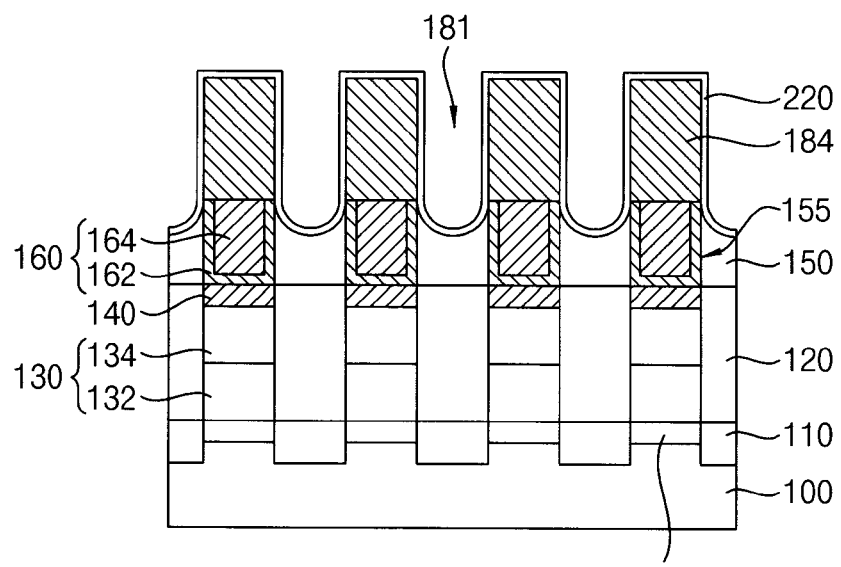

Referring to FIGS. 21 and 22, a fifth insulation layer 220 may be formed on the fourth insulation layer 210 to cover the first lower electrodes 184 and the exposed top surface of the second insulation layer 150.

The fifth insulation layer 220 may be formed to include a nitride, e.g., silicon nitride, and may be formed to include a material substantially the same as that of the fourth insulation layer 210. Thus, the fifth insulation layer 220 and the fourth insulation layer 210 may be merged, and hereinafter, the merged layer may be referred to simply as a fifth insulation layer 220.

Figure 23:
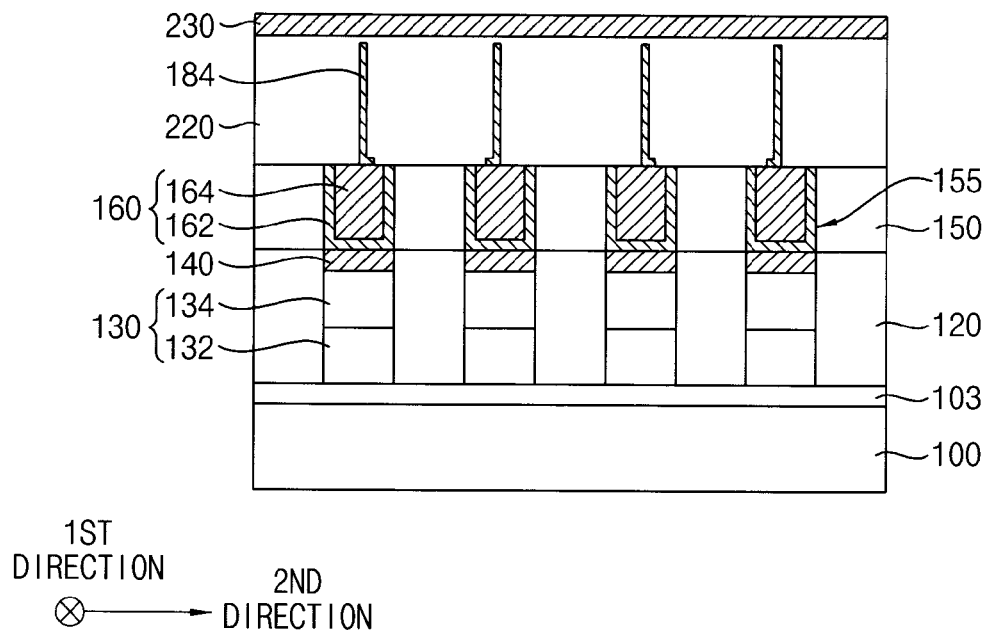
Figure 24:
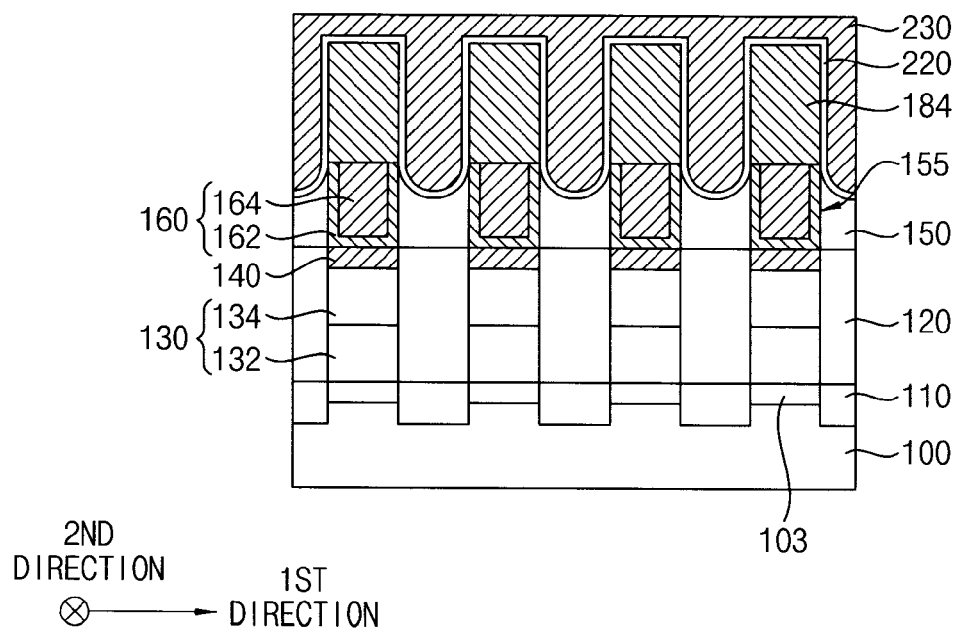

Referring to FIGS. 23 and 24, a heat sink layer 230 may be formed on the fifth insulation layer 220 to sufficiently fill a remaining portion of the first recess 181.

The heat sink layer may be formed to include a metal of high thermal conductivity, e.g., silver, copper, lead, tin, magnesium, zinc, iron, gold, aluminum, iridium, molybdenum, nickel, platinum, beryllium, cadmium, cobalt, titanium, tungsten, etc., or a metal compound, e.g., titanium nitride, tungsten nitride, etc. In an example embodiment, the heat sink layer 230 may be formed to include titanium nitride that may be easily wet etched among the metal or the metal nitride.

Figure 25:
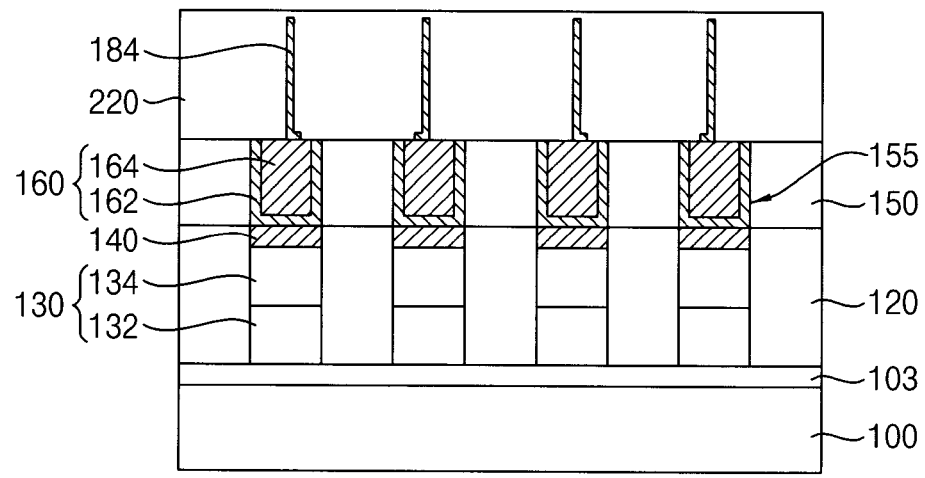
Figure 26:
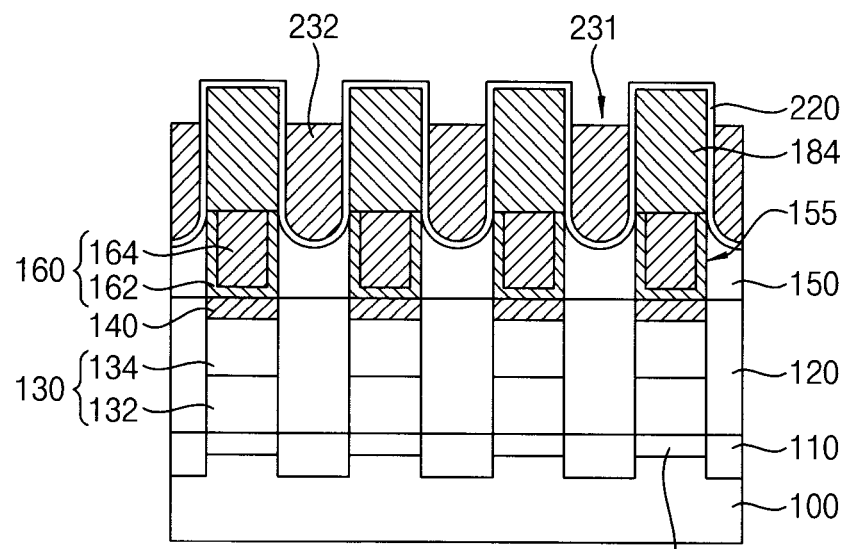

Referring to FIGS. 25 and 26, an upper portion of the heat sink layer 230 may be removed to form a first heat sink 232 and a second recess 231.

In some embodiments, the upper portion of the heat sink layer 230 may be removed by a wet etching process.

In some embodiments, the first heat sink 232 may be formed to extend in the second direction, and a plurality of first heat sink 232 may be formed in the first direction. Thus, the second recess 232 may be also formed to extend in the second direction, and a plurality of second recesses 232 may be formed in the first direction.

In some embodiments, top surfaces of the first heat sinks 232 may be lower than those of the first lower electrodes 184. Additionally, bottom surfaces of the first heat sinks 232 may be lower than those of the first lower electrodes 184, and thus may be formed adjacent to the first barrier layer pattern 162 of the plug 160. The heat absorbed by the first heat sinks 232 may be transferred to the first barrier layer pattern 162 adjacent to the heat sinks 232.

Figure 27:
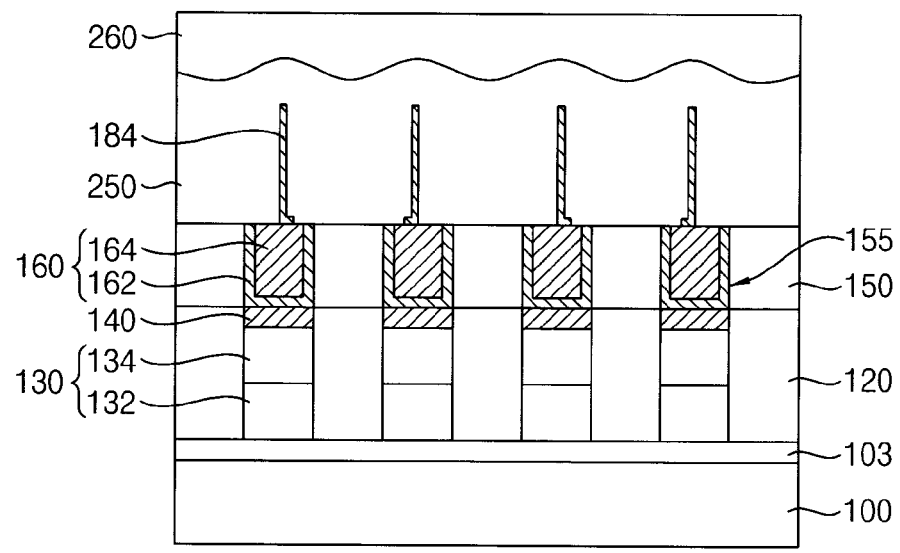
Figure 28:
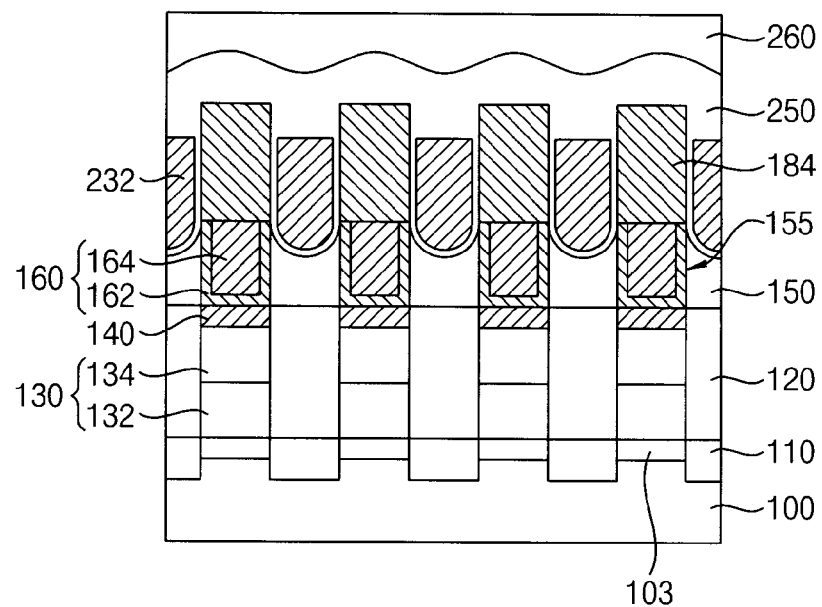

Referring to FIGS. 27 and 28, a sixth insulation layer 250 may be formed on the fifth insulation layer 220 and the first heat sinks 232 to sufficiently fill a remaining portion of the second recess 231, and a seventh insulation layer 260 may be formed on the sixth insulation layer 250.

The sixth insulation layer 250 may be formed to include a nitride, e.g., silicon nitride, and may be formed to include a material substantially the same as that of the fifth insulation layer 220. Thus, the fifth insulation layer 220 and the sixth insulation layer 250 may be merged, and hereinafter, the merged layer may be referred to simply as a sixth insulation layer 250.

The sixth insulation layer 250 formed using silicon nitride of which a deposition rate is low may be formed to have a non-uniform top surface. Thus, the seventh insulation layer 260 may be formed on the sixth insulation layer 250 using a material of which a deposition rate is higher than that of silicon nitride, e.g., an oxide such as silicon oxide, so that a top surface of the seventh insulation layer 260 may be uniform. Accordingly, a planarization process may be easily performed. If the top surface of the sixth insulation layer 250 is not so non-uniform, then the seventh insulation layer 260 may not be formed but omitted.

Figure 29:
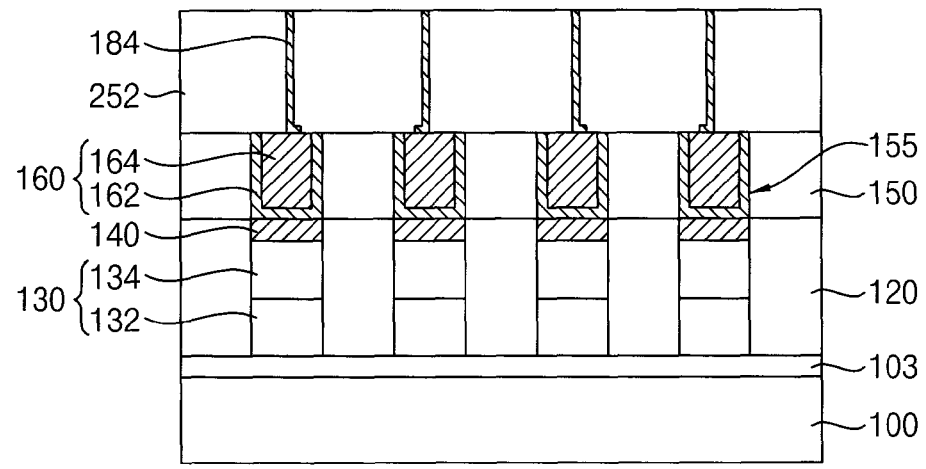
Figure 30:
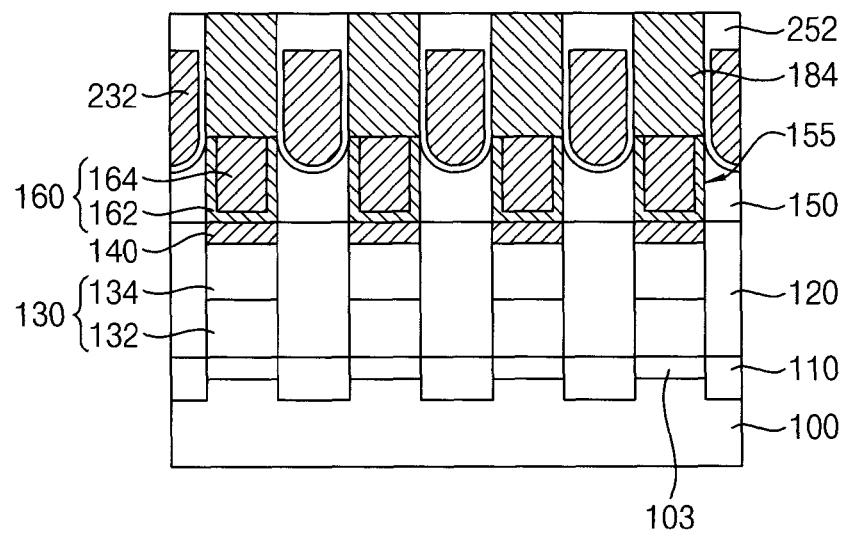

Referring to FIGS. 29 and 30, a planarization process may be performed until the top surfaces of the first lower electrodes 184 may be exposed to remove upper portions of the seventh insulation layer 260 and the sixth insulation layer 250, so that a sixth insulation layer pattern 252 may remain.

In some embodiments, the planarization process may be performed by a CMP process and/or an etch back process.

The top surfaces of the first heat sinks 232 may be lower than those of the first lower electrodes 184, and thus the first heat sinks 232 may be covered by the sixth insulation layer pattern 252 after the planarization process. That is, the sixth insulation layer pattern 252 may surround top and bottom surfaces and sidewalls of the first heat sinks 232, and thus may be spaced apart and electrically insulated from the first lower electrodes 184, first phase change material layer patterns 270 subsequently formed (refer to FIGS. 33 and 34), and first upper electrodes 290 subsequently formed (refer to FIGS. 2 and 3).

Figure 31:
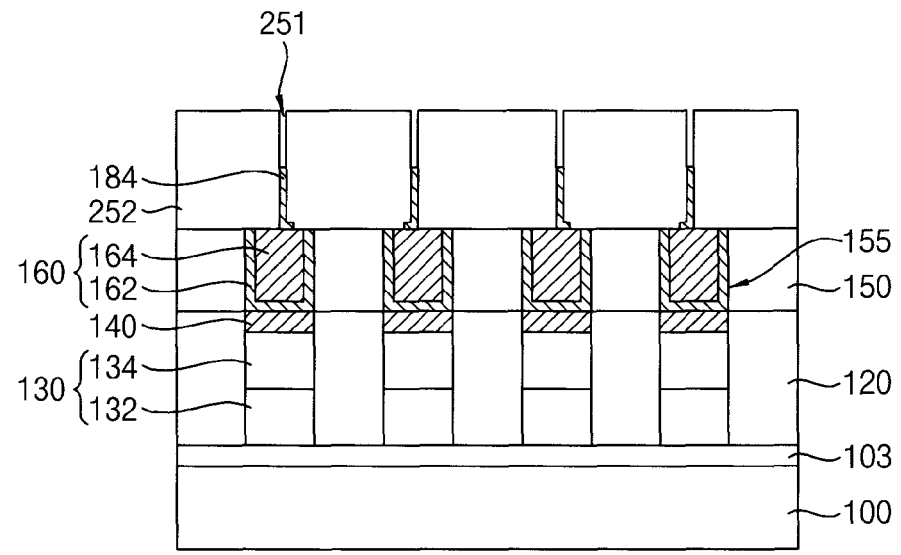
Figure 32:
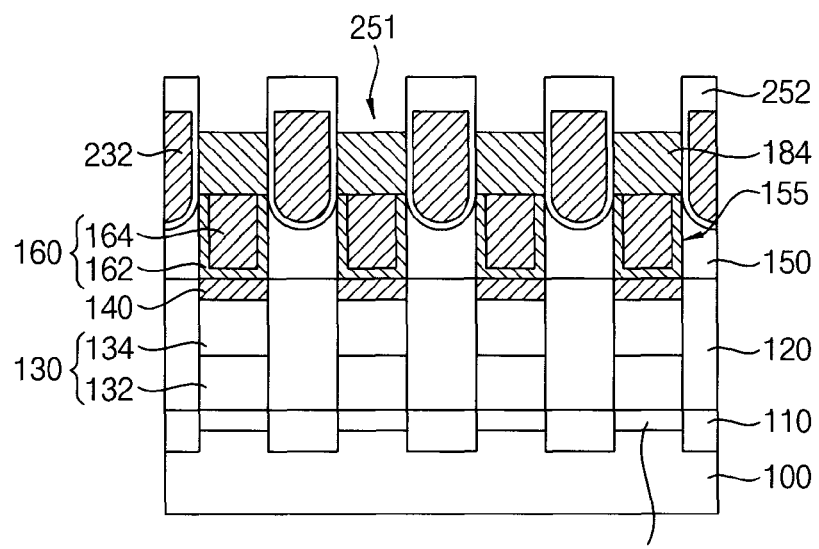

Referring to FIGS. 31 and 32, the exposed upper portions of the first lower electrodes 184 may be removed to form a third recess 251.

In some embodiments, the first lower electrodes 184 may be removed by a wet etching process, and the wet etching process may be performed using, e.g., SC1 solution as an etching solution.

The plurality of first lower electrodes 184 may be formed both in the first and second directions to form the first lower electrode array, and thus a plurality of third recesses 251 may be formed both in the first and second directions to form a third recess array.

In some embodiments, the third recess 251 may be formed to have a bottom surface lower than top surfaces of the first heat sinks 232, and thus top surfaces of the first lower electrodes 184 may be lower than the top surfaces of the first heat sinks 232.

Figure 33:
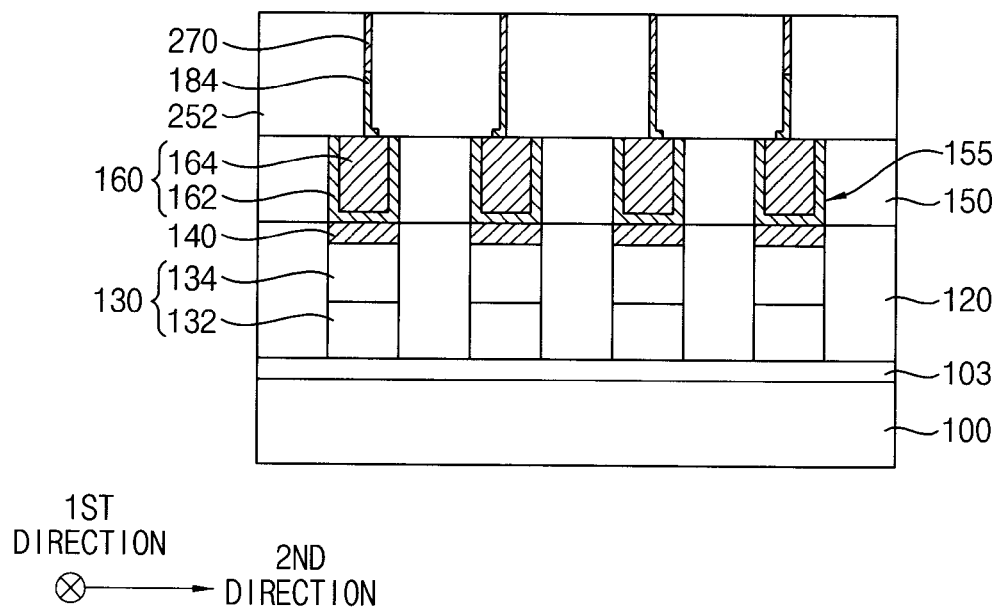
Figure 34:
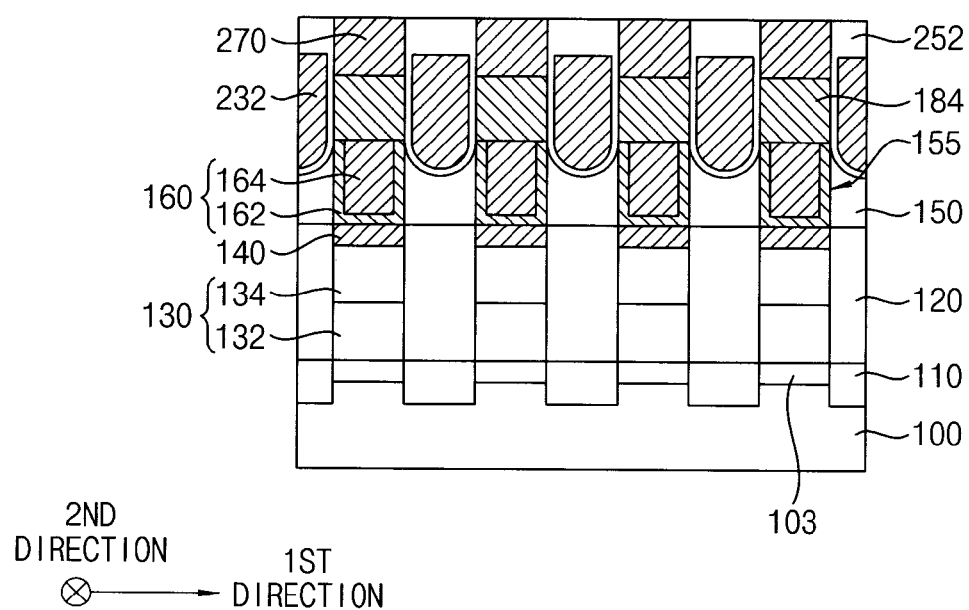

Referring to FIGS. 33 and 34, the first phase change material layer pattern 270 may be formed to fill each third recess 251.

In some embodiments, a phase change material layer sufficiently filling the third recesses 251 may be formed on the first lower electrodes 184 and the sixth insulation layer pattern 252, and an upper portion of the phase change material layer may be planarized to form the first phase change material layer pattern 270.

In some embodiments, the phase change material layer may be formed to include chalcogen material, e.g., GeSbTe (GST) or chalcogen material doped with carbon, nitrogen and/or a metal by a sputtering process or an ALD process.

A plurality of third recesses 251 may be formed both in the first and second directions to form the third recess array, and thus a plurality of first phase change material layer patterns 270 may be formed both in the first and second directions to form a first phase change material layer pattern array.

In some embodiments, each first phase change material layer pattern 270 may have a cross-section of a rectangular shape or a bar shape, and a first width of the first phase change material layer pattern 270 along the first direction may be wider than a second width thereof along the second direction.

Each first phase change material layer pattern 270 may fill the third recess 251 that may be formed by removing the upper portion of each first lower electrode 184, and thus a bottom surface of each first phase change material layer pattern 270 may have a shape substantially the same as that of each first lower electrode 184.

Referring to FIGS. 1 to 3 again, an eighth insulation layer 280 may be formed on the sixth insulation layer pattern 252 and the first phase change material layer pattern 270, and a fourth opening 285 exposing the top surface of the first phase change material layer patterns 270 and a portion of the top surface of the sixth insulation layer pattern 252 may be formed through the eighth insulation layer 280. A first upper electrode 290 and a first bit line 300 may be sequentially formed to fill the fourth opening 285 so that the phase change memory device may be manufactured.

The eighth insulation layer 280 may be formed to include an oxide, e.g., silicon oxide or a nitride, e.g., silicon nitride.

In some embodiments, the fourth opening 285 may be formed to extend in the first direction, and a plurality of fourth openings 285 may be formed in the second direction. Thus, the first upper electrode 290 may also extend in the first direction, and a plurality of first upper electrodes 290 may be formed in the second direction to form a first electrode column. Additionally, the first bit line 300 may extend in the first direction, and a plurality of first bit lines 300 may be formed in the second direction.

The first phase change material layer pattern 270 may have a first width along the first direction wider than a second width along the second direction, and thus forming the fourth opening 285 exposing the first phase change material layer pattern 270 to extend in the first direction may have an advantage in the aspect of the process margin.

In some embodiments, the first upper electrode 290 may be formed by forming a second conductive layer on the top surfaces of the first phase change material layer patterns 270 and the sixth insulation layer pattern 252 and the eighth insulation layer 280 to sufficiently fill the fourth opening 285, by planarizing the second conductive layer until a top surface of the eighth insulation layer 280 may be exposed, and by removing an upper portion of the planarized second conductive layer. Additionally, the first bit line 300 may be formed by forming a third conductive layer on top surfaces of the first upper electrodes 290 and the eighth insulation layer 280 and by planarizing the third conductive layer until the top surface of the eighth insulation layer 280 may be exposed.

The second conductive layer may be formed to include a metal, e.g., titanium, tantalum, tungsten, etc., or a metal compound, e.g., titanium carbide, tantalum carbide, titanium nitride, tantalum nitride, tungsten nitride, titanium carbonitride, tantalum carbonitride, tungsten carbonitride, titanium oxynitride, tantalum oxynitride, tungsten oxynitride, titanium silicon nitride, tantalum silicon nitride, tungsten silicon nitride, etc. The third conductive layer may be formed to include a low resistance metal, e.g., copper, aluminum, tungsten, etc.

In an example embodiment, the first bit line 300 may be formed to include a barrier layer pattern (not shown) including a metal nitride.

The sixth insulation layer pattern 252 may be formed between the first upper electrodes 290 and the first heat sinks 232 so that the first upper electrodes 290 and the first heat sinks 232 may be electrically insulated from each other.

The first lower electrode 184, the first phase change material layer pattern 270 and the first upper electrode 290 may define a phase change memory unit, and the phase change memory unit may be spaced apart and electrically insulated from the first heat sink 232 by the sixth insulation layer pattern 252.

Figure 35:
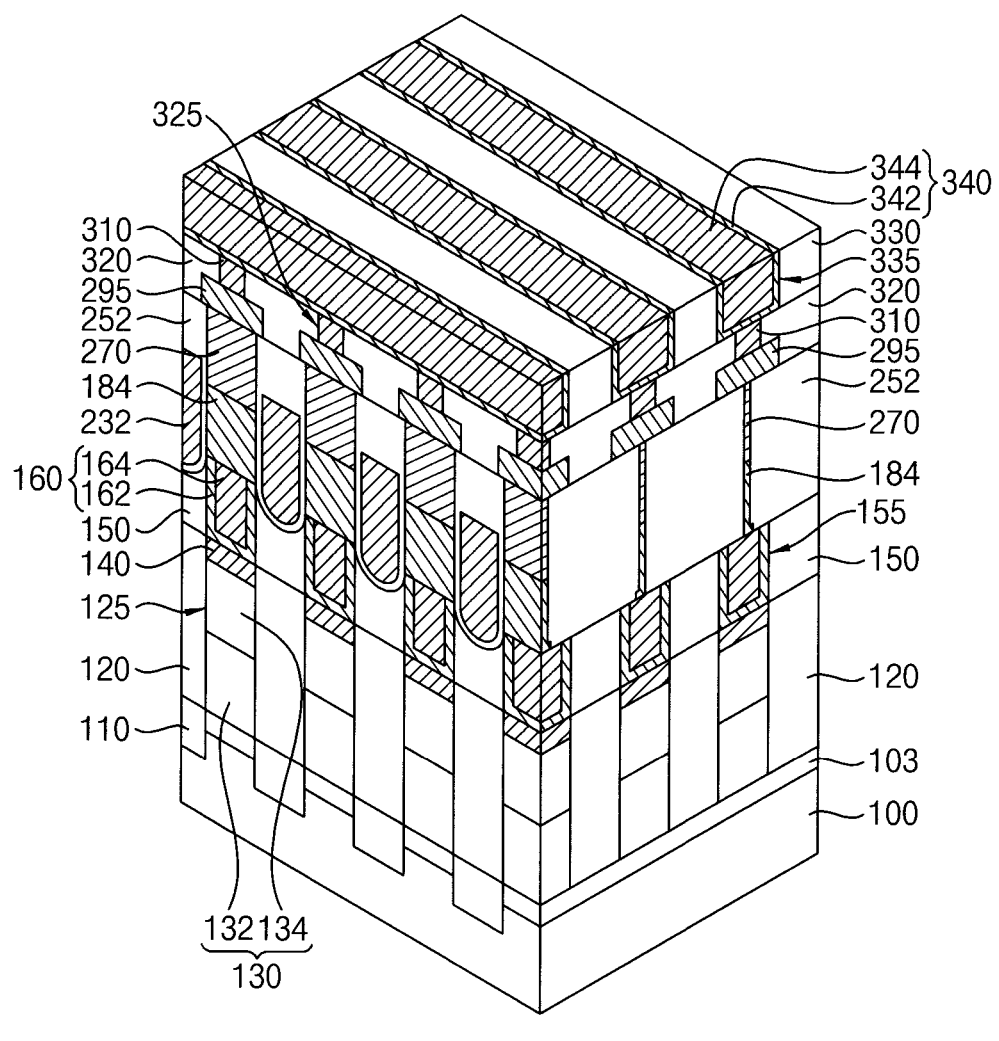
FIG. 35 is a perspective view illustrating a phase change memory device in accordance with some embodiments.
Figure 35:
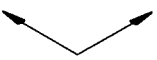
Figure 36:
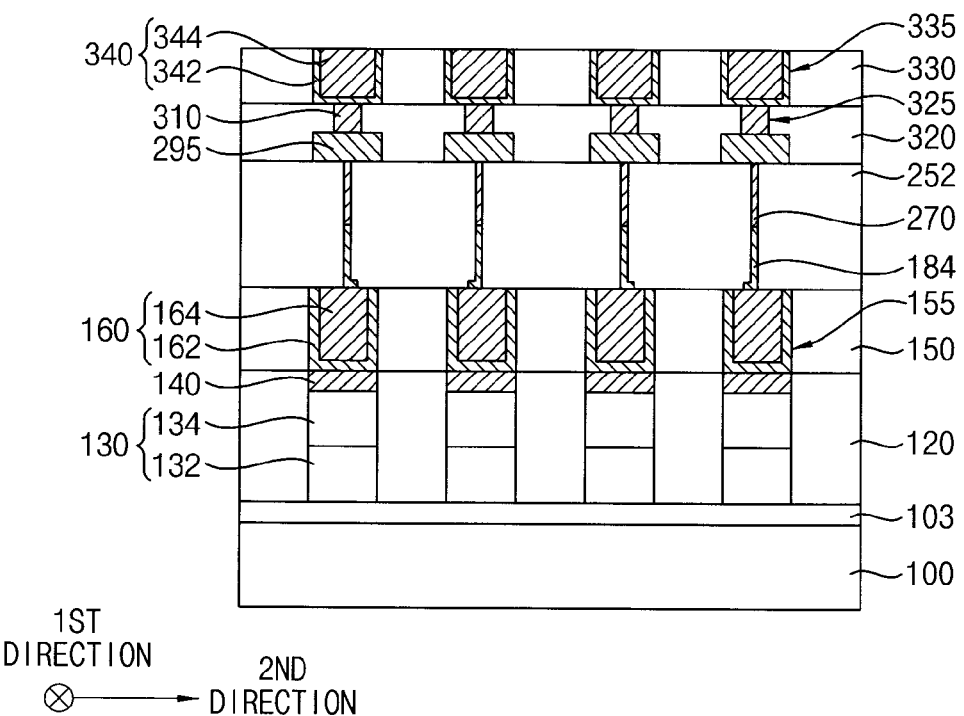
FIGS. 36 and 37 are cross-sectional views illustrating the phase change memory device of FIG. 35.
Figure 37:
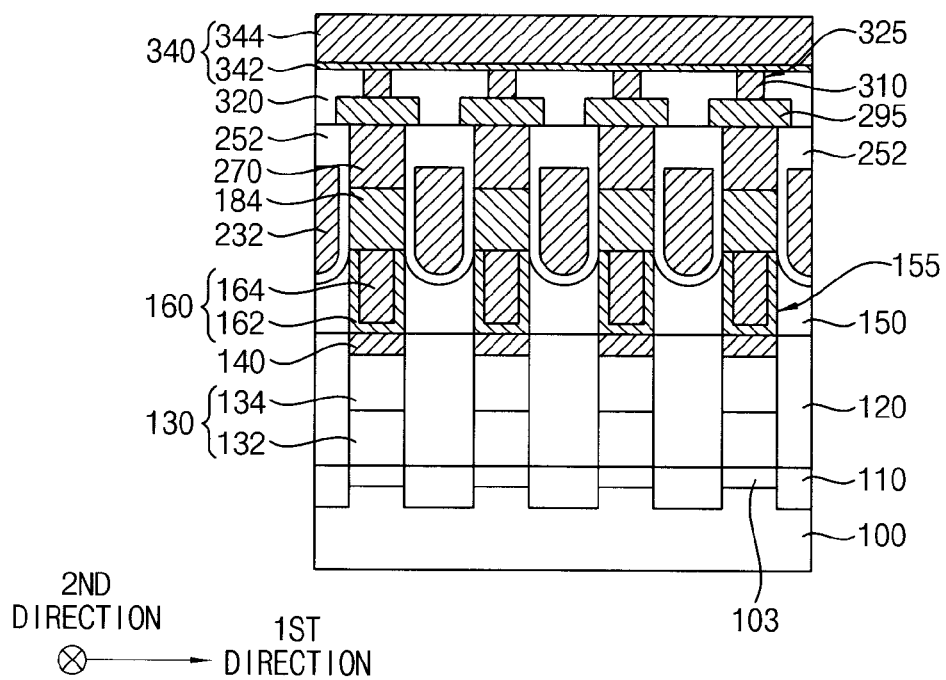

FIG. 35 is a perspective view illustrating a phase change memory device in accordance with some embodiments, and FIGS. 36 and 37 are cross-sectional views illustrating the phase change memory device of FIG. 35. FIG. 36 is a cross-sectional view taken along the second direction, and FIG. 37 is a cross-sectional view taken along the first direction. The phase change memory device may be substantially the same as that illustrated with reference to FIGS. 1 to 4 except for the upper electrode and the bit line, and thus like reference numerals refer to like elements and detailed descriptions thereon are omitted herein.

Referring to FIGS. 35 to 37, the phase change memory device may include a first lower electrode 184, a first phase change material layer pattern 270, a first heat sink 232, a second upper electrode 295 and a second bit line 340.

A plurality of second upper electrodes 295 may be formed both in the first and second directions to form a second upper electrode array, and each second upper electrode 295 may be formed on each first phase change material layer pattern 270. That is, unlike the plurality of first upper electrodes 290 each of which may have a linear or bar shape extending in the first direction, the second upper electrodes 295 may have an island shape from each other both in the first and second directions. Thus, the phase change memory units each of which may include the first lower electrode 184, the first phase change material layer pattern 270 and the second upper electrode 295 may be physically distinguished from each other.

The second bit line 340 may extend in the first direction, and a plurality of second bit lines 340 may be formed in the second direction. The second bit line 340 may be electrically connected to the second upper electrodes 295 by contact plugs 310.

Each contact plug 310 may be formed on each second upper electrode 295, and thus a plurality of contact plugs 310 may be formed both in the first and second directions to form a contact plug array. The contact plug 310 may include, e.g., doped polysilicon, a metal, a metal nitride, a metal silicide, etc.

Sidewalls of the contact plugs 310 and the second upper electrodes 295 may be covered by a ninth insulation layer 320 on the sixth insulation layer pattern 252. The ninth insulation layer 320 may include an oxide, e.g., silicon oxide or a nitride, e.g., silicon nitride.

The second bit line 340 may fill a sixth opening 335 through a tenth insulation layer 330 on the ninth insulation layer 320. In some embodiments, the sixth opening 335 may extend in the first direction, and a plurality of sixth openings 335 may be formed in the second direction. In some embodiments, the second bit line 340 may include a third barrier layer pattern 342 on a bottom and sidewall of the sixth opening 335, and a third conductive layer pattern 344 that may fill a remaining portion of the sixth opening 335 and formed on the third barrier layer pattern 342.

Figure 38:
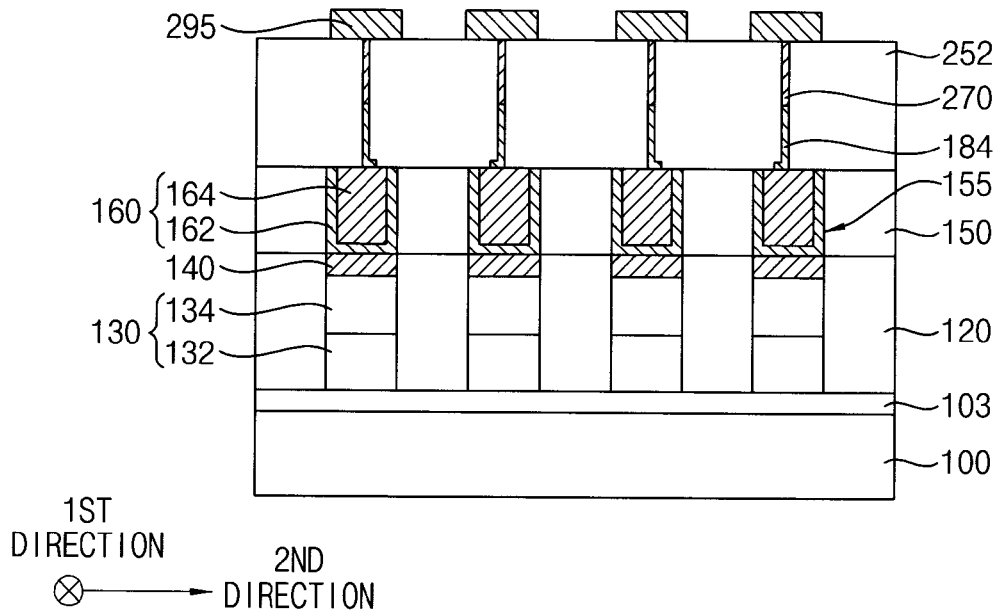
FIGS. 38 to 41 are cross-sectional views illustrating a method of manufacturing a phase change memory device in accordance with some embodiments.
Figure 39:
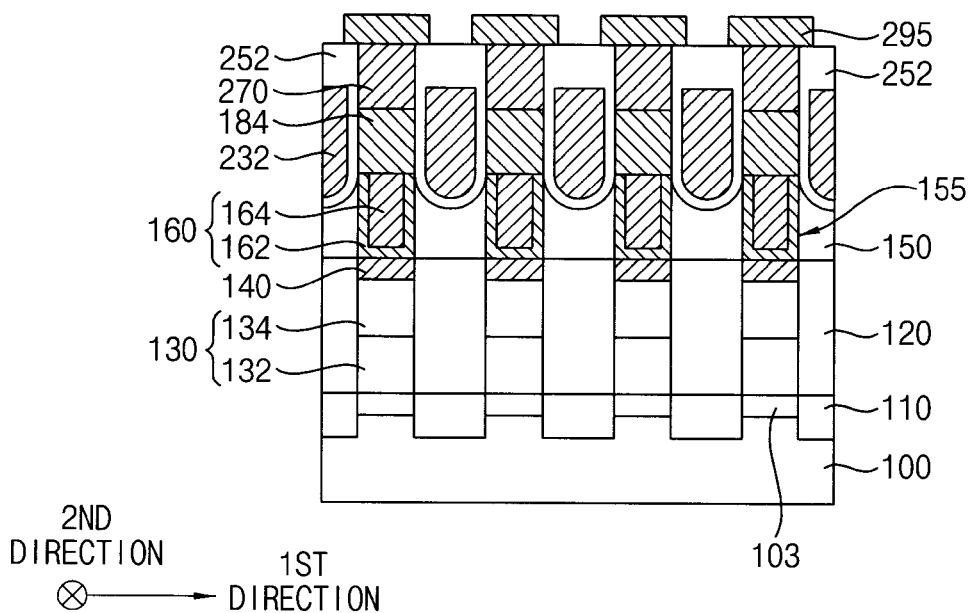
Figure 40:
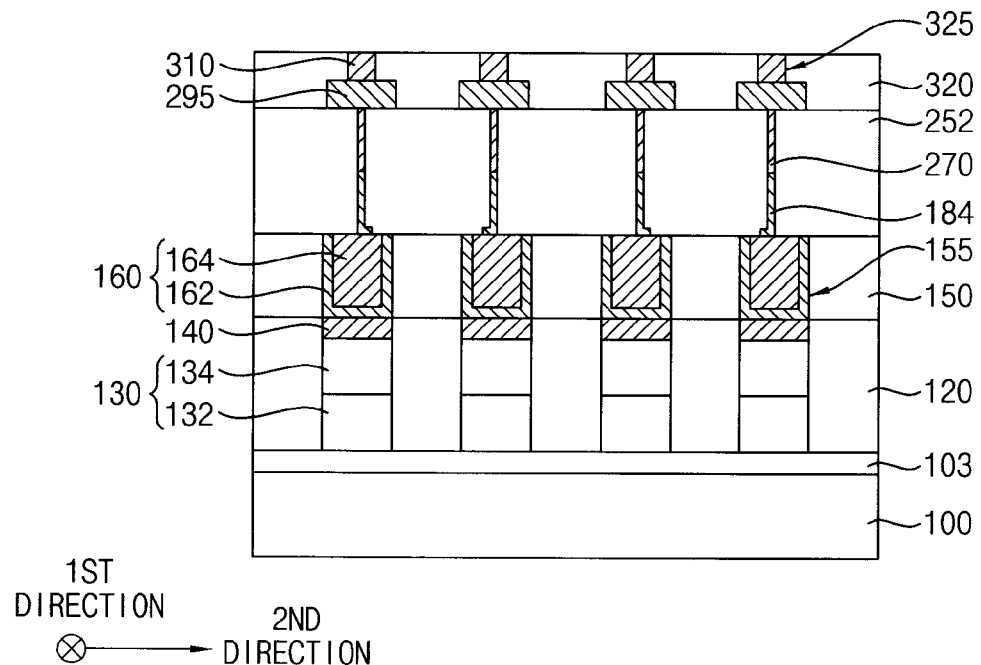
Figure 41:
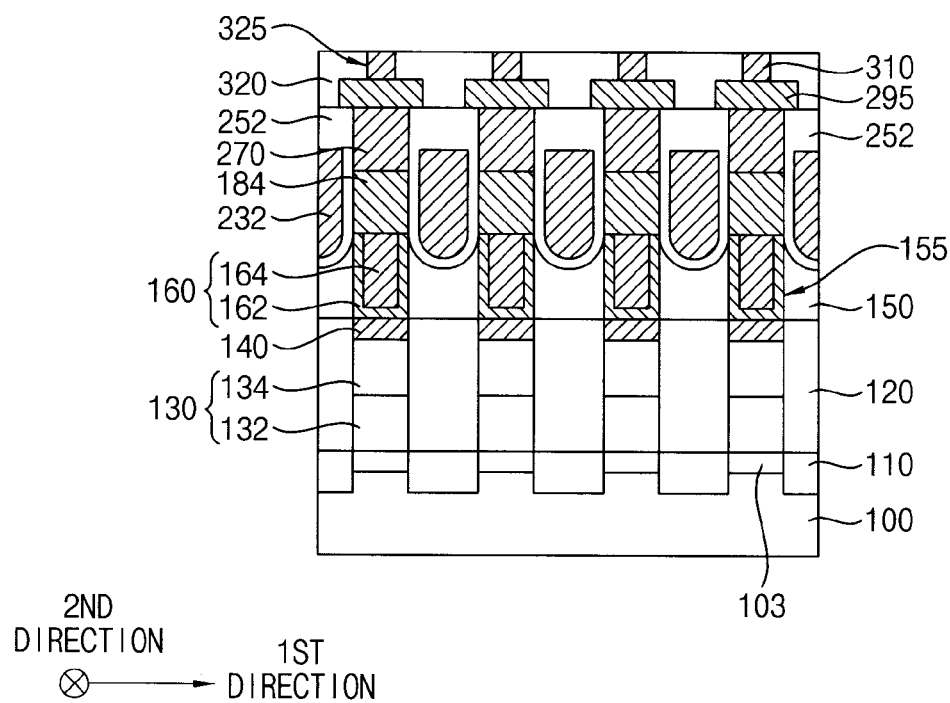

FIGS. 38 to 41 are cross-sectional views illustrating a method of manufacturing a phase change memory device in accordance with some embodiments. FIGS. 38 and 40 are cross-sectional views taken along the second direction, and FIGS. 39 and 41 are cross-sectional views taken along the first direction. This method may be used in manufacturing the phase change memory device of FIGS. 35 to 37, however, may not be limited thereto. This method may include processes substantially the same as or similar to those illustrated with reference to FIGS. 5 to 34, and thus like reference numerals refer to like elements and detailed descriptions thereon are omitted herein.

First, processes substantially the same as or similar to those illustrated with reference to FIGS. 5 to 34 may be performed.

Referring now to FIGS. 38 and 39, a plurality of second upper electrodes 295 contacting the first phase change material layer patterns 270, respectively, may be formed on the sixth insulation layer pattern 252.

In some embodiments, the second upper electrodes 295 may be formed by forming and patterning a second conductive layer on the sixth insulation layer pattern 252 and the first phase change material layer pattern 270. Alternatively, an insulation layer (not shown) may be formed on the sixth insulation layer pattern 252 and the first phase change material layer pattern 270, openings (not shown) may be formed through the insulation layer to expose top surfaces of the first phase change material layer patterns 270 and portions of top surfaces of the sixth insulation layer patterns 252, the second conductive layer may be formed on the exposed top surfaces of the first phase change material layer patterns 270 and the sixth insulation layer patterns 252 and the insulation layer, and an upper portion of the second conductive layer may be planarized to form the second upper electrodes 295.

In some embodiments, a plurality of second upper electrode 295 may be formed both in the first and second directions to form a second upper electrode array.

Referring to FIGS. 40 and 41, a ninth insulation layer 320 covering the second upper electrodes 295 may be formed on the sixth insulation layer 252, and contact plugs 310 may be formed through the ninth insulation layer 320 to contact the second upper electrodes 295, respectively.

The ninth insulation layer 320 may be formed to include an oxide, e.g., silicon oxide or a nitride, e.g., silicon nitride.

The contact plug 310 may be formed by forming fifth openings 325 exposing the second upper electrodes 295 through a portion of the ninth insulation layer 320, by forming a fourth conductive layer on the exposed second upper electrodes 295 and the ninth insulation layer 320 to sufficiently fill the fifth openings 325, and by planarizing the fourth conductive layer until a top surface of the ninth insulation layer 320 may be exposed. The fourth conductive layer may be formed to include, e.g., doped polysilicon, a metal, a metal nitride or a metal silicide.

In some embodiments, a plurality of contact plugs 310 may be formed both in the first and second directions to form a contact plug array.

Referring to FIGS. 35 to 37 again, a tenth insulation layer 330 may be formed on the ninth insulation layer 320, and a second bit line 340 may be formed through the tenth insulation layer 330 to contact the contact plug 310, so that the phase change memory device may be manufactured.

The tenth insulation layer 330 may be formed to include an oxide, e.g., silicon oxide or a nitride, e.g., silicon nitride.

In some embodiments, a sixth opening 335 may be formed through the tenth insulation layer 330 to expose top surfaces of the contact plugs 310 and portions of top surfaces of the ninth insulation layer 320, a third barrier layer may be formed on the exposed top surfaces of the contact plugs 310 and the ninth insulation layer 320, a third conductive layer may be formed on the third barrier layer to sufficiently fill a remaining portion of the sixth opening 335, and the third conductive layer and the third barrier layer may be planarized until a top surface of the tenth insulation layer 330 may be exposed to form the second bit line 340. Thus, the second bit line 340 may be formed to include a third barrier layer pattern 342 and a third conductive layer pattern 344.

In some embodiments, the sixth opening 335 may be formed to extend in the first direction, and a plurality of sixth openings 335 may be formed in the second direction. Thus, the second bit line 340 may have a linear or bar shape extending in the first direction, and a plurality of second bit lines 340 may be formed in the second direction.

The third barrier layer may be formed to include a metal or a metal nitride, e.g., titanium, titanium nitride, etc., and the third conductive layer may be formed to include a low resistance metal, e.g., copper, tungsten, aluminum, etc.

Figure 42:
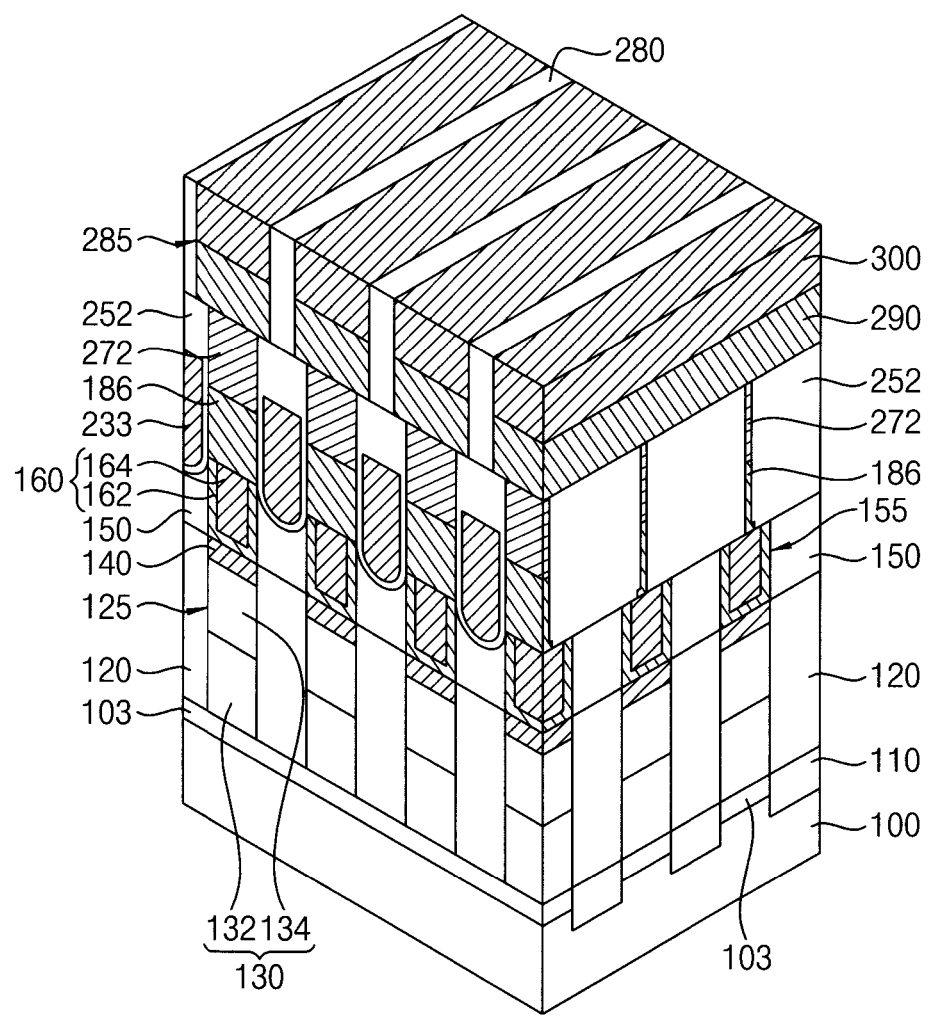
FIG. 42 is a perspective view illustrating a phase change memory device in accordance with some embodiments.
Figure 43:
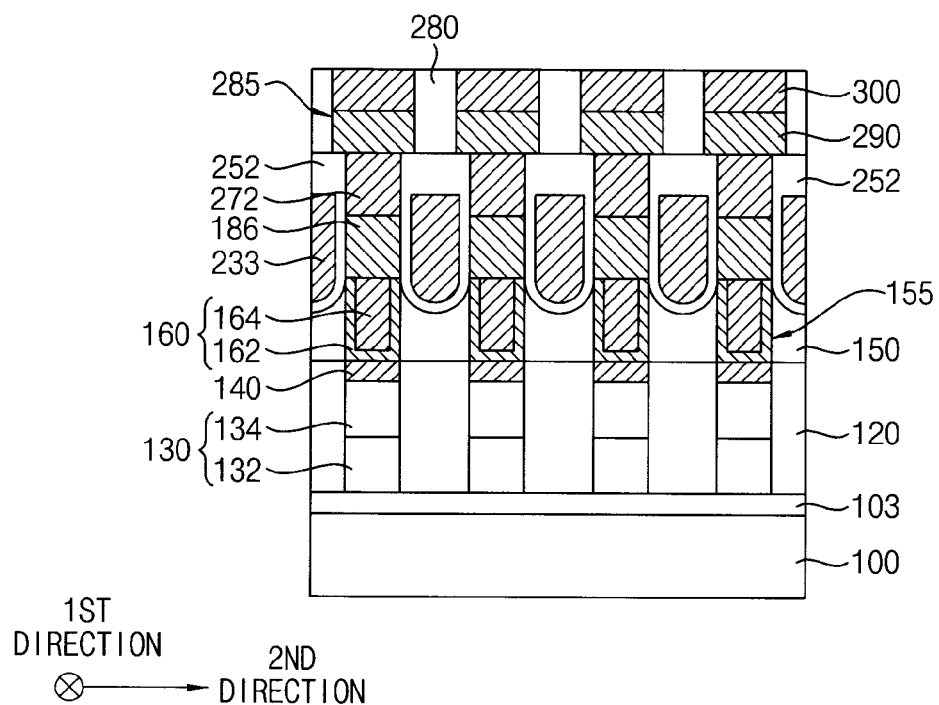
FIGS. 43 and 44 are cross-sectional views illustrating the phase change memory device of FIG. 42.
Figure 44:
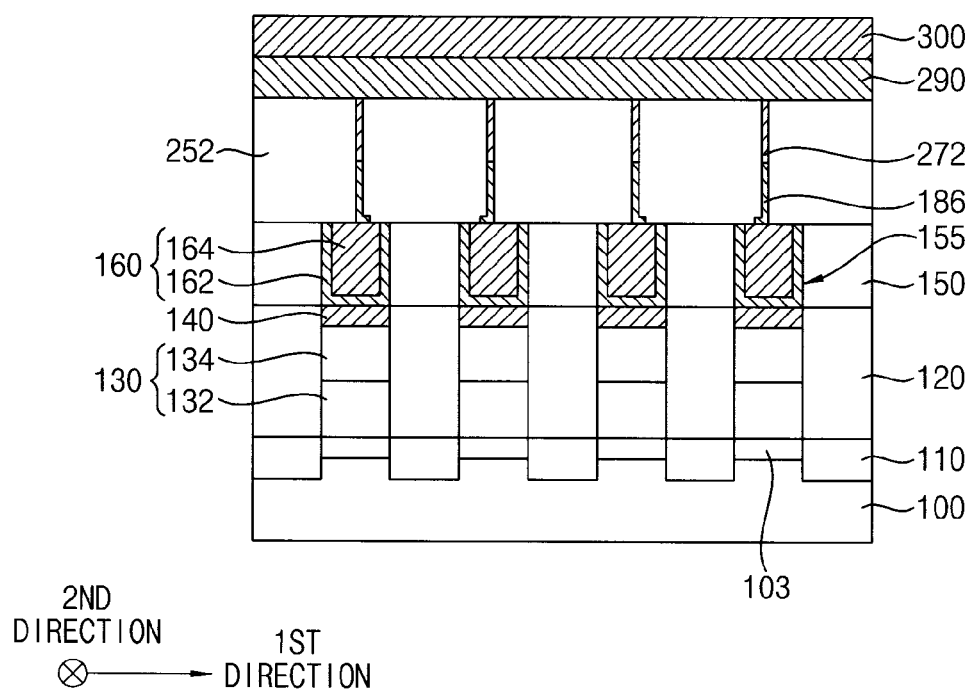

FIG. 42 is a perspective view illustrating a phase change memory device in accordance with some embodiments, and FIGS. 43 and 44 are cross-sectional views illustrating the phase change memory device of FIG. 42. FIG. 43 is a cross-sectional view taken along the second direction, and FIG. 44 is a cross-sectional view taken along the first direction. The phase change memory device may be substantially the same as that illustrated with reference to FIGS. 1 to 4 except for the location and direction of the lower electrode, the phase change material layer pattern and the heat sink, and thus like reference numerals refer to like elements and detailed descriptions thereon are omitted herein.

Referring to FIGS. 42 to 44, the phase change memory device may include a second lower electrode 186, a second phase change material layer pattern 272, a second heat sink 233, a first upper electrode 290 and a first bit line 300.

The second lower electrode 186 may have a cross-sectional shape along the second direction that may be substantially a rectangle or trapezoid with a bottom surface wider than a top surface. Additionally, the second lower electrode 186 may have a cross-sectional shape along the first direction that may be substantially an "L" shape.

In some embodiments, the second lower electrode 186 may have a second width along the second direction wider than a first width along the first direction, and a second distance between adjacent second lower electrodes 186 along the second direction may be smaller than a first distance between adjacent second lower electrodes 186 along the first direction.

The second phase change material layer pattern 272 may be formed on the second lower electrode 186, and a bottom surface of the second phase change material layer pattern 272 may have a shape and an area substantially the same as those of a top surface of the second lower electrode 186. That is, the second phase change material layer pattern 272 may have a cross-sectional shape that may be substantially a rectangular shape or a bar shape along the first and second directions. In some embodiments, the second phase change material layer pattern 272 may have a second width along the second direction wider than a first width along the first direction, and a second distance between adjacent second phase change material layer patterns 272 along the second direction may be smaller than a first distance between adjacent second phase change material layer patterns 272 along the first direction.

The second heat sink 233 may extend in the first direction, and a plurality of second heat sinks 233 may be formed in the second direction. The second heat sink 233 may be formed between structures arranged in the second direction each of which may include the second lower electrodes 186 and the second phase change material layer patterns 272 disposed in the first direction and portions of the sixth insulation layer pattern 252 therebetween.

In some embodiments, a top surface of the second heat sink 233 may be lower than a top surface of the second phase change material layer pattern 272, and thus may be lower than a bottom surface of the first upper electrode 290. Thus, the second heat sink 233 may be spaced apart from the first upper electrode 290. Additionally, the top surface of the second heat sink 233 may be higher than a bottom surface of the second phase change material layer pattern 272, and a bottom surface of the second heat sink 233 may be lower at least than a top surface of the second lower electrode 186. Thus, the second heat sink 233 may be formed adjacent to a region in which an exothermic reaction may occur vigorously according as the second lower electrode 186 heats the second phase change material layer pattern 272, that is, an interface between the second lower electrode 186 and the second phase change material layer pattern 272, so that the heat generated therefrom may be efficiently absorbed.

In some embodiments, the bottom surface of the second heat sink 233 may be lower than a bottom surface of the second lower electrode 186, and thus may be adjacent to the plug 160 under the second lower electrode 186.

In the phase change memory device, a first width of the second lower electrode 186 or the second phase change material layer pattern 272 along first direction in which the first bit line 300 or the first upper electrode 290 may extend may not be wider but narrower than a second width along the second direction, unlike the phase change memory device of FIGS. 1 to 4. Accordingly, the method of manufacturing the phase change memory device of FIGS. 42 to 44 may have a disadvantage in the aspect of process margin for forming the first upper electrode 290 or the first bit line 300.

Figure 45:
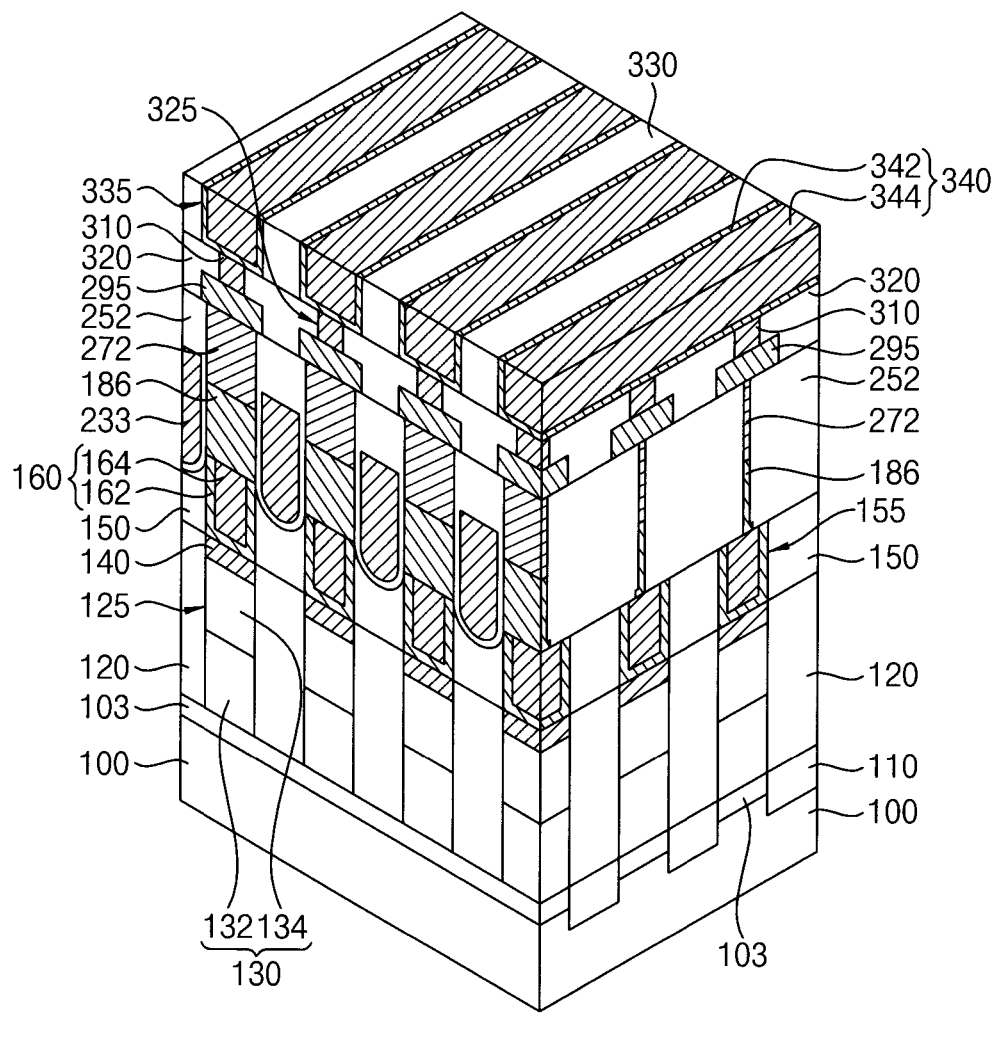
FIG. 45 is a perspective view illustrating a phase change memory device in accordance with some embodiments.
Figure 46:
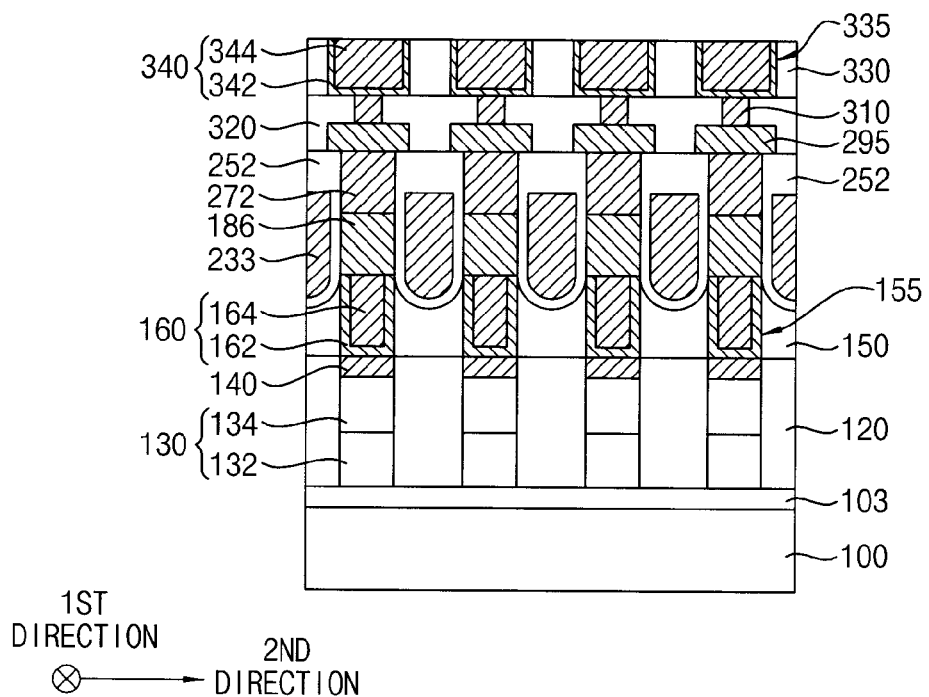
FIGS. 46 and 47 are cross-sectional views illustrating the phase change memory device of FIG. 45.
Figure 47:
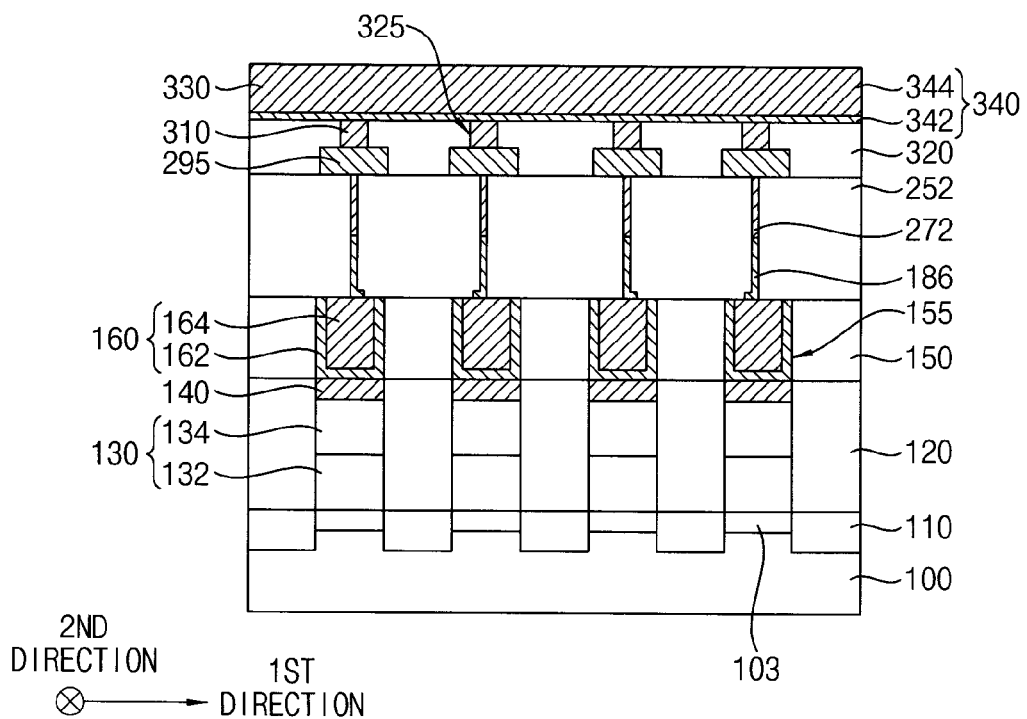

FIG. 45 is a perspective view illustrating a phase change memory device in accordance with some embodiments, and FIGS. 46 and 47 are cross-sectional views illustrating the phase change memory device of FIG. 45. FIG. 46 is a cross-sectional view taken along the second direction, and FIG. 47 is a cross-sectional view taken along the first direction. The phase change memory device may be substantially the same as that illustrated with reference to FIGS. 35 to 37 except for the location and direction of the lower electrode, the phase change material layer pattern and the heat sink. Additionally, in the phase change memory device, the location and the direction of the lower electrode, the phase change material layer pattern and the heat sink may be substantially the same as those of the phase change memory device illustrated with reference to FIGS. 42 to 44. Thus, like reference numerals refer to like elements and detailed descriptions thereon are omitted herein.

Referring to FIGS. 45 to 47, the phase change memory device may include a second lower electrode 186, a second phase change material layer pattern 272, a second heat sink 233, a second upper electrode 295 and a second bit line 340.

Figure 48:
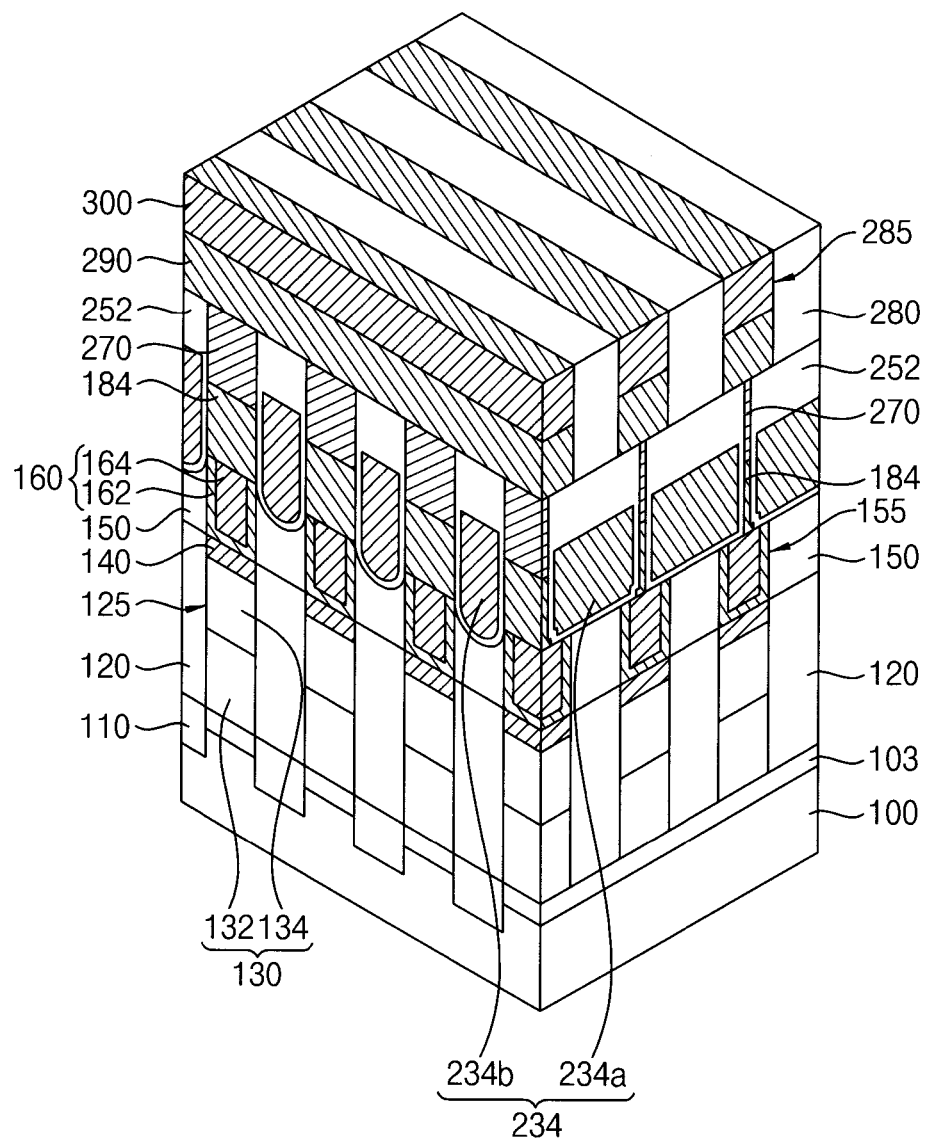
FIG. 48 is a perspective view illustrating a phase change memory device in accordance with some embodiments.
Figure 49:
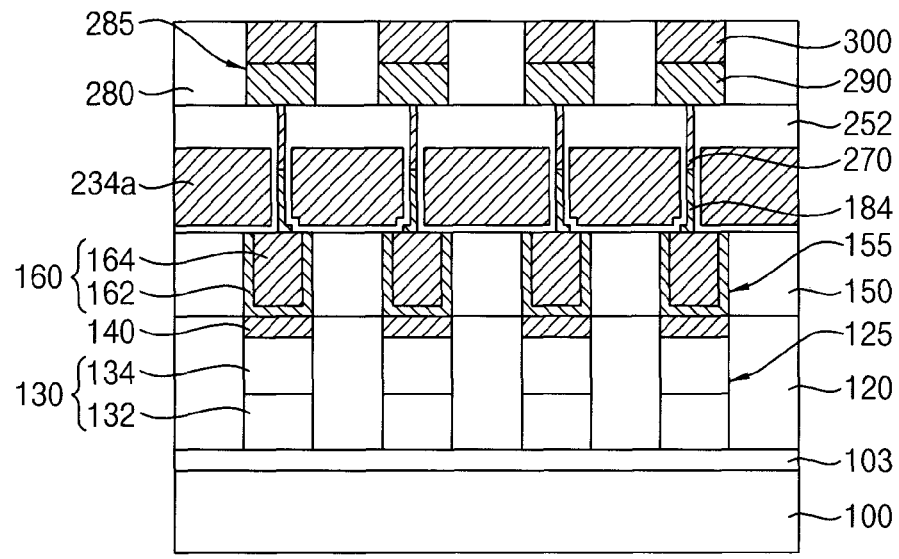
FIGS. 49 and 50 are cross-sectional views illustrating the phase change memory device of FIG. 48.
Figure 50:
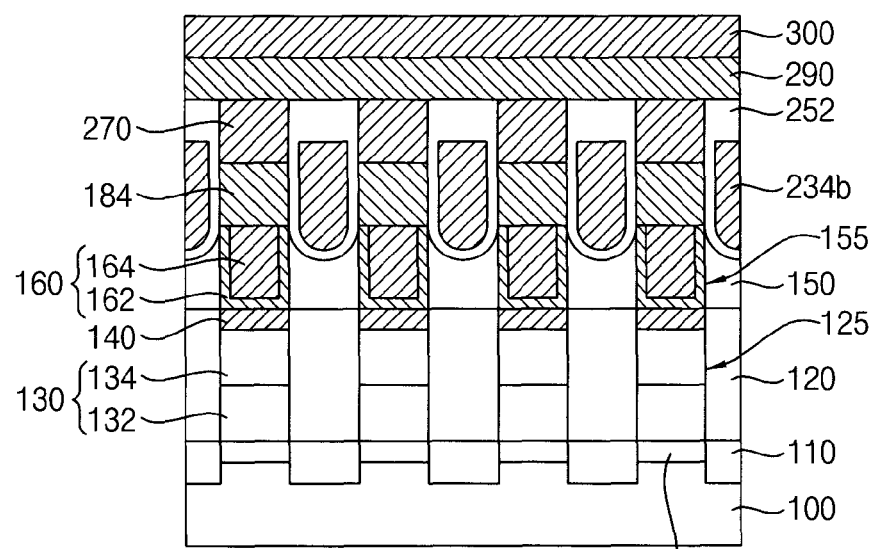
Figure 51:
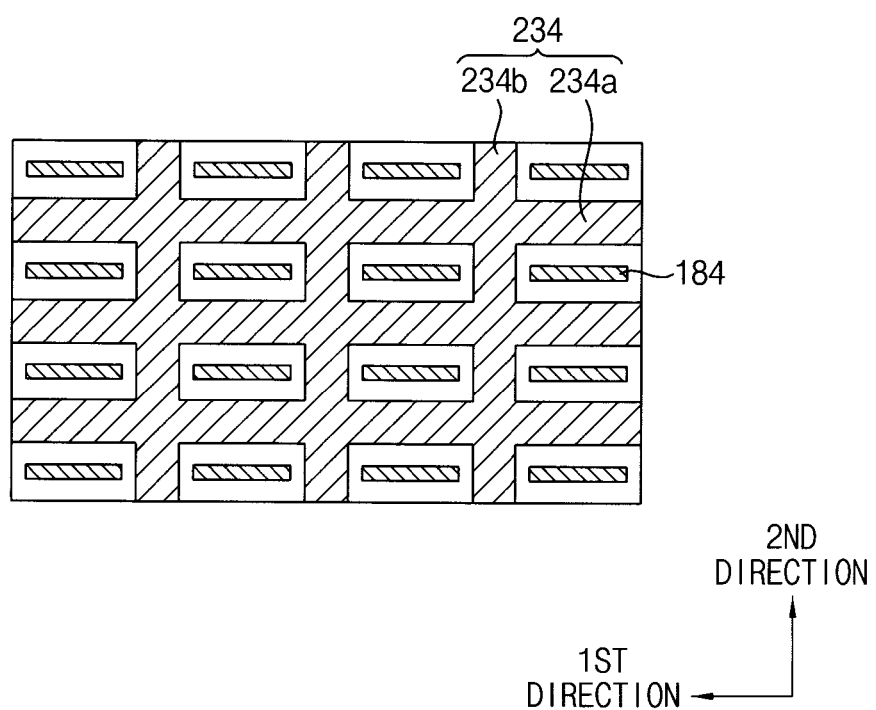
FIG. 51 is a plan view illustrating the positional relationship between lower electrodes and heat sinks of the phase change memory device.

FIG. 48 is a perspective view illustrating a phase change memory device in accordance with some embodiments, FIGS. 49 and 50 are cross-sectional views illustrating the phase change memory device of FIG. 48, and FIG. 51 is a plan view illustrating the positional relationship between lower electrodes and heat sinks of the phase change memory device. FIG. 49 is a cross-sectional view taken along the second direction, and FIG. 50 is a cross-sectional view taken along the first direction. The phase change memory device may be substantially the same as that illustrated with reference to FIGS. 1 to 4 except for the location and shape of the heat sink. Thus, like reference numerals refer to like elements and detailed descriptions thereon are omitted herein.

Referring to FIGS. 48 to 51, the phase change memory device may include a first lower electrode 184, a first phase change material layer pattern 270, a third heat sink 234, a first upper electrode 290 and a first bit line 300.

In some embodiments, the third heat sink 234 may have a lattice shape surrounding sidewalls of the first lower electrodes 184 or the first phase change material layer patterns 270 when viewed from a top side. That is, the third heat sink 234 may have a first extension portion 234*a* extending in the first direction and a second extension portion 234*b* extending in the second direction, and the first and second extension portions 234*a* and 234*b* may cross each other.

The third heat sink 234 may be spaced apart and electrically insulated from the phase change memory unit, i.e., the first lower electrode 184, the first phase change material layer pattern 270 and the first upper electrode 290 by the sixth insulation layer pattern 252. According as the first lower electrode 184 may have a cross-section of an "L" shape, a lower portion of the sixth insulation layer pattern 252 adjacent thereto may have a crooked shape, and a portion of the third heat sink 234 on the crooked lower portion of the sixth insulation layer pattern 252, i.e., an edge lower portion of the first extension portion 234*a* of the third heat sink 234 may be also crooked. A bottom surface of the second extension portion 234*b* may be lower than a bottom surface of the first lower electrode 184, and thus may be adjacent to an upper sidewall of the plug 160.

In the phase change memory device, the third heat sink 234 may be formed not only between the first lower electrodes 184 adjacent to each other in the first direction but also formed between the first lower electrodes 184 adjacent to each other in the second direction, unlike the phase change memory device illustrated with reference to FIGS. 1 to 4. Thus, the effect of absorbing or releasing heat may be enhanced.

FIGS. 52 to 59 are cross-sectional views illustrating a method of manufacturing a phase change memory device in accordance with some embodiments. FIGS. 52, 54, 56 and 58 are cross-sectional views taken along the second direction, and FIGS. 53, 55, 57 and 59 are cross-sectional views taken along the first direction. This method may be used in manufacturing the phase change memory device of FIGS. 48 to 50, however, may not be limited thereto. This method may include processes substantially the same as or similar to those illustrated with reference to FIGS. 5 to 34 and 1 to 3, and thus like reference numerals refer to like elements and detailed descriptions thereon are omitted herein.

First, processes substantially the same as or similar to those illustrated with reference to FIGS. 5 to 20 may be performed.

Figure 52:
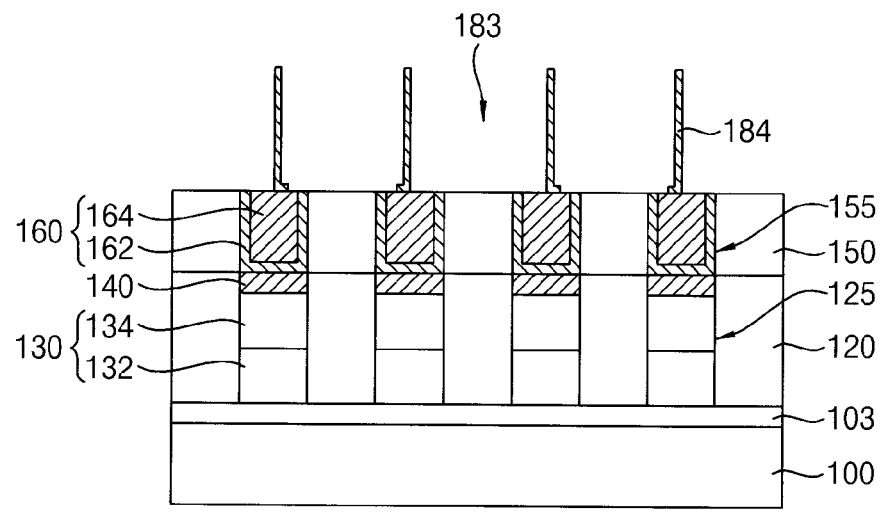
FIGS. 52 to 59 are cross-sectional views illustrating a method of manufacturing a phase change memory device in accordance with some embodiments.
Figure 53:
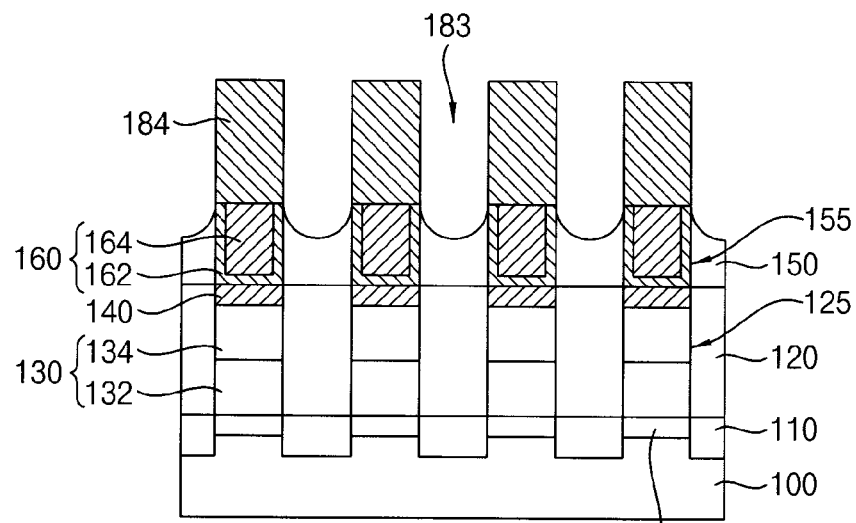

Referring now to FIGS. 52 and 53, the fourth insulation layer 210 between the adjacent first lower electrodes 184 arranged in the second direction may be removed to form a fourth recess 183 exposing sidewalls of the first lower electrodes 184, a top surface of the second insulation layer 150 and portions of top surfaces of the plugs 160.

In some embodiments, the fourth recess 183 may be formed by a wet etching process.

The fourth recess 183 may be in fluid communication with the plurality of first recesses 181 arranged in the first direction each of which may extend in the second direction. Hereinafter, the first and fourth recesses 181 and 183 in fluid communication with each other may be referred to simply as a fourth recess 183. That is, the fourth recess 183 may be defined as a space exposing a sidewall of the first lower electrode array, which may include the plurality of first lower electrodes 184 arranged both in the first and second directions, and may have a lattice shape when viewed from a top side.

Figure 54:
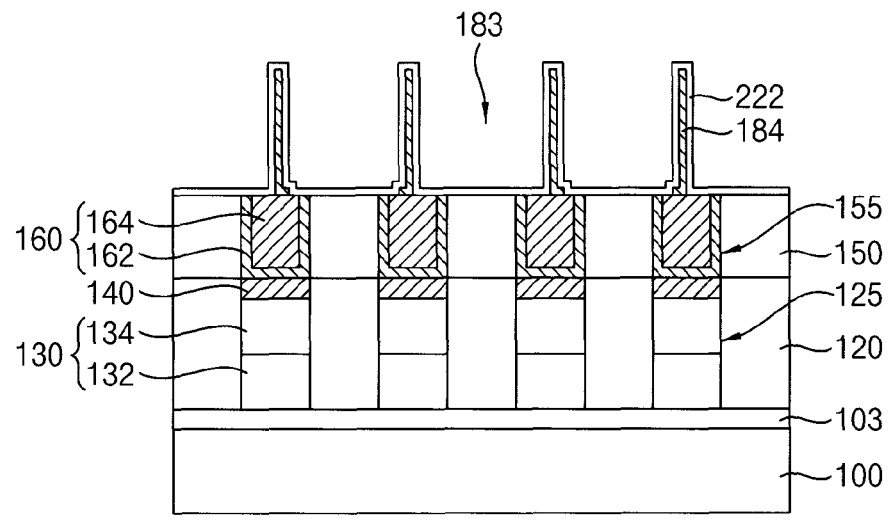
Figure 55:
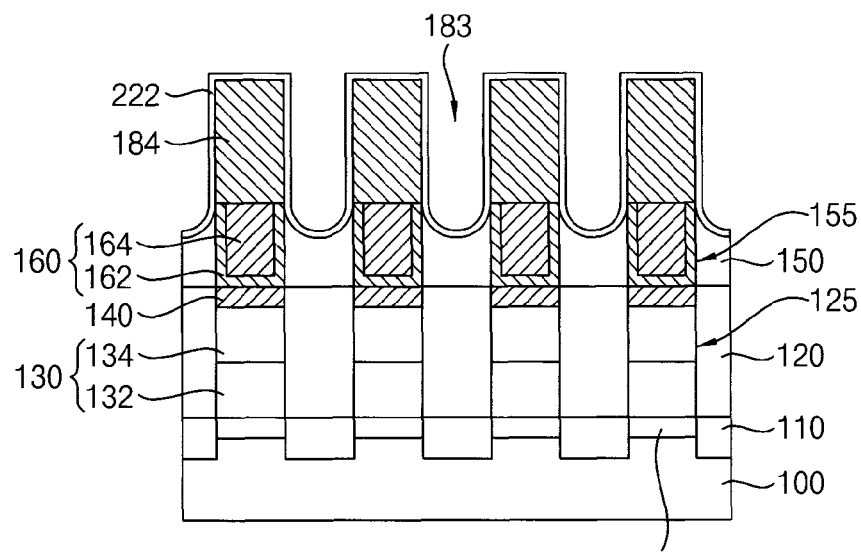

Referring to FIGS. 54 and 55, an eleventh insulation layer 222 may be formed on the exposed first lower electrodes 184, the exposed portions of the top surface of the plugs 160 and the exposed top surface of the second insulation layer 150. The first lower electrodes 184 may have a cross-section of an "L" shape, and thus a lower portion of the eleventh insulation layer 222 adjacent to the first lower electrodes 184 may be crooked.

The eleventh insulation layer 222 may be formed to include a nitride, e.g., silicon nitride.

Figure 56:
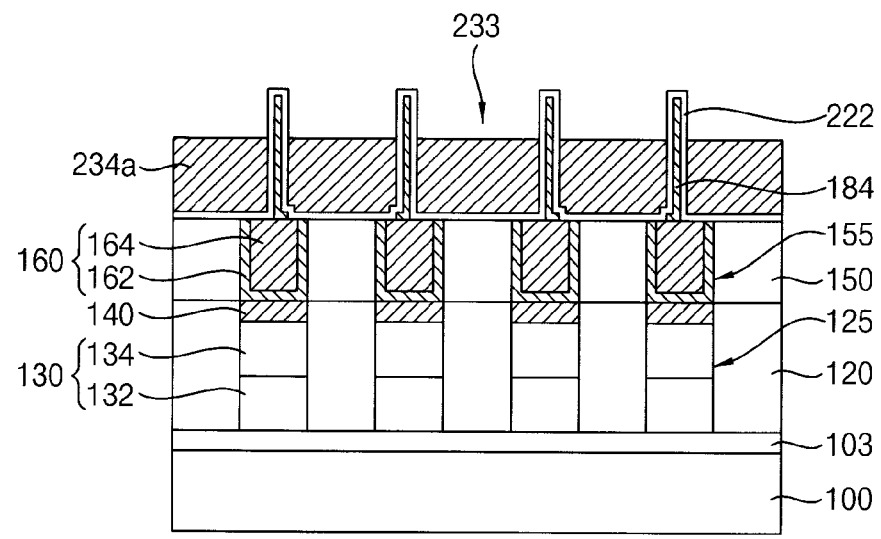
Figure 57:
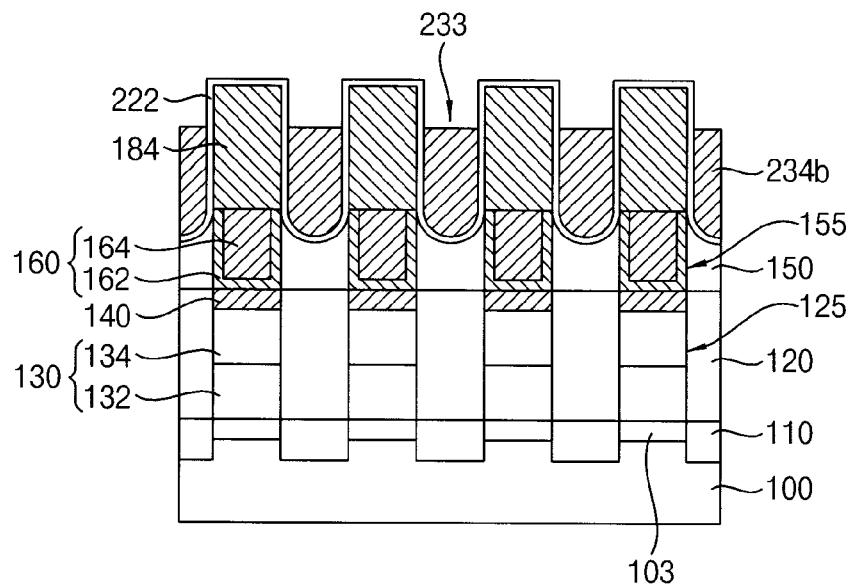

Referring to FIGS. 56 and 57, processes substantially the same as or similar to those illustrated with reference to FIGS. 23 to 26 may be performed.

Thus, a third heat sink 234 may be formed adjacent to the first lower electrodes 184. In some embodiments, the third heat sink 234 may be formed to have a lattice shape surrounding sidewalls of the first lower electrodes 184 when viewed from a top side. That is, the third heat sink 234 may be formed to have a first extension portion 234a extending in the first direction and a second extension portion 234b extending in the second direction. The first and second extension portions 234a and 234b may cross each other.

A space formed by sidewalls of the eleventh insulation layer 222 on the first lower electrodes 184 and a top surface of the third heat sink 234 may be referred to as a fifth recess 233.

Figure 58:
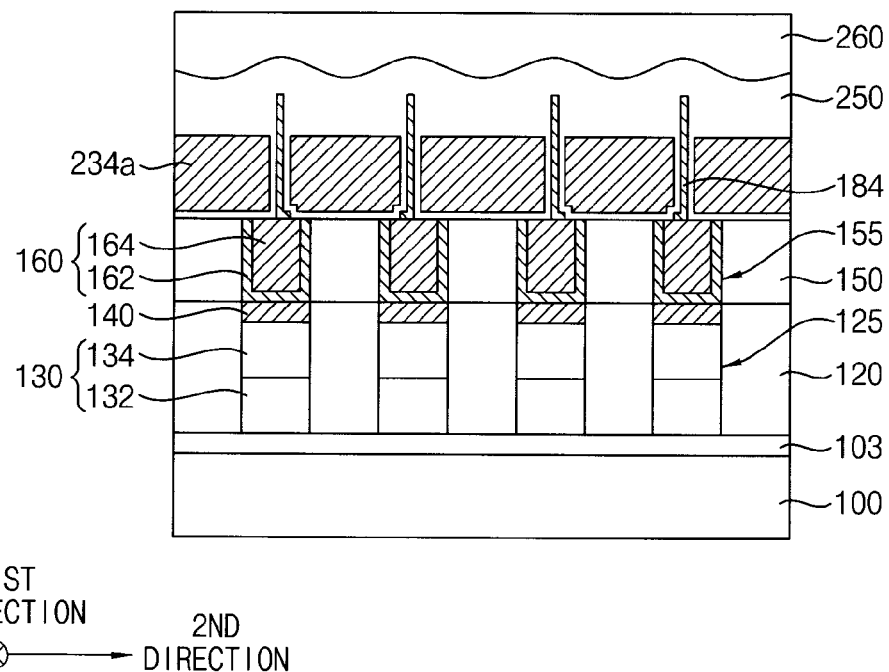
Figure 59:
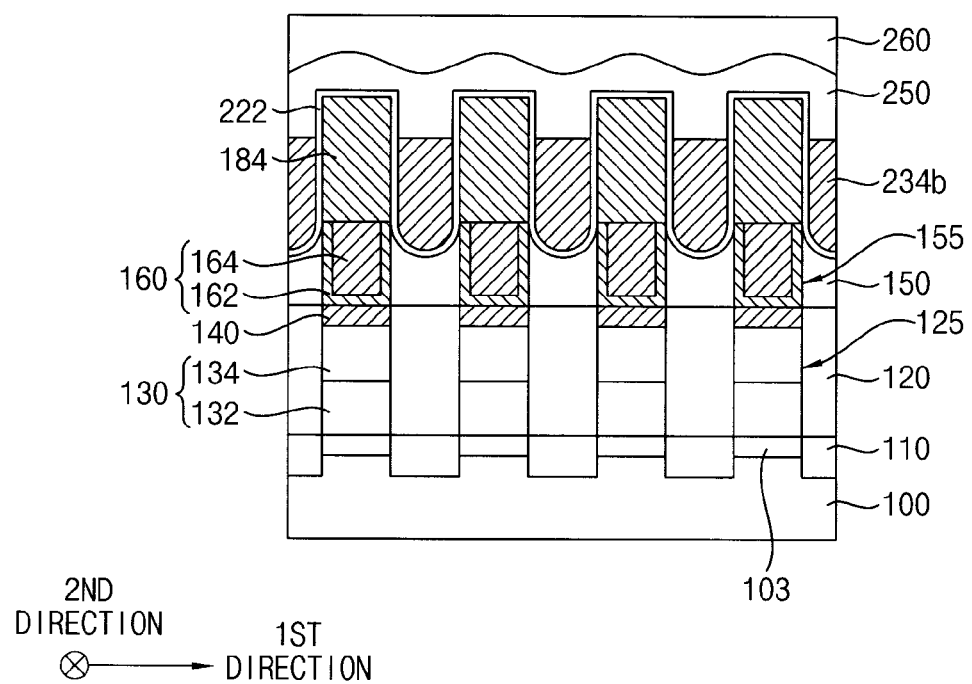

Referring to FIGS. 58 and 59, processes substantially the same as or similar to those illustrated with reference to FIGS. 27 to 28 may be performed.

That is, a sixth insulation layer 250 may be formed on the third heat sink 234 and the eleventh insulation layer 222 to sufficiently fill the fifth recess 233, and a seventh insulation layer 260 may be formed on the sixth insulation layer 250.

Referring to FIGS. 48 to 51 again, processes substantially the same as or similar to those illustrated with reference to FIGS. 29 to 34 and 1 to 3 may be performed to manufacture the phase change memory device.

Figure 60:
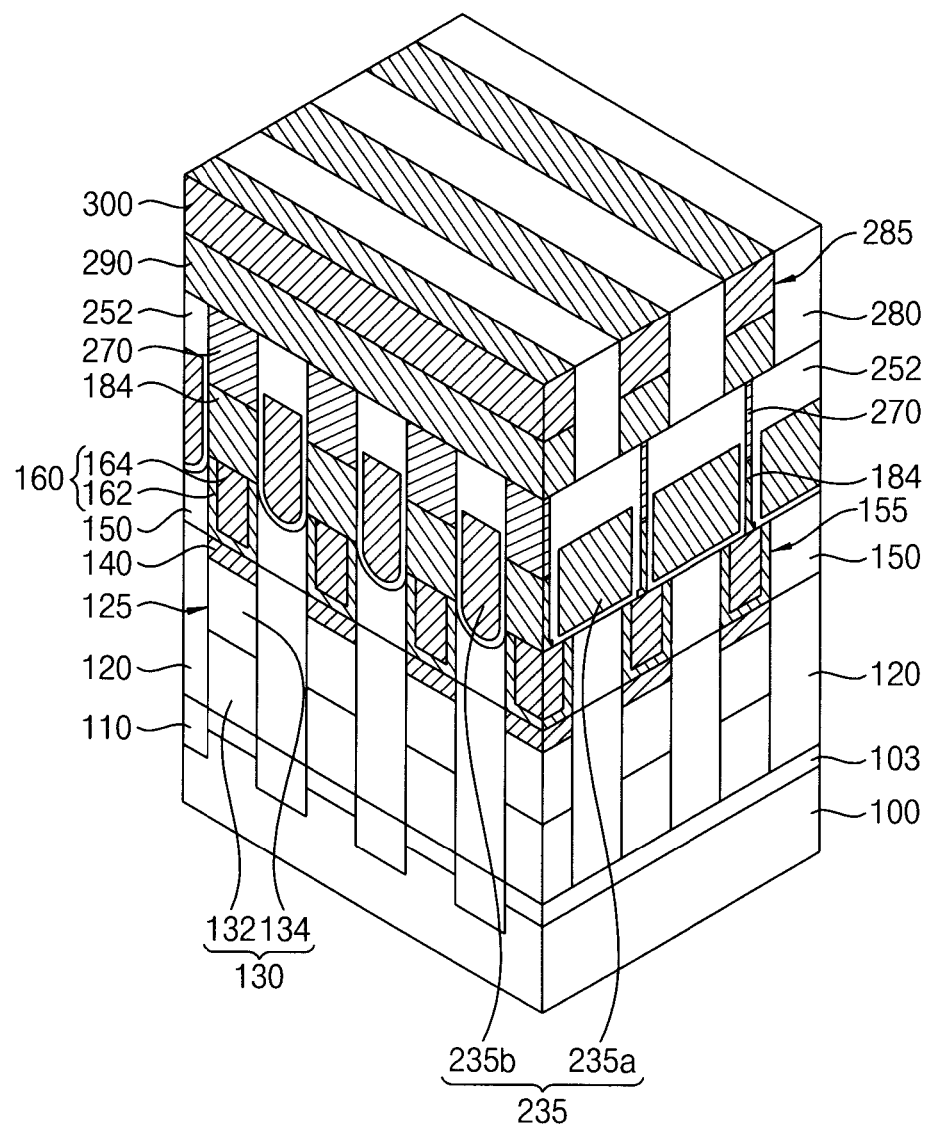
FIG. 60 is a perspective view illustrating a phase change memory device in accordance with some embodiments.
Figure 61:
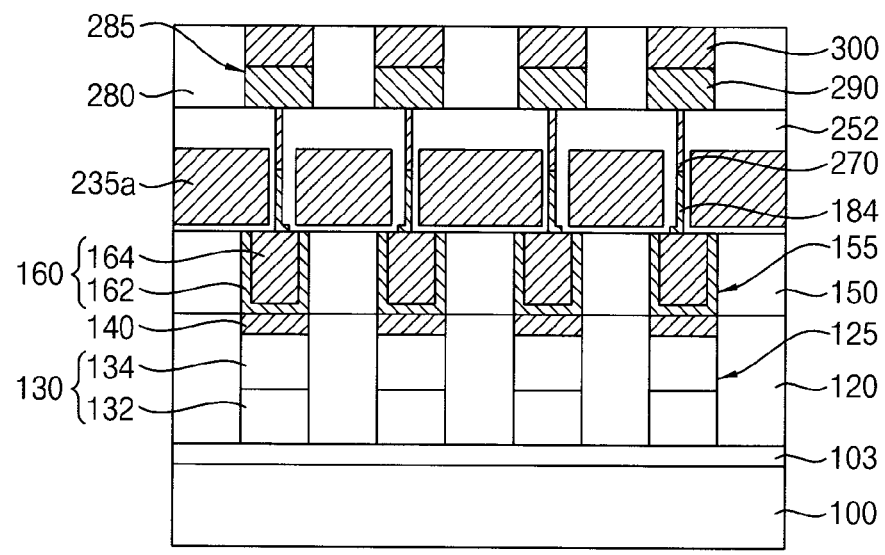
FIGS. 61 and 62 are cross-sectional views illustrating the phase change memory device of FIG. 60.
Figure 62:
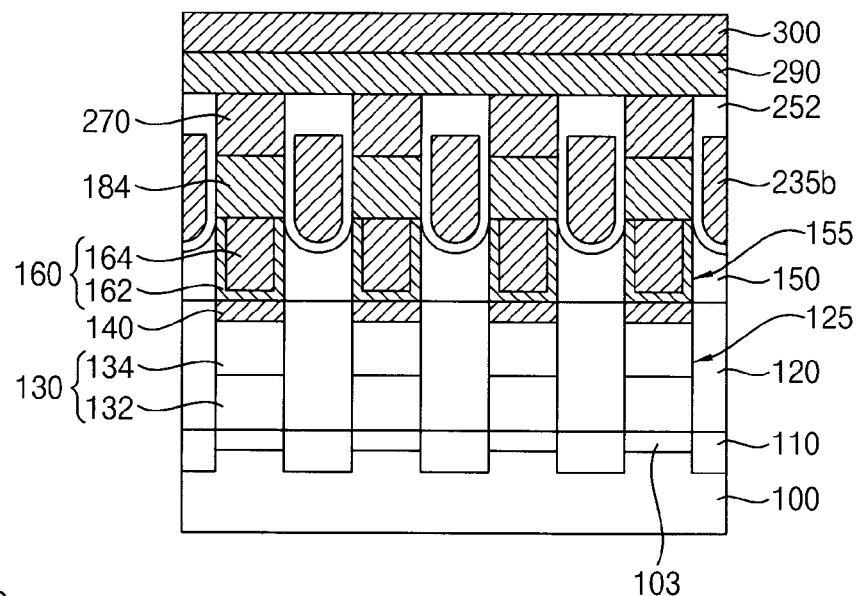

FIG. 60 is a perspective view illustrating a phase change memory device in accordance with some embodiments, and FIGS. 61 and 62 are cross-sectional views illustrating the phase change memory device of FIG. 60. FIG. 61 is a cross-sectional view taken along the second direction, and FIG. 62 is a cross-sectional view taken along the first direction. The phase change memory device may be substantially the same as that illustrated with reference to FIGS. 48 to 51 except for the shape of the heat sink, and thus like reference numerals refer to like elements and detailed descriptions thereon are omitted herein.

Referring to FIGS. 60 to 62, the phase change memory device may include a first lower electrode 184, a first phase change material layer pattern 270, a fourth heat sink 235, a first upper electrode 290 and a first bit line 300.

The fourth heat sink 235 may have a shape similar to that of the third heat sink 234. In some embodiments, the fourth heat sink 235 may have a lattice shape surrounding sidewalls of the first lower electrodes 184 or the first phase change material layer patterns 270 when viewed from a top side. That is, the fourth heat sink 235 may have a third extension portion 235a extending in the first direction and a fourth extension portion 235b extending in the second direction. The third and fourth extension portions 235a and 235b may cross each other.

However, the third extension portion 235a may have a second width along the second direction smaller than that of the first extension portion 234a of the third heat sink 234. Additionally, a lower portion of the third extension portion 235a of the fourth heat sink 235 may not be crooked unlike the lower portion of the first extension portion 234a of the third heat sink 234.

Figure 63:
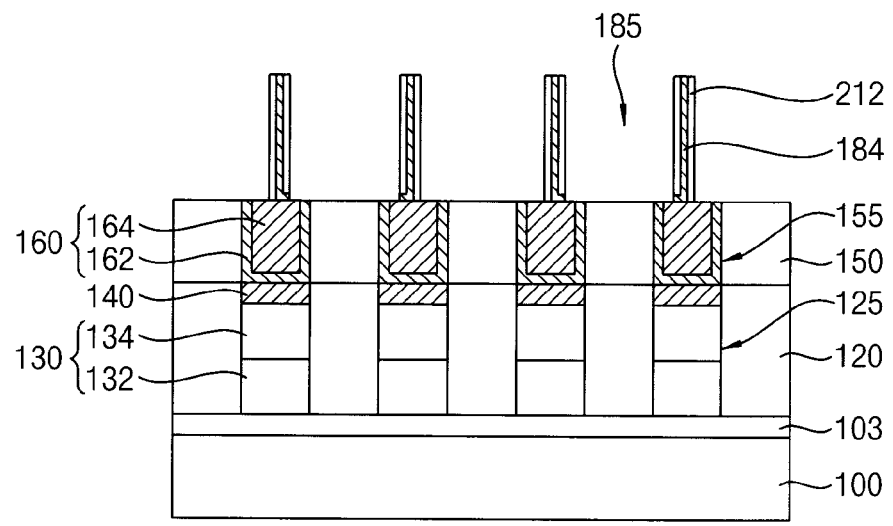
FIGS. 63 to 66 are cross-sectional views illustrating a method of manufacturing a phase change memory device in accordance with some embodiments.
Figure 64:
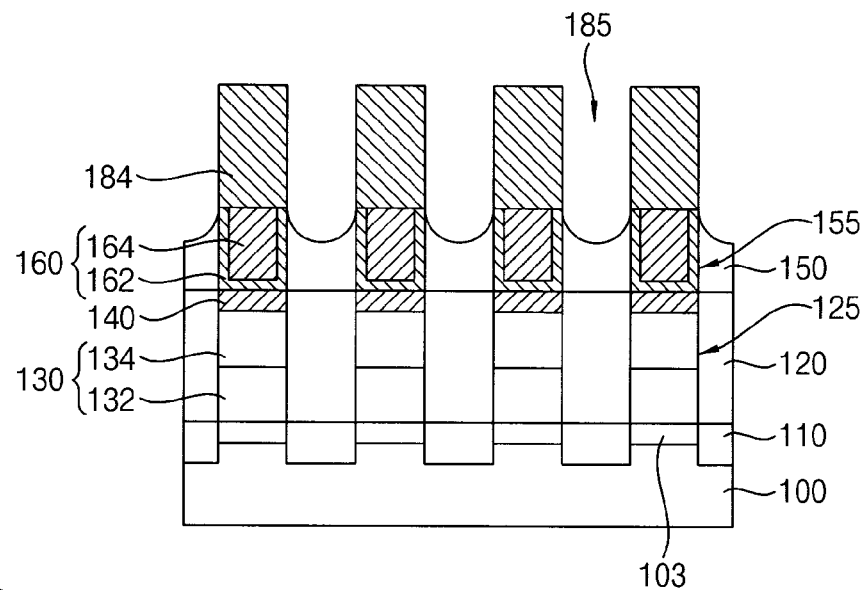
Figure 65:
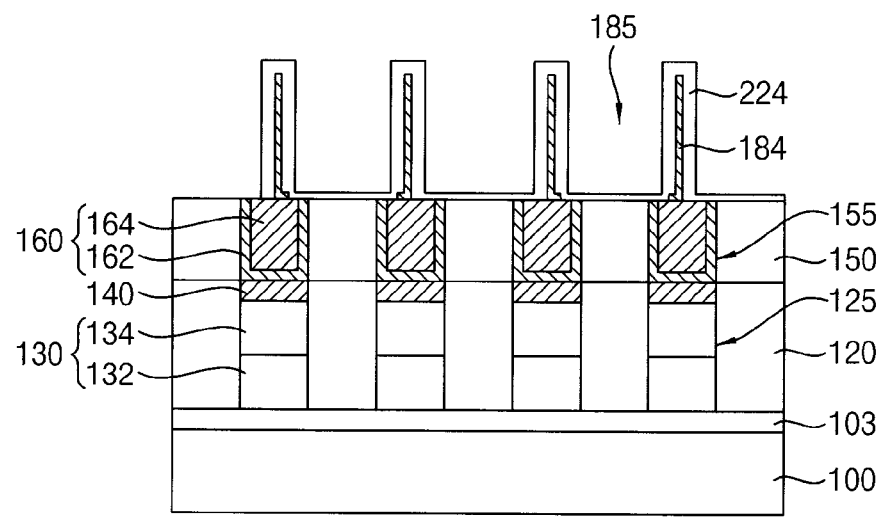
Figure 66:
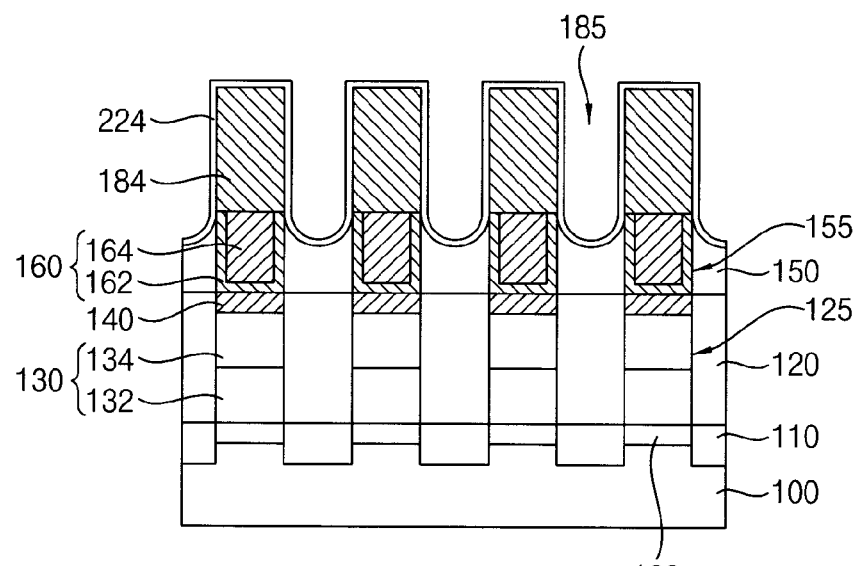

FIGS. 63 to 66 are cross-sectional views illustrating a method of manufacturing a phase change memory device in accordance with some embodiments. FIGS. 63 and 65 are cross-sectional views taken along the second direction, and FIGS. 64 and 66 are cross-sectional views taken along the first direction. This method may be used in manufacturing the phase change memory device of FIGS. 60 to 62, however, may not be limited thereto. This method may include processes substantially the same as or similar to those illustrated with reference to FIGS. 5 to 34 and 1 to 3 or those illustrated with reference to FIGS. 52 to 59 and 48 to 51, and thus like reference numerals refer to like elements and detailed descriptions thereon are omitted herein.

First, processes substantially the same as or similar to those illustrated with reference to FIGS. 5 to 20 may be performed.

Referring now to FIGS. 63 and 64, the fourth insulation layer 210 between adjacent first lower electrodes 184 along the second direction may be partially removed to form a sixth recess 185 exposing a top surface of the second insulation layer 150 and portions of top surfaces of the plugs 160. A portion of the fourth insulation layer 210 may remain on sidewalls of the first lower electrodes 184, and may be referred to as a fourth insulation layer pattern 212. In FIGS. 63 and 64, the fourth insulation layer pattern 212 does not cover lower sidewalls of the first lower electrodes 184, however, the fourth insulation layer pattern 212 may be formed to have a thickness to cover the lower sidewalls of the first lower electrodes 184.

In some embodiments, the sixth recess 185 may be formed by a dry etching process.

The sixth recess 185 like the fourth recess 183 may be in fluid communication with the plurality of third recesses 181 arranged in the first direction each of which may extend in the second direction, and hereinafter, the fourth and sixth recesses 183 and 185 in fluid communication with each other may be referred to simply as a sixth recess 185. That is, the sixth recess 185 may be a space defined by the first lower electrode array and the fourth insulation layer pattern 212 surrounding the first lower electrode array, and the exposed top surfaces of the second insulation layer 150 and the plug 160, which may have a lattice shape when viewed from a top side.

Referring to FIGS. 65 and 66, a twelfth insulation layer 224 may be formed on the exposed lower sidewalls of the first lower electrodes 184, the top surfaces of the plugs 160 and the second insulation layer 150, and the fourth insulation layer pattern 212.

The twelfth insulation layer 224 may be formed to include a nitride, e.g., silicon nitride, and may be formed to include a material substantially the same as that of the fourth insulation layer pattern 212. Thus, the fourth and twelfth insulation layer patterns 212 and 224 may be merged into each other, and hereinafter, the merged layer may be referred to simply as a twelfth insulation layer 224.

Referring to FIGS. 60 to 62 again, processes substantially the same as or similar to those illustrated with reference to FIGS. 56 to 59 and 48 to 51 may be performed to manufacture the phase change memory device.

Thus, a fourth heat sink 235 may be formed adjacent to the first lower electrodes 184. In some embodiments, the fourth heat sink 235 may have a lattice shape surrounding sidewalls of the first lower electrodes 184 or the first phase change material layer patterns 270 when viewed from a top side. That is, the fourth heat sink 235 may have a third extension portion 235a extending in the first direction and a fourth extension portion 235b extending in the second direction. The third and fourth extension portions 235a and 235b may cross each other. Unlike the first extension portion 234a of the third heat sink 234, the third extension portion 235a of the fourth heat sink 235 may not be crooked at a portion adjacent to the lower portion of the first lower electrodes 184.

In the method of manufacturing the phase change memory device illustrated with reference to FIGS. 60 to 66, the fourth insulation layer 210 may be removed by a dry etching process, while in the method of manufacturing the phase change memory device illustrated with reference to FIGS. 48 to 59, the fourth insulation layer 210 may be removed by a wet etching process. Those skilled in the art may easily understand both of the dry and wet etching processes may be used for removing the fourth insulation layer 210 to realize the inventive concept of the present invention. Hereinafter, only the method of manufacturing the phase change memory device in which the wet etching process is used will be illustrated.

Figure 67:
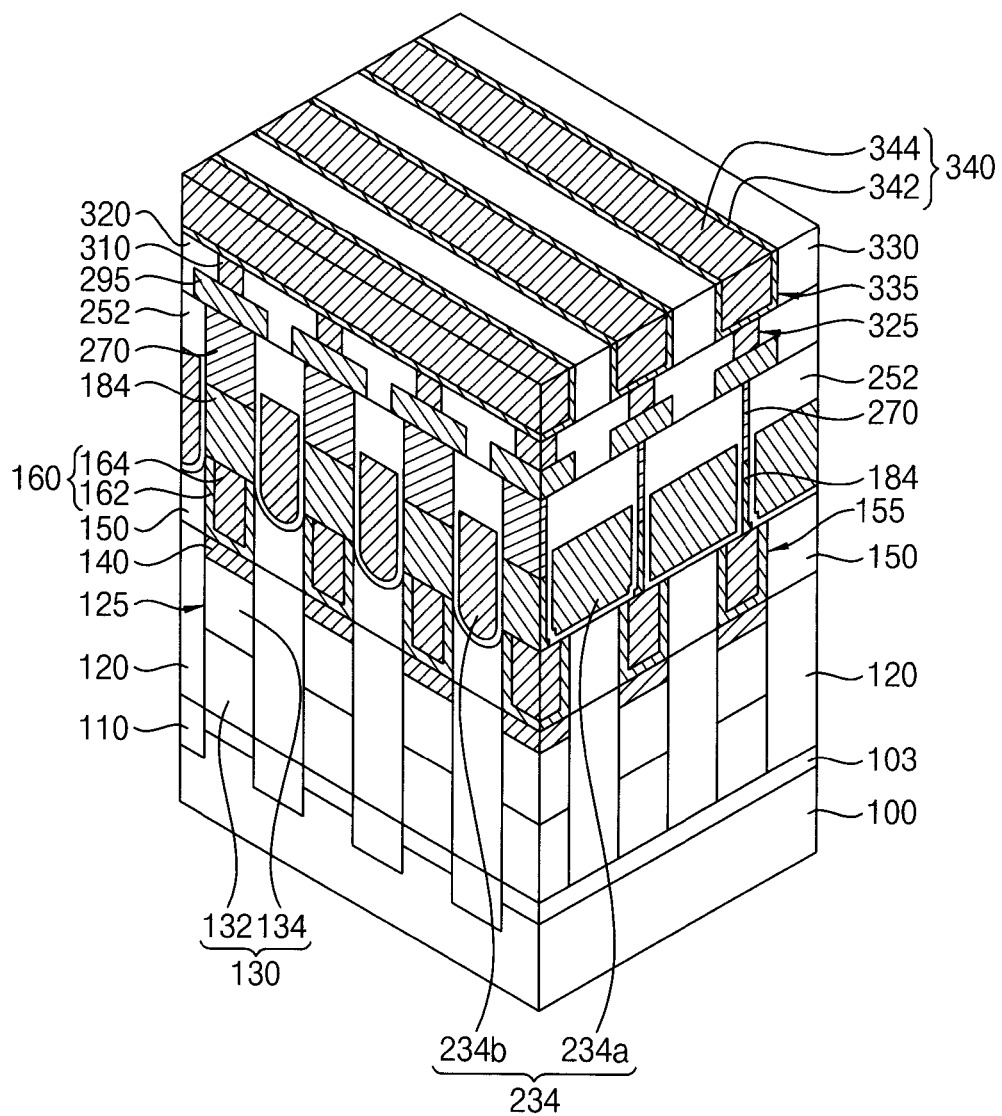
FIG. 67 is a perspective view illustrating a phase change memory device in accordance with some embodiments.
Figure 68:
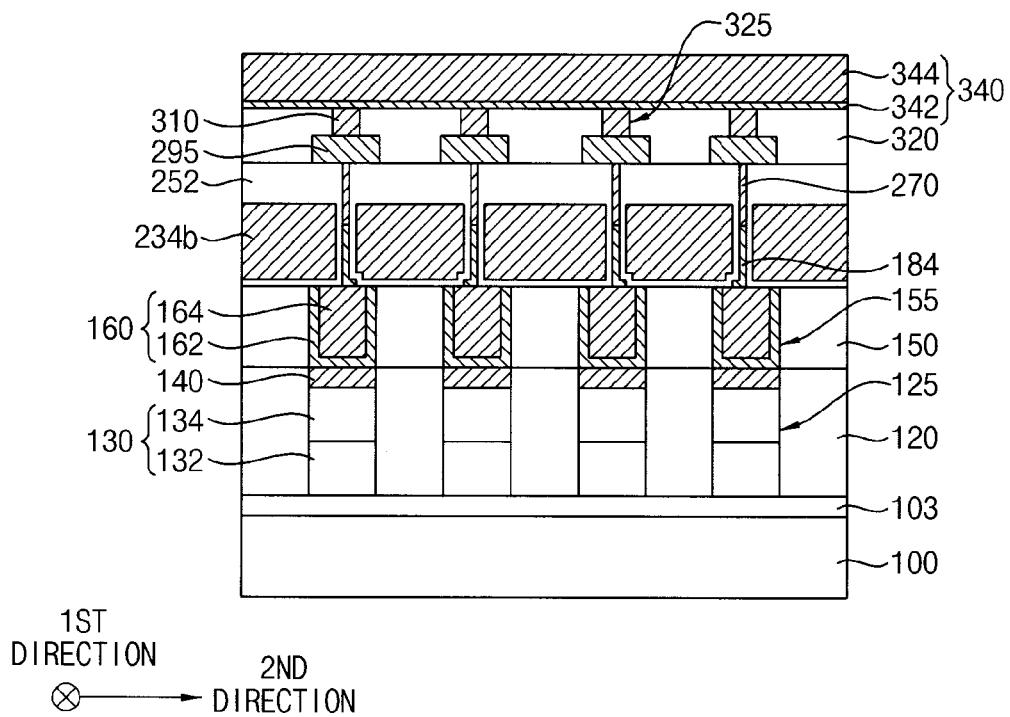
FIGS. 68 and 69 are cross-sectional views illustrating the phase change memory device of FIG. 67.
Figure 69:
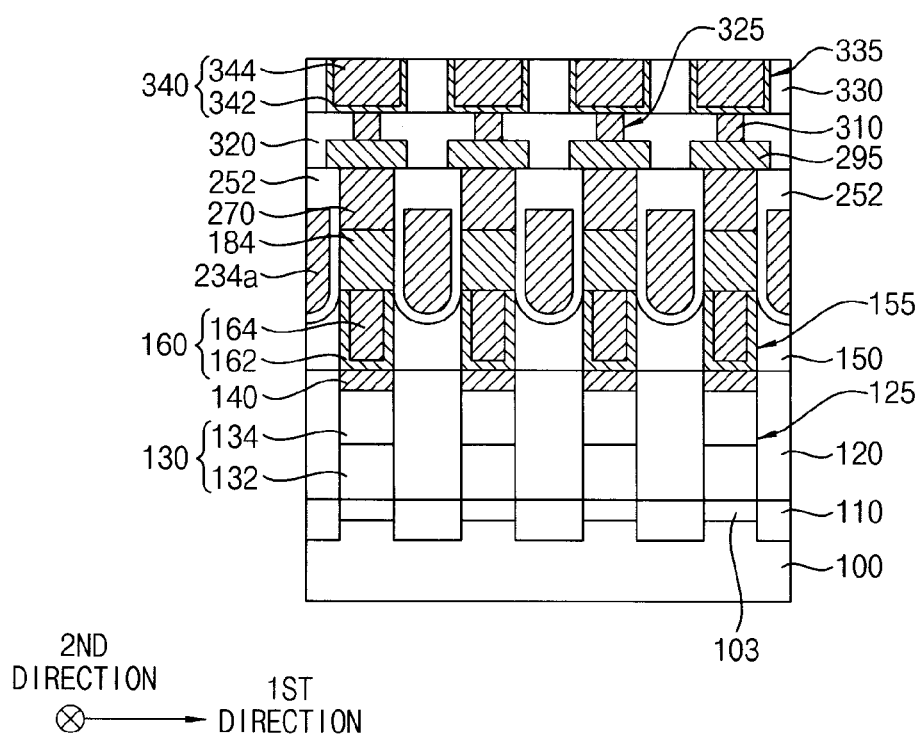

FIG. 67 is a perspective view illustrating a phase change memory device in accordance with some embodiments, and FIGS. 68 and 69 are cross-sectional views illustrating the phase change memory device of FIG. 67. FIG. 68 is a cross-sectional view taken along the second direction, and FIG. 69 is a cross-sectional view taken along the first direction. The phase change memory device may be substantially the same as that illustrated with reference to FIGS. 48 to 51 except for the upper electrode and the bit line. Additionally, the upper electrode and the bit line may be substantially the same as or similar to those of the phase change memory device illustrated with reference to FIGS. 35 to 37. Thus, like reference numerals refer to like elements and detailed descriptions thereon are omitted herein.

Referring to FIGS. 67 to 69, the phase change memory device may include a first lower electrode 184, a first phase change material layer pattern 270, a third heat sink 234, a second upper electrode 295 and a second bit line 340.

Figure 70:
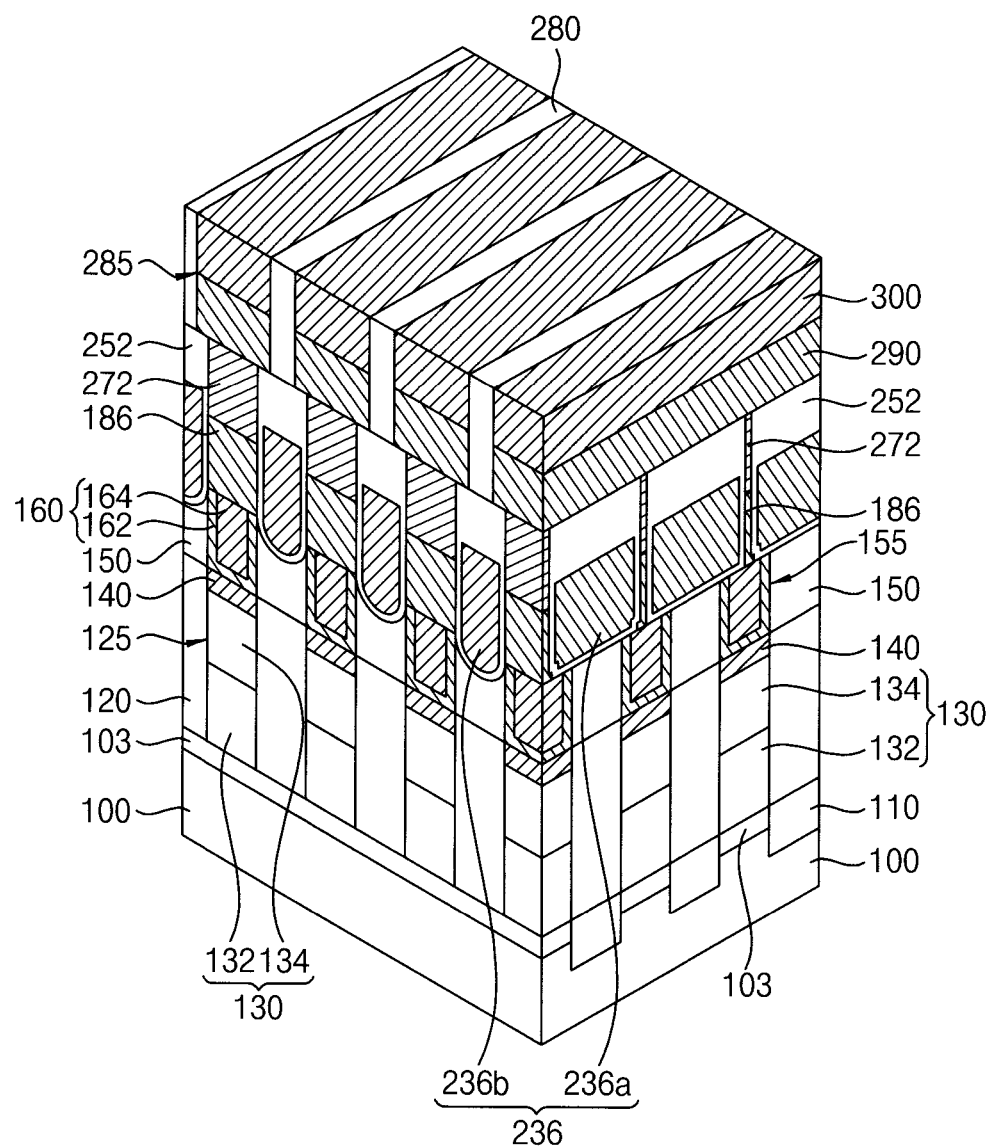
FIG. 70 is a perspective view illustrating a phase change memory device in accordance with some embodiments.
Figure 71:
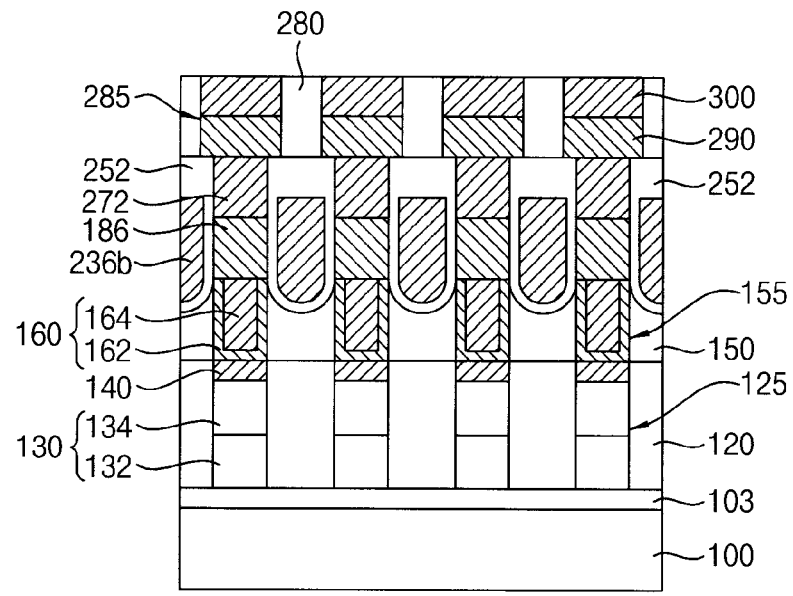
FIGS. 71 and 72 are cross-sectional views illustrating the phase change memory device of FIG. 70.
Figure 72:
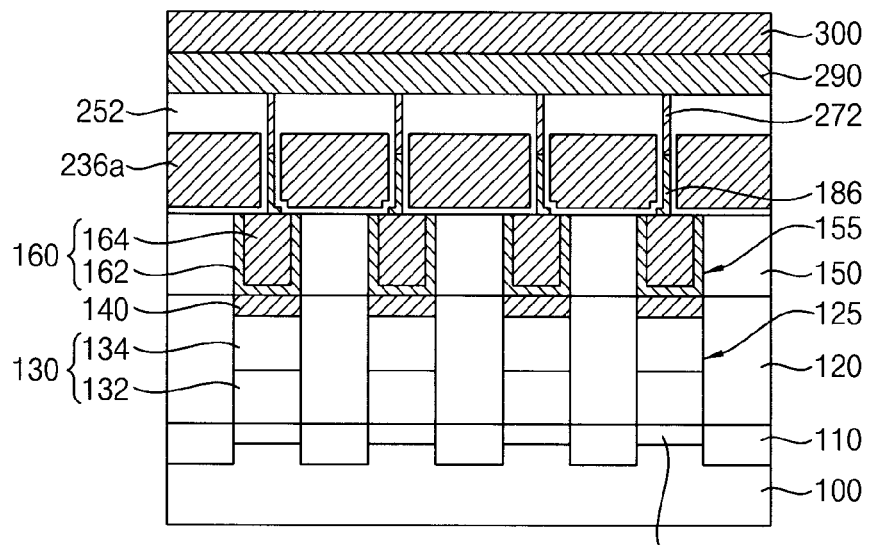

FIG. 70 is a perspective view illustrating a phase change memory device in accordance with some embodiments, and FIGS. 71 and 72 are cross-sectional views illustrating the phase change memory device of FIG. 70. FIG. 71 is a cross-sectional view taken along the second direction, and FIG. 72 is a cross-sectional view taken along the first direction. The phase change memory device may be substantially the same as that illustrated with reference to FIGS. 48 to 51 except for the location and direction of the lower electrode, the phase change material layer pattern and the heat sink. Additionally, the location and direction of the upper electrode and the phase change material layer pattern may be substantially the same as or similar to those of the phase change memory device illustrated with reference to FIGS. 42 to 44. Thus, like reference numerals refer to like elements and detailed descriptions thereon are omitted herein.

Referring to FIGS. 70 to 72, the phase change memory device may include a second lower electrode 186, a second phase change material layer pattern 272, a fifth heat sink 236, a first upper electrode 290 and a first bit line 300.

The fifth heat sink 236 may have a similar shape as that of the third heat sink 234, however, the direction thereof may be different from that of the third heat sink 234.

In some embodiments, the fifth heat sink 236 may have a lattice shape surrounding sidewalls of the second lower electrodes 186 or the second phase change material layer patterns 272. The fifth heat sink 236 may have a fifth extension portion 236a extending in the second direction and a sixth extension portion 236b extending in the first direction. The fifth and sixth extension portions 236a and 236b may cross each other.

That is, the fifth and sixth extension portions 236a and 236b of the fifth heat sink 236 may have shapes similar to those of the first and second extension portions 234a and 234b of the third heat sink 234, respectively, however, the extension directions may not be the same but substantially perpendicular thereto. Thus, while the first extension portion 234a may extend in the direction in which the first bit line 300 may extend and the second extension portion 234b may extend in the direction in which the word line 103 may extend, the fifth extension portion 236a may extend in the direction in which the word line 103 may extend and the sixth extension portion 236b may extend in the direction in which the first bit line 300 may extend.

Figure 73:
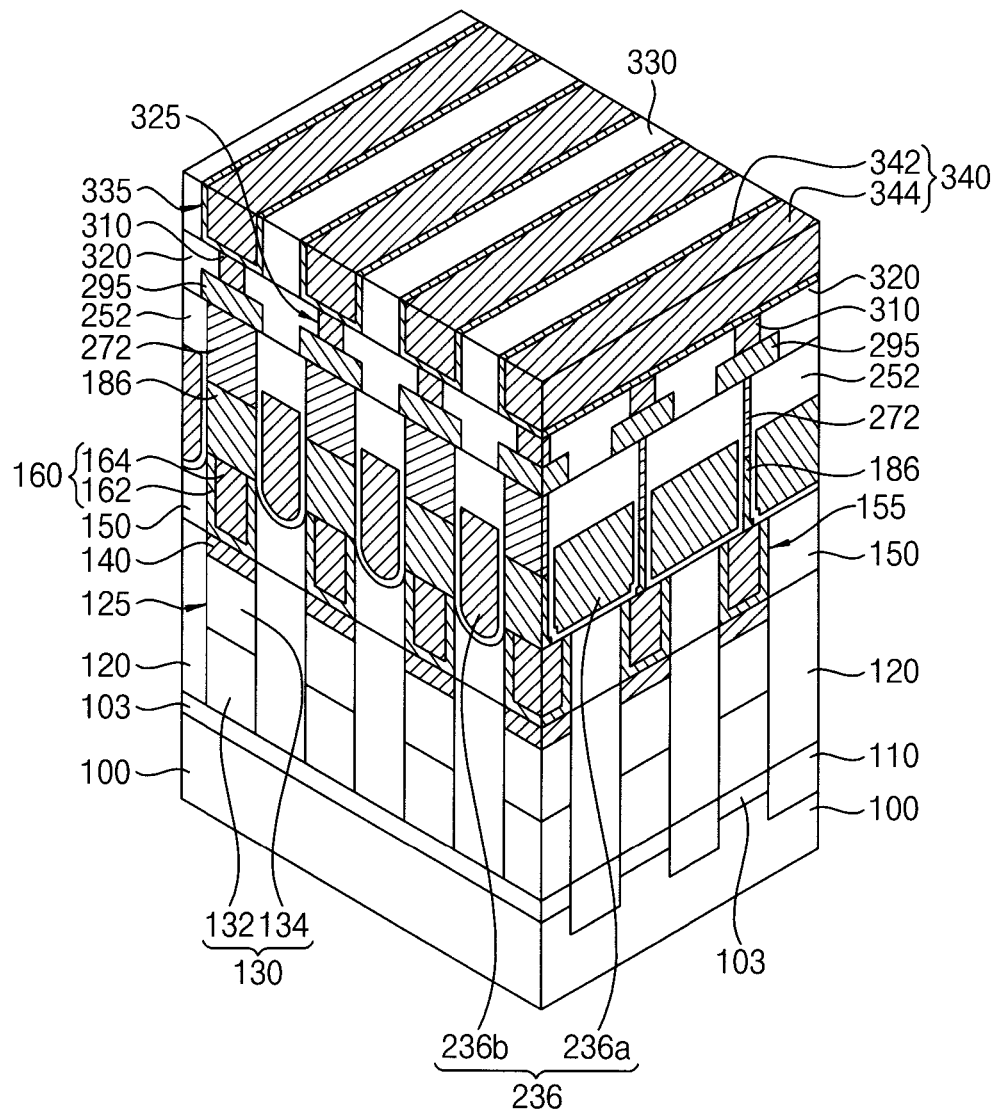
FIG. 73 is a perspective view illustrating a phase change memory device in accordance with some embodiments.
Figure 74:
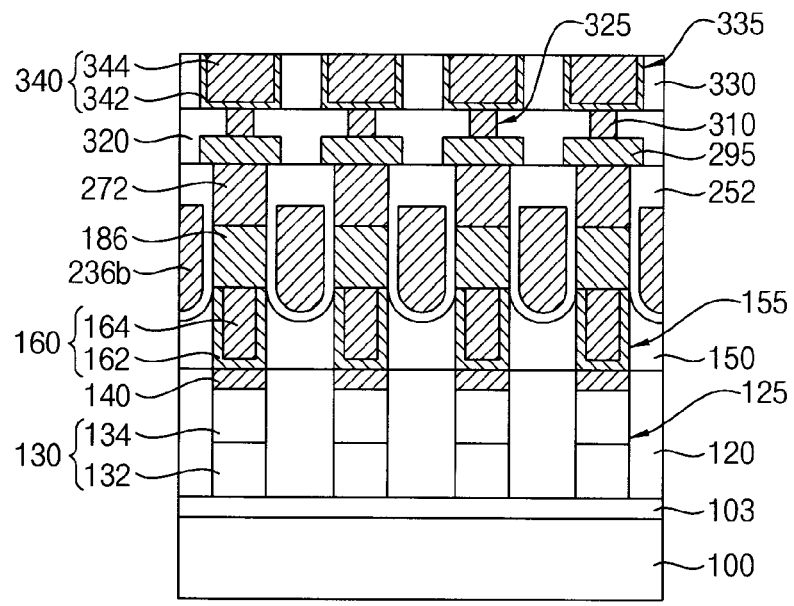
FIGS. 74 and 75 are cross-sectional views illustrating the phase change memory device of FIG. 73.
Figure 75:
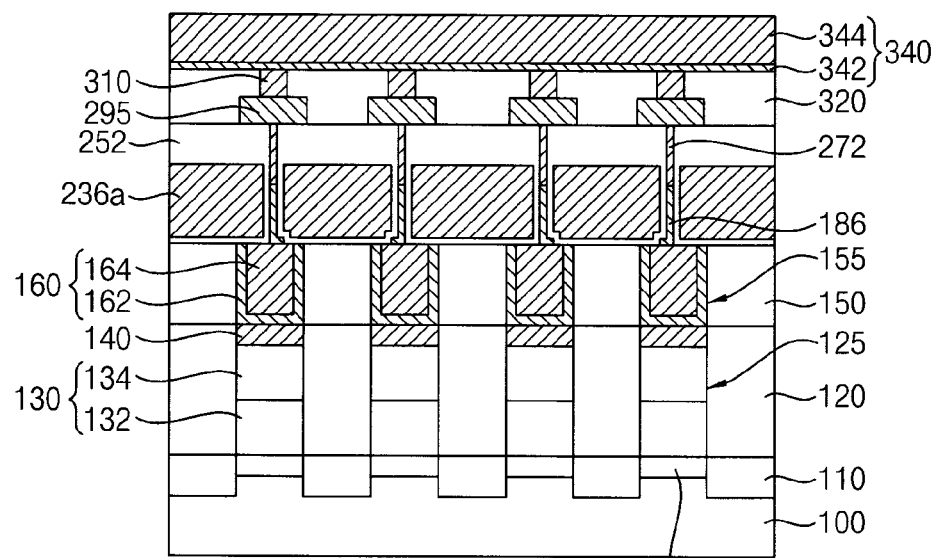

FIG. 73 is a perspective view illustrating a phase change memory device in accordance with some embodiments, and FIGS. 74 and 75 are cross-sectional views illustrating the phase change memory device of FIG. 73. FIG. 74 is a cross-sectional view taken along the second direction, and FIG. 75 is a cross-sectional view taken along the first direction. The phase change memory device may be substantially the same as that illustrated with reference to FIGS. 67 to 69 except for the location and direction of the lower electrode, the phase change material layer pattern and the heat sink. Additionally, in the phase change memory device, the location and the direction of the lower electrode, the phase change material layer pattern and the heat sink may be substantially the same as those of the phase change memory device illustrated with reference to FIGS. 70 to 72. Thus, like reference numerals refer to like elements and detailed descriptions thereon are omitted herein.

Referring to FIGS. 73 to 75, the phase change memory device may include a second lower electrode 186, a second phase change material layer pattern 272, a fifth heat sink 236, a second upper electrode 295 and a second bit line 340.

Figure 76:
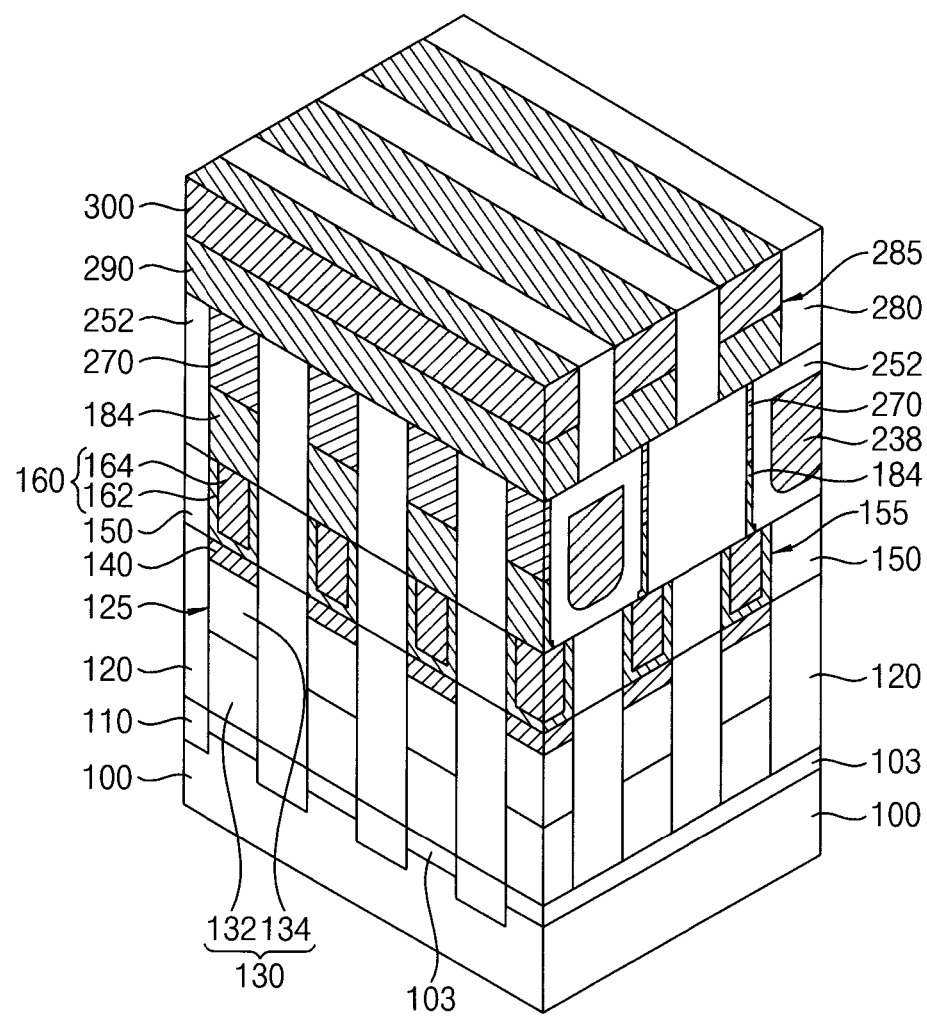
FIG. 76 is a perspective view illustrating a phase change memory device in accordance with some embodiments.
Figure 77:
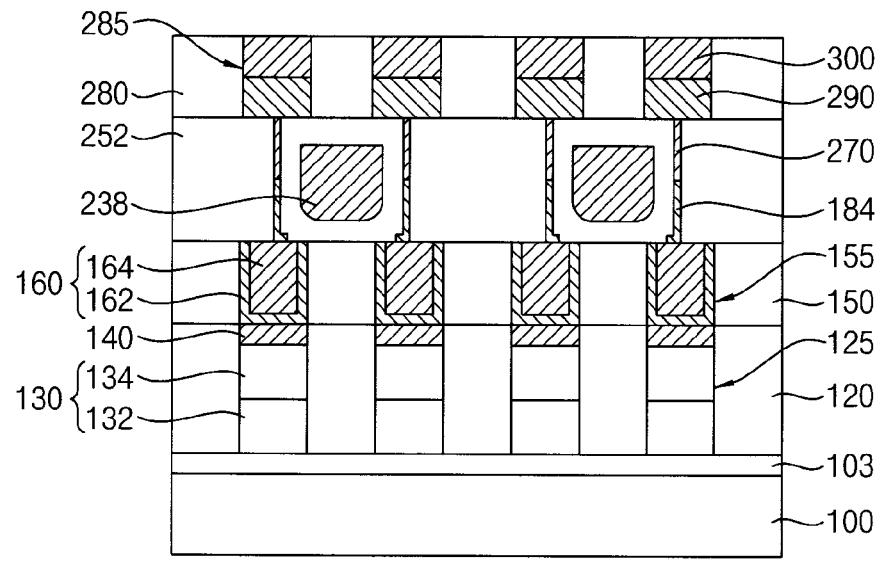
FIGS. 77 and 78 are cross-sectional views illustrating the phase change memory device of FIG. 76.
Figure 78:
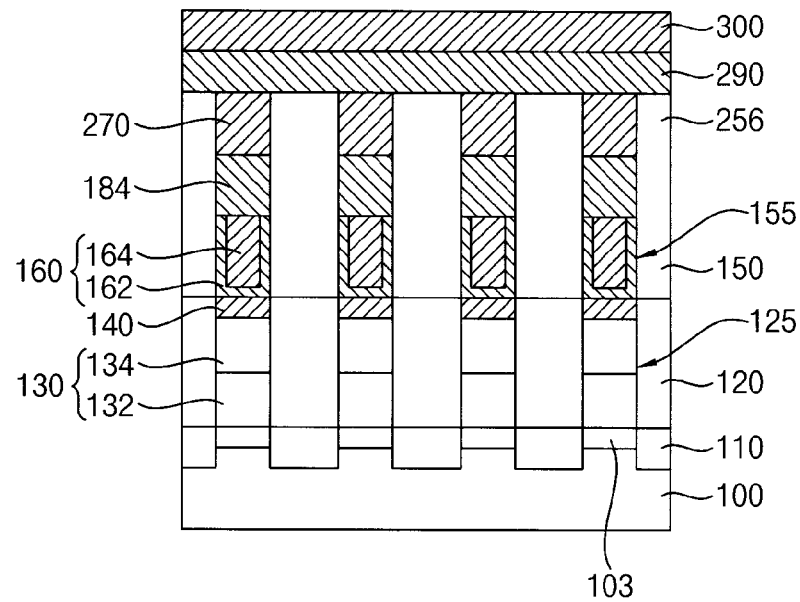
Figure 79:
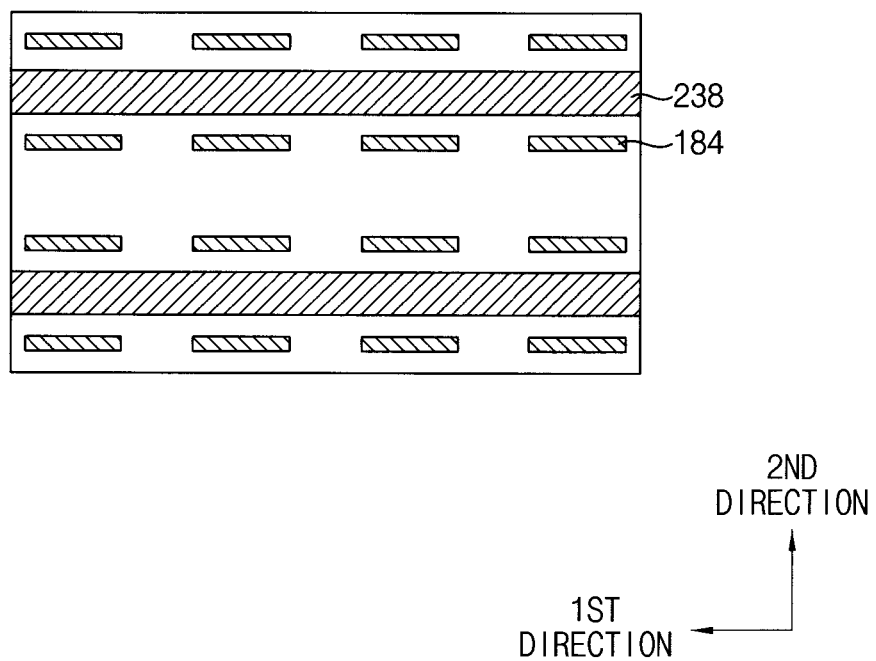
FIG. 79 is a plan view illustrating the positional relationship between lower electrodes and heat sinks of the phase change memory device.

FIG. 76 is a perspective view illustrating a phase change memory device in accordance with some embodiments, FIGS. 77 and 78 are cross-sectional views illustrating the phase change memory device of FIG. 76, and FIG. 79 is a plan view illustrating the positional relationship between lower electrodes and heat sinks of the phase change memory device. FIG. 77 is a cross-sectional view taken along the second direction, and FIG. 78 is a cross-sectional view taken along the first direction. The phase change memory device may be substantially the same as that illustrated with reference to FIGS. 1 to 4 except for the heat sink. Thus, like reference numerals refer to like elements and detailed descriptions thereon are omitted herein.

Referring to FIGS. 76 to 79, the phase change memory device may include a first lower electrode 184, a first phase change material layer pattern 270, a sixth heat sink 238, a first upper electrode 290 and a first bit line 300.

Unlike the first heat sink 232, the sixth heat sink 238 may extend in the first direction, and a plurality of sixth heat sinks 238 may be formed in the second direction. That is, the first heat sink 232 may be formed between adjacent first lower electrodes 184 along the first direction that may be spaced apart from each other at a relatively short distance, however, the sixth heat sink 238 may be formed between adjacent first lower electrodes 184 along the second direction that may be spaced apart from each other at a relatively long distance.

In some embodiments, in the first lower electrode array, the first lower electrodes 184 in an odd numbered column along the second direction may have a cross-section of an "L" shape, while the first lower electrodes 184 in an even numbered column along the second direction may have a cross-section of a reverse "L" shape, e.g., a "J-like" shape.

The sixth heat sink 238 may be formed only between the first lower electrode 184 in the odd numbered column and the first lower electrode 184 in the even numbered column. That is, the sixth heat sink 238 may be formed between the first lower electrode 184 in the first column and the first lower electrode 184 in the second column, between the first lower electrode 184 in the third column and the first lower electrode 184 in the fourth column, between the first lower electrode 184 in the fifth column and the first lower electrode 184 in the sixth column, and the like.

FIGS. 80 to 87 are cross-sectional views illustrating a method of manufacturing a phase change memory device in accordance with some embodiments. FIGS. 80, 82, 84 and 86 are cross-sectional views taken along the second direction, and FIGS. 81, 83, 85 and 87 are cross-sectional views taken along the first direction. This method may be used in manufacturing the phase change memory device of FIGS. 76 to 79, however, may not be limited thereto. This method may include processes substantially the same as or similar to those illustrated with reference to FIGS. 5 to 34 and 1 to 3, and thus like reference numerals refer to like elements and detailed descriptions thereon are omitted herein.

First, processes substantially the same as or similar to those illustrated with reference to FIGS. 5 to 16 may be performed.

Figure 80:
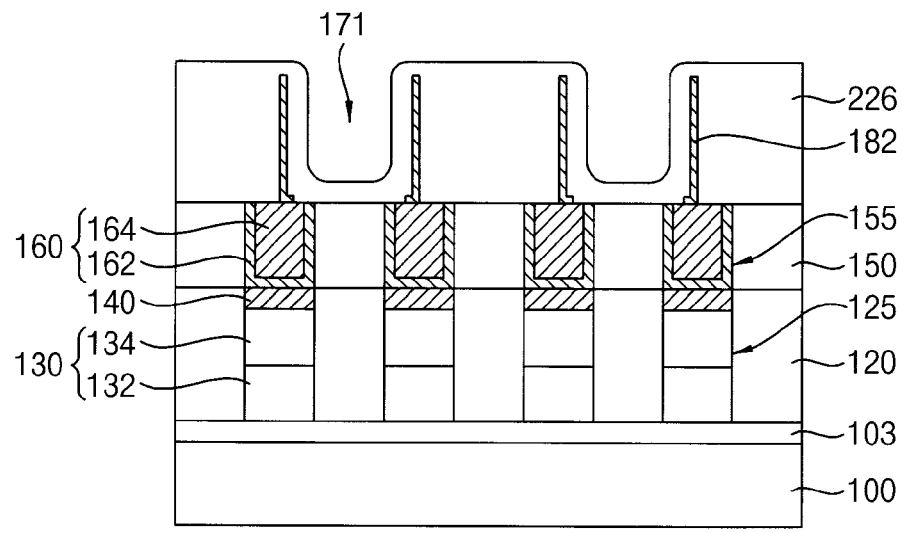
FIGS. 80 to 87 are cross-sectional views illustrating a method of manufacturing a phase change memory device in accordance with some embodiments.
Figure 81:
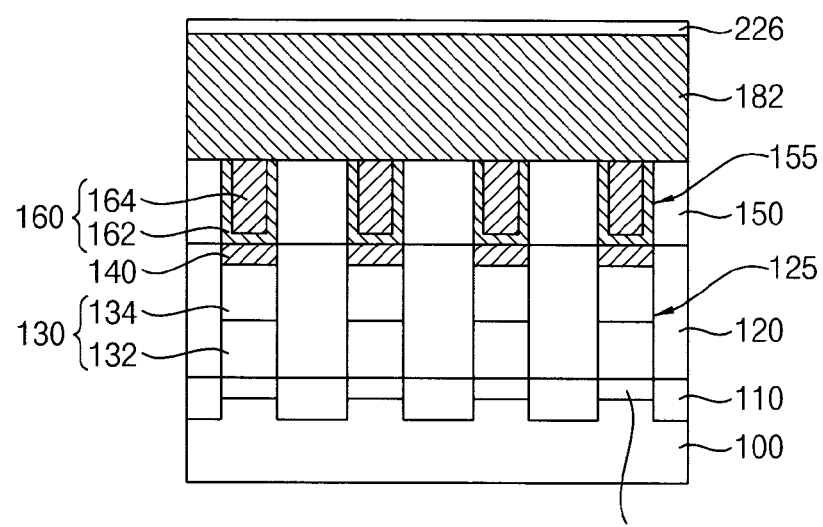

Referring now to FIGS. 80 and 81, a thirteenth insulation layer 226 may be formed on the first lower electrode layer pattern 182, the spacer 202, the second insulation layer 150, the plug 160 and the third insulation layer 170.

The thirteenth insulation layer 226 may be formed to include a nitride, e.g., silicon nitride. Thus, the spacer 202 and the thirteenth insulation layer 226 may be merged into each other, and hereinafter, the merged layer may be referred to simply as a thirteenth insulation layer 226.

Figure 82:
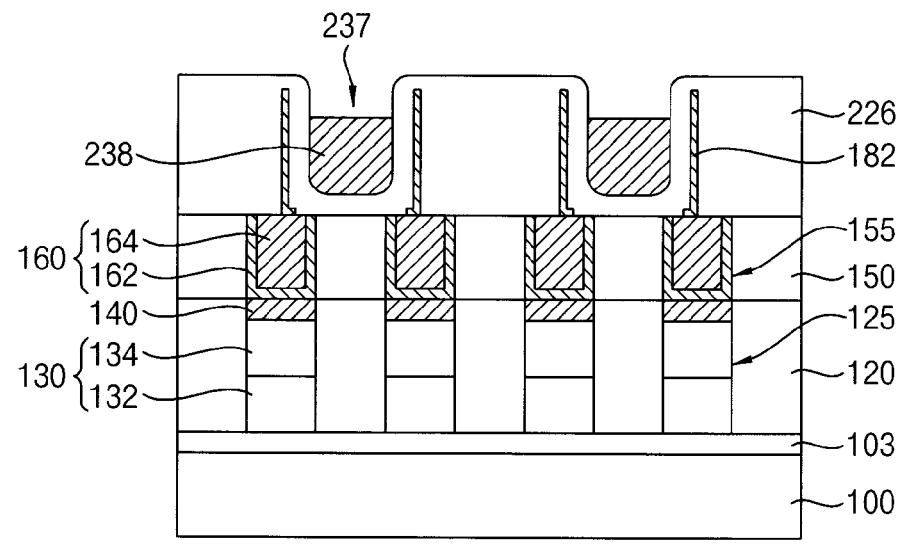
Figure 83:
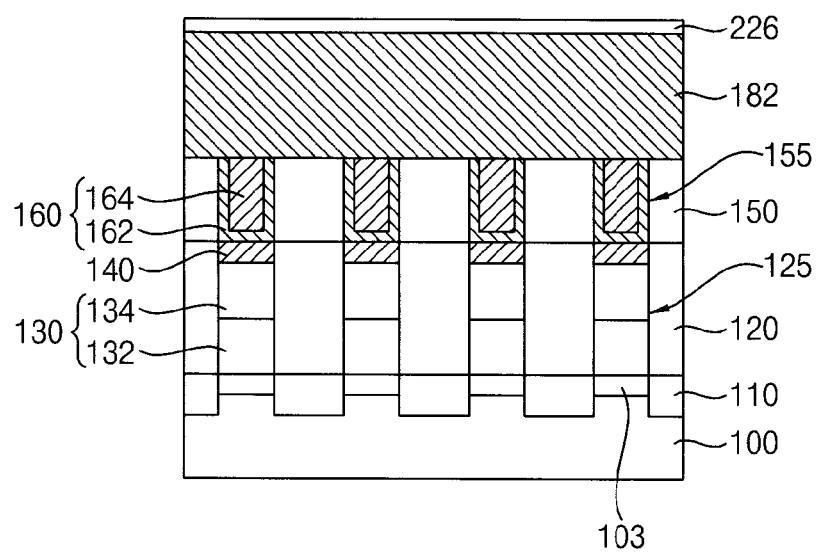

Referring to FIGS. 82 and 83, processes substantially the same as or similar to those illustrated with reference to FIGS. 23 to 26 may be performed.

That is, a heat sink layer 230 may be formed on the thirteenth insulation layer 226 to sufficiently fill the third opening 171, the heat sink layer 230 may be planarized until a top surface of the thirteenth insulation layer 226 may be exposed, and an upper portion of the heat sink layer 230 may be removed by a wet etching process. Thus, a sixth heat sink 238 may be formed, and a space formed by sidewalls of the thirteenth insulation layer 226 and a top surface of the sixth heat sink 238 may be defined as a seventh recess 237.

In some embodiments, the sixth heat sink 238 may extend in the first direction, and a plurality of sixth heat sinks 238 may be formed in the second direction. The sixth heat sink 238 may be formed only between the first lower electrode 184 in an odd numbered column along the second direction and the first lower electrode 184 in an even numbered column along the second direction. In some embodiments, the first lower electrodes 184 in the odd numbered column may have a cross-section of an "L" shape, while the first lower electrodes 184 in the even numbered column may have a cross-section of a reverse "L" shape, e.g., a "J-like" shape. Thus, the sixth heat sink 238 may be formed between the first lower electrode 184 having a cross-section of an "L" shape and the first lower electrode 184 having a cross-section of a "J-like" shape.

Figure 84:
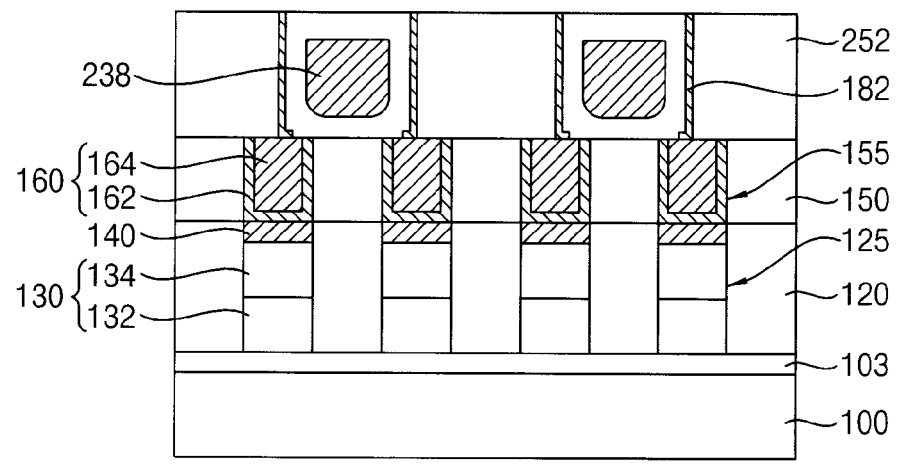
Figure 85:
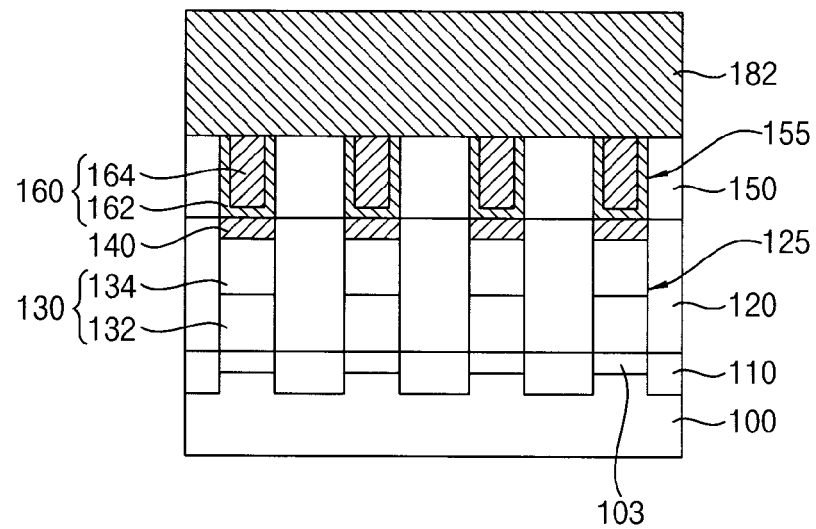

Referring to FIGS. 84 and 85, processes substantially the same as or similar to those illustrated with reference to FIGS. 27 to 29 may be performed.

Thus, the sixth heat sink 238 may be covered by the sixth insulation layer pattern 252, and a portion of the thirteenth insulation layer 226 on the first lower electrode layer pattern 182 may be removed.

Figure 86:
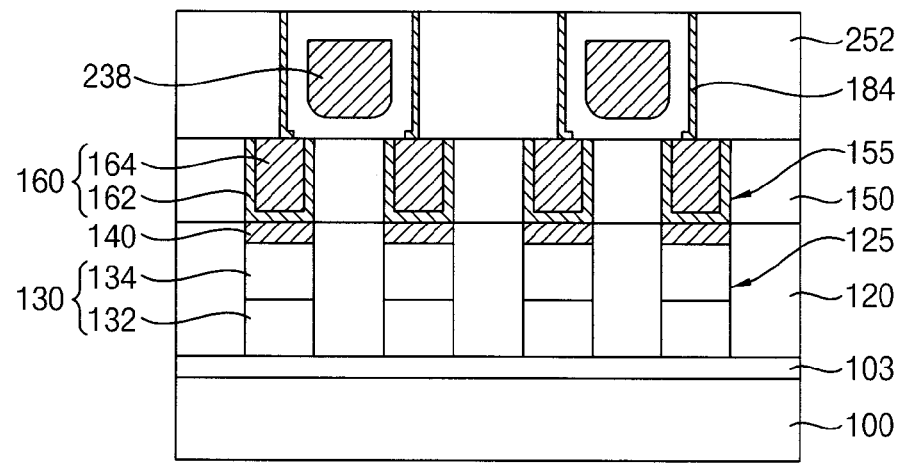
Figure 87:
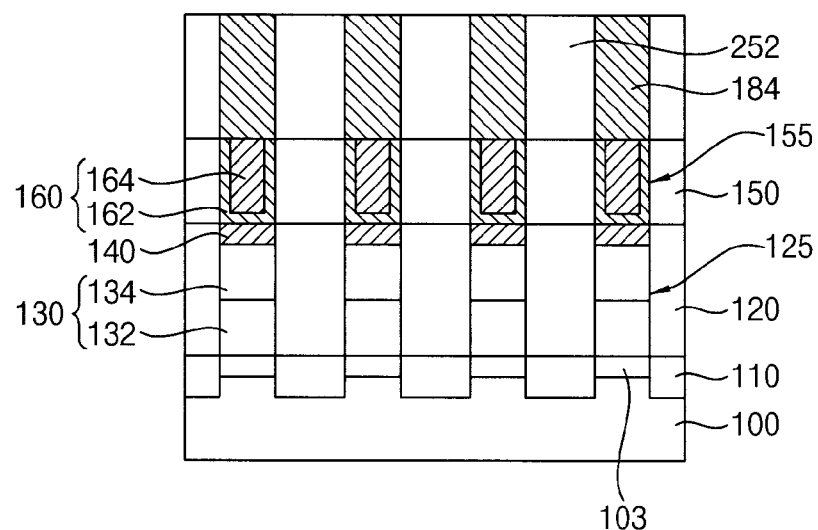

Referring to FIGS. 86 and 87, the first lower electrode layer pattern 182 may be partially removed by a dry etching process using a photoresist pattern (not shown) to form a plurality of first lower electrodes 184, and a space between the first lower electrodes 184 may be filled with an insulation layer. The insulation layer may be formed to include a nitride, e.g., silicon nitride, and thus may be merged into the sixth insulation layer pattern 252. Hereinafter, the merged layer may be referred to simply as a sixth insulation layer pattern 252.

Referring to FIGS. 76 to 79 again, processes substantially the same as or similar to those illustrated with reference to FIGS. 29 to 34 and 1 to 3 may be performed to manufacture the phase change memory device.

Figure 88:
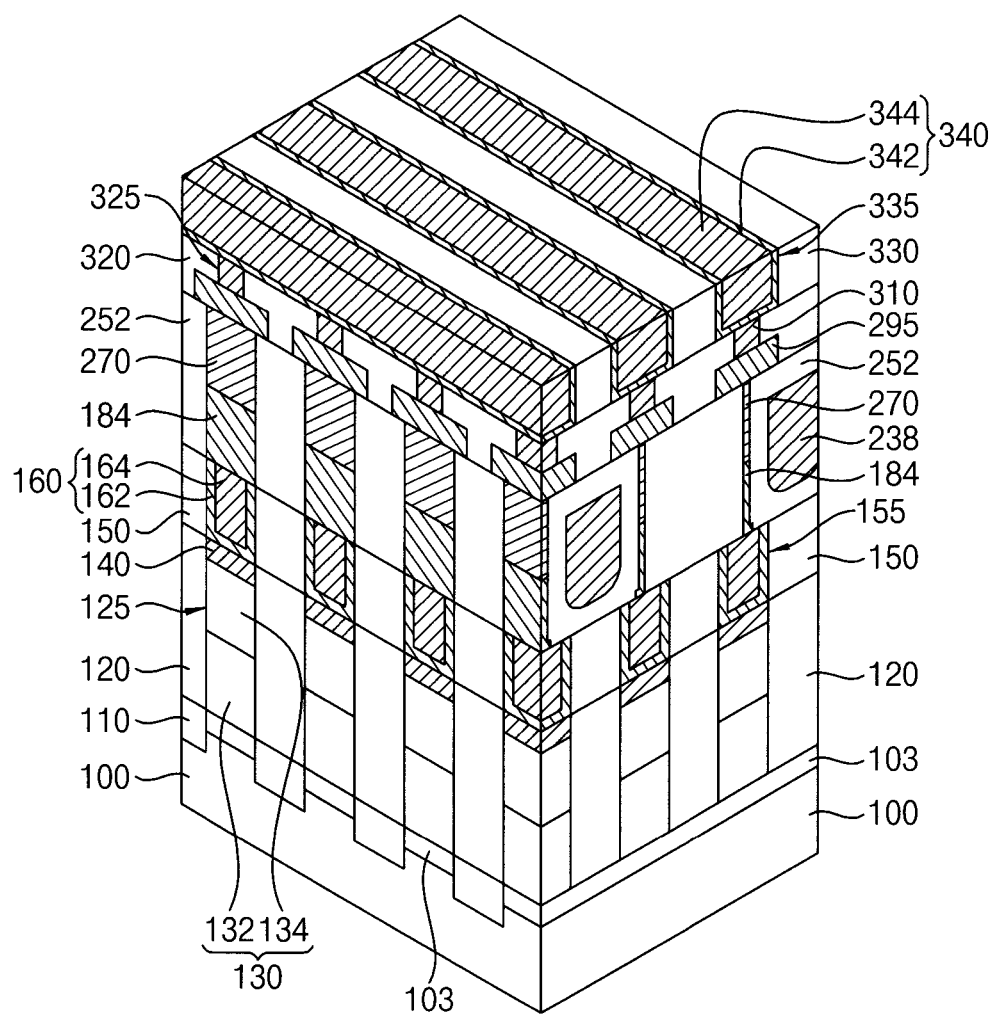
FIG. 88 is a perspective view illustrating a phase change memory device in accordance with some embodiments.

FIG. 88 is a perspective view illustrating a phase change memory device in accordance with some embodiments. The phase change memory device may be substantially the same as that illustrated with reference to FIGS. 76 to 79 except for the upper electrode and the bit line. Additionally, the upper electrode and the bit line of the phase change memory device may be substantially the same as or similar to those of the phase change memory device illustrated with reference to FIGS. 35 to 37. Thus, like reference numerals refer to like elements and detailed descriptions thereon are omitted herein.

Referring to FIG. 88, the phase change memory device may include a first lower electrode 184, a first phase change material layer pattern 270, a sixth heat sink 238, a second upper electrode 295 and a second bit line 340.

Figure 89:
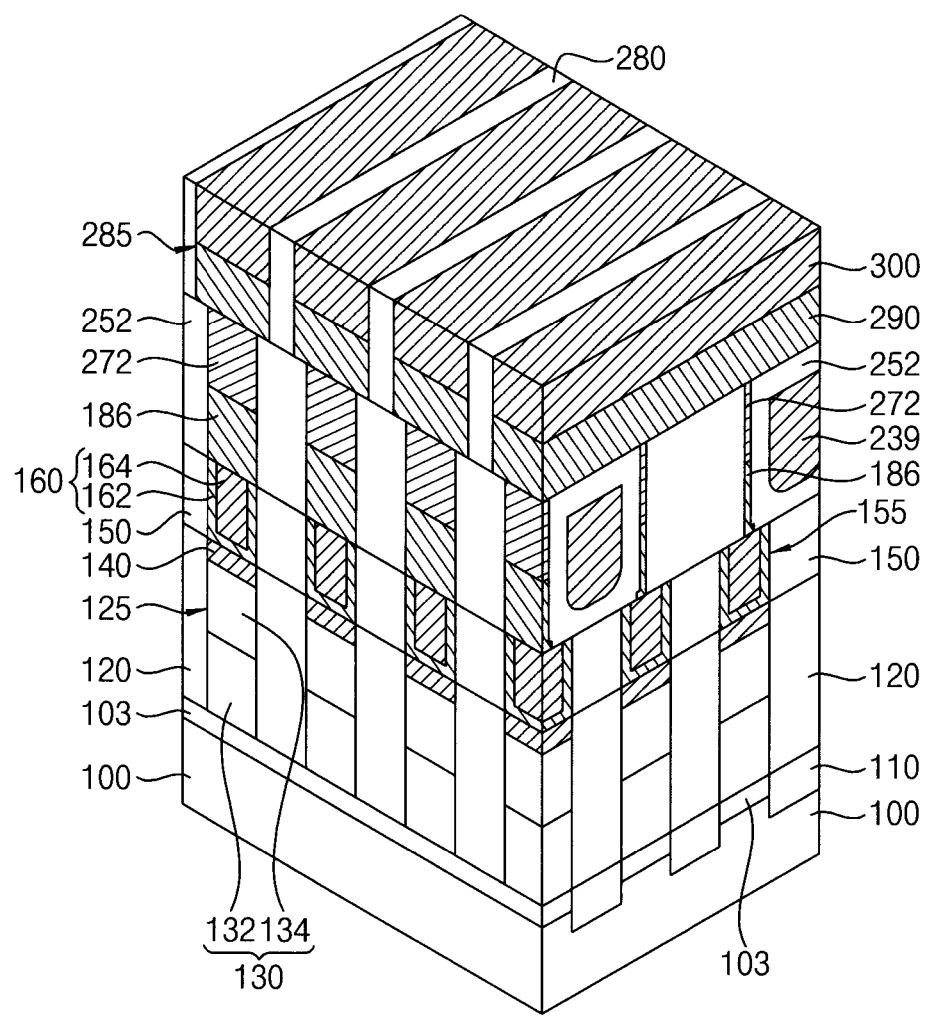
FIG. 89 is a perspective view illustrating a phase change memory device in accordance with some embodiments.

FIG. 89 is a perspective view illustrating a phase change memory device in accordance with some embodiments. The phase change memory device may be substantially the same as that illustrated with reference to FIGS. 76 to 79 except for the location and direction of the lower electrode, the phase change material layer pattern and the heat sink. Additionally, the location and the direction of the lower electrode and the phase change material layer pattern of the phase change memory device may be substantially the same as or similar to those of the phase change memory device illustrated with reference to FIGS. 42 to 44. Thus, like reference numerals refer to like elements and detailed descriptions thereon are omitted herein.

Referring to FIG. 89, the phase change memory device may include a second lower electrode 186, a second phase change material layer pattern 272, a seventh heat sink 239, a first upper electrode 290 and a first bit line 300.

The seventh heat sink 239 may extend in the second direction, and a plurality of seventh heat sinks 239 may be formed in the first direction. The seventh heat sink 239 may be formed between structures arranged in the first direction each of which may include the second lower electrodes 186 and the second phase change material layer patterns 272 disposed in the second direction and portions of the sixth insulation layer pattern 252 therebetween.

In some embodiments, in the first lower electrode array, the second lower electrodes 186 in the odd-numbered column in the first direction may have a cross-section of an "L" shape, while the second lower electrode 186 in the even-numbered column in the first direction may have a cross-section of a reverse "L" shape, e.g., a "J-like" shape.

The seventh heat sink 239 may be formed only between the second lower electrodes 186 in the odd numbered column and the second lower electrodes 186 in the even numbered column. That is, the seventh heat sink 239 may be formed between the second lower electrode 186 in the first column and the second lower electrode 186 in the second column, between the second lower electrode 186 in the third column and the second lower electrode 186 in the fourth column, between the second lower electrode 186 in the fifth column and the second lower electrode 186 in the sixth column, and the like.

In some embodiments, a top surface of the seventh heat sink 239 may be lower than a top surface of the second phase change material layer pattern 272, and thus may be lower than a bottom surface of the first upper electrode 290. Thus, the seventh heat sink 239 may be spaced apart from the first upper electrode 290. Additionally, the top surface of the seventh heat sink 239 may be higher than a bottom surface of the second phase change material layer pattern 272, and a bottom surface of the seventh heat sink 239 may be lower at least than a top surface of the second lower electrode 186. Thus, the seventh heat sink 239 may be formed adjacent to a region in which an exothermic reaction may occur vigorously according as the second lower electrode 186 heats the second phase change material layer pattern 272, that is, an interface between the second lower electrode 186 and the second phase change material layer pattern 272, so that the heat generated therefrom may be efficiently absorbed.

Figure 90:
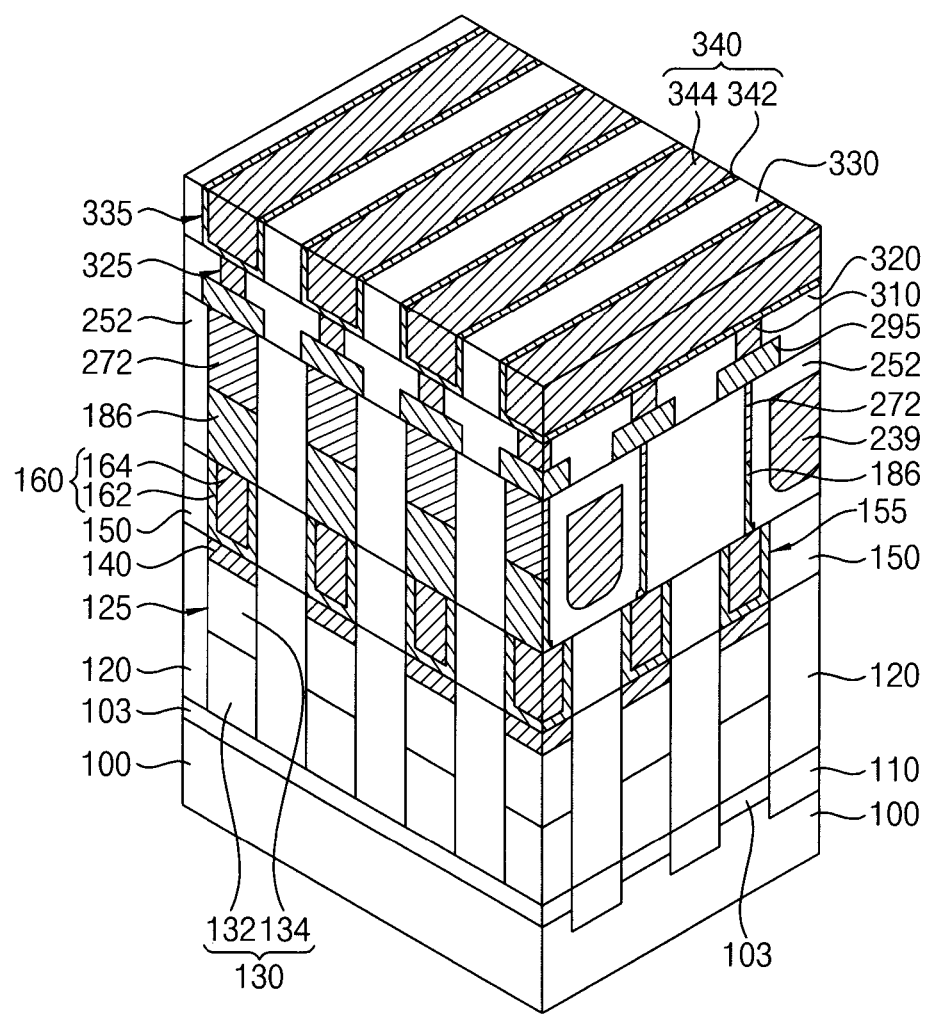
FIG. 90 is a perspective view illustrating a phase change memory device in accordance with some embodiments.

FIG. 90 is a perspective view illustrating a phase change memory device in accordance with some embodiments. The phase change memory device may be substantially the same as that illustrated with reference to FIG. 88 except for the location and direction of the lower electrode, the phase change material layer pattern and the heat sink. Additionally, in the phase change memory device, the location and the direction of the lower electrode, the phase change material layer pattern and the heat sink may be substantially the same as those of the phase change memory device illustrated with reference to FIG. 89. Thus, like reference numerals refer to like elements and detailed descriptions thereon are omitted herein.

Referring to FIG. 90, the phase change memory device may include a second lower electrode 186, a second phase change material layer pattern 272, a seventh heat sink 239, a second upper electrode 295 and a second bit line 340.

Figure 91:
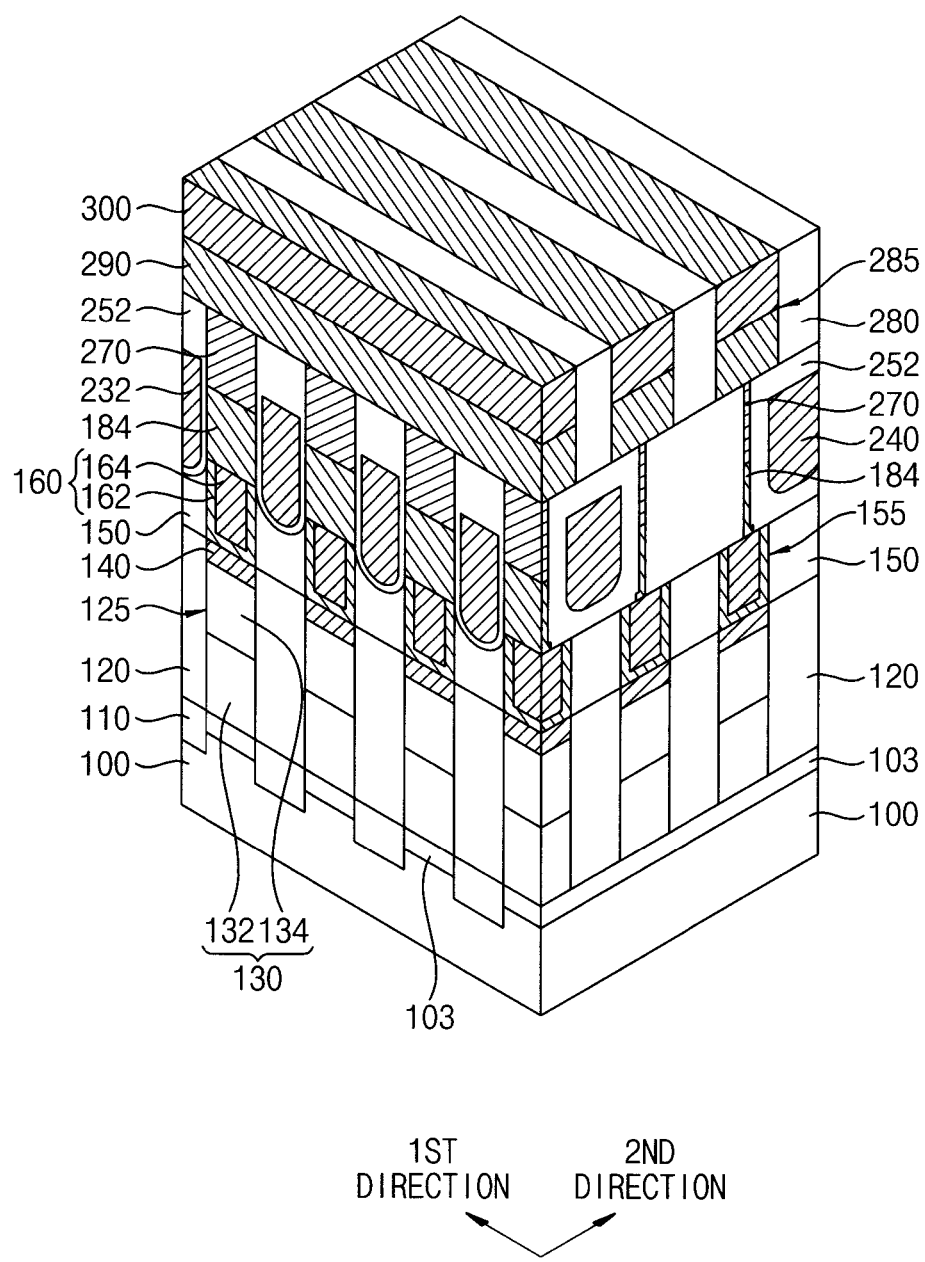
FIG. 91 is a perspective view illustrating a phase change memory device in accordance with some embodiments.
Figure 92:
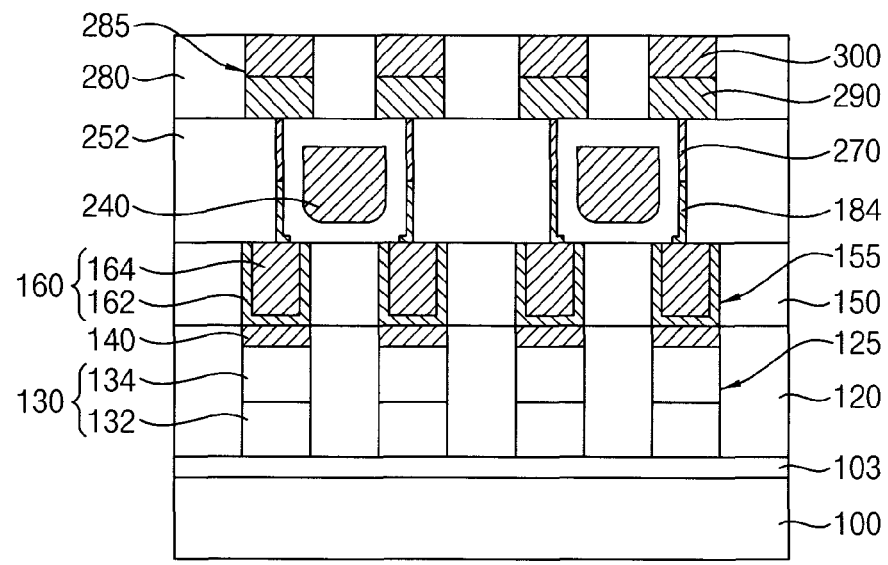
FIGS. 92 and 93 are cross-sectional views illustrating the phase change memory device of FIG. 91.
Figure 93:
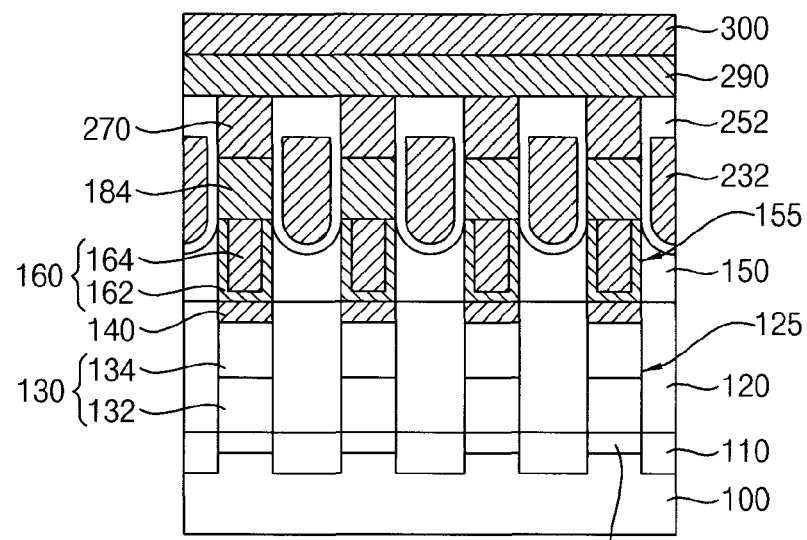
Figure 94:
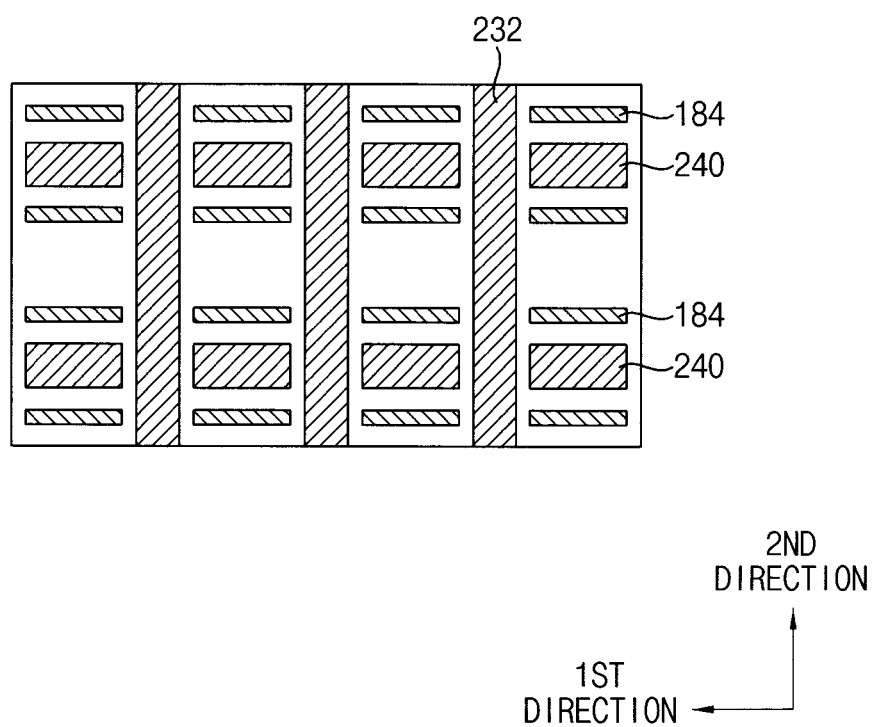
FIG. 94 is a plan view illustrating the positional relationship between lower electrodes and heat sinks of the phase change memory device.

FIG. 91 is a perspective view illustrating a phase change memory device in accordance with some embodiments, FIGS. 92 and 93 are cross-sectional views illustrating the phase change memory device of FIG. 91, and FIG. 94 is a plan view illustrating the positional relationship between lower electrodes and heat sinks of the phase change memory device. FIG. 92 is a cross-sectional view taken along the second direction, and FIG. 93 is a cross-sectional view taken along the first direction. The phase change memory device may be substantially the same as that illustrated with reference to FIGS. 1 to 4 except for the location and shape of the heat sink. Thus, like reference numerals refer to like elements and detailed descriptions thereon are omitted herein.

Referring to FIGS. 91 to 94, the phase change memory device may include a first lower electrode 184, a first phase change material layer pattern 270, a first heat sink 232, an eighth heat sink 240, a first upper electrode 290 and a first bit line 300.

A plurality of eighth heat sinks 240 may be formed both in the first and second directions to form an eighth heat sink array. In some embodiments, the eighth heat sink 240 may be formed only between the first lower electrodes 184 in the odd numbered column along the second direction and the first lower electrode 184 in the even numbered column along the second direction. That is, the eighth heat sinks 240 may be formed between the first lower electrode 184 in the first column and the first lower electrode 184 in the second column, between the first lower electrode 184 in the third column and the first lower electrode 184 in the fourth column, between the first lower electrode 184 in the fifth column and the first lower electrode 184 in the sixth column, and the like.

The phase change memory device may have both of the first and eight heat sinks 232 and 240 so that the effect of absorbing or releasing heat may be enhanced.

Figure 95:
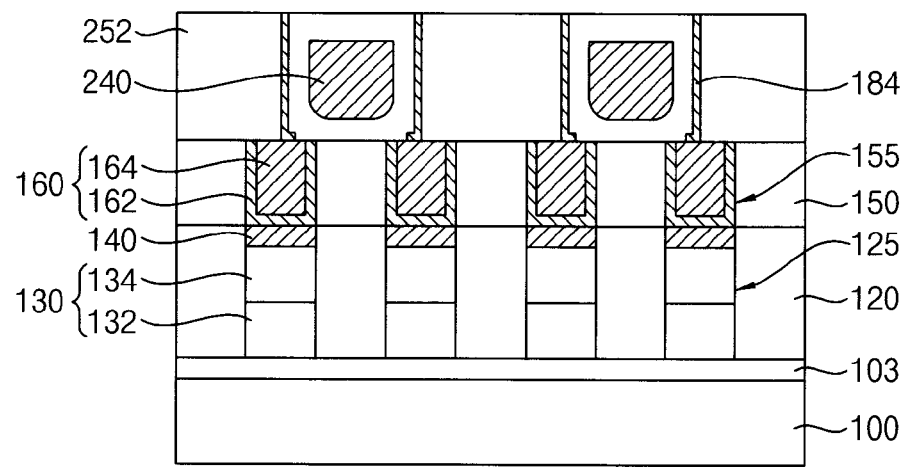
FIGS. 95 to 98 are cross-sectional views illustrating a method of manufacturing a phase change memory device in accordance with some embodiments.
Figure 96:
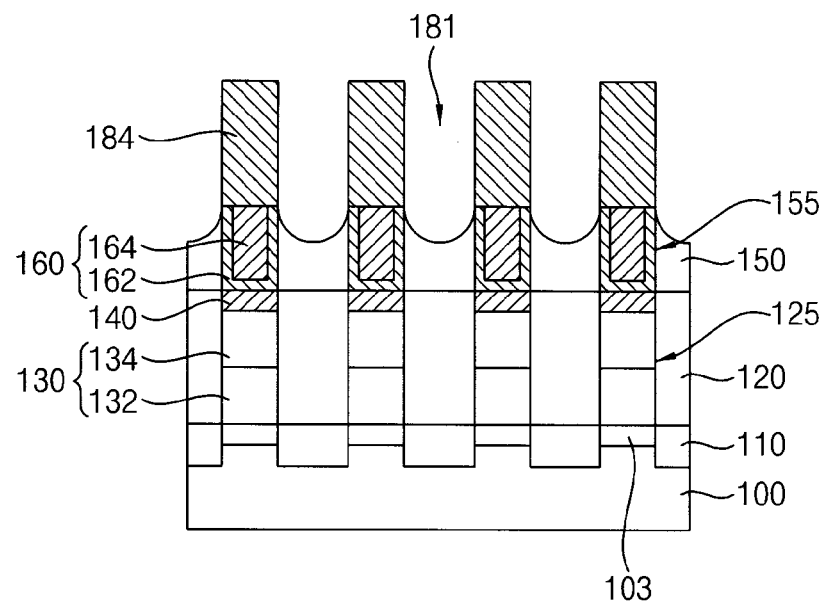
Figure 97:
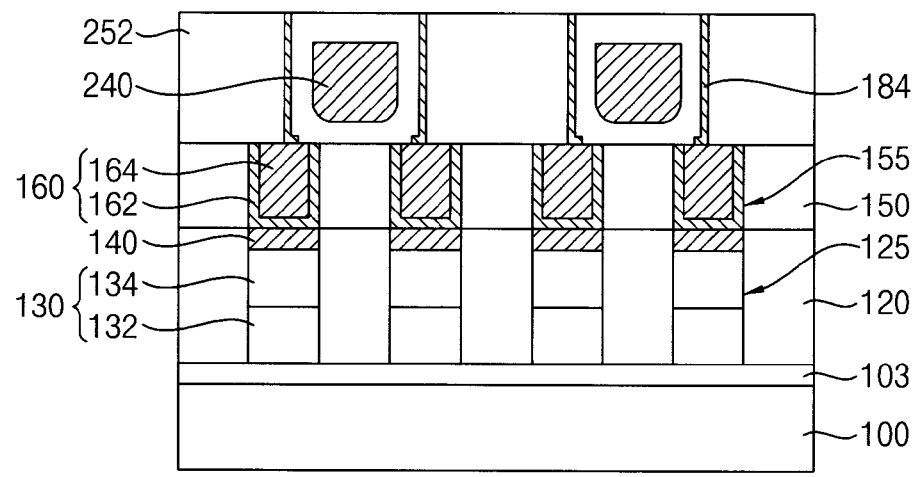
Figure 98:
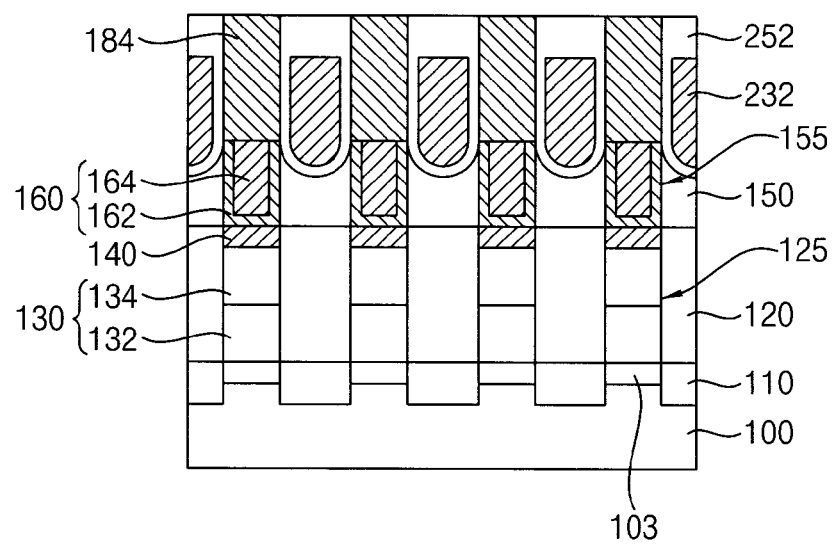

FIGS. 95 to 98 are cross-sectional views illustrating a method of manufacturing a phase change memory device in accordance with some embodiments. FIGS. 95 and 97 are cross-sectional views taken along the second direction, and FIGS. 96 and 98 are cross-sectional views taken along the first direction. This method may be used in manufacturing the phase change memory device of FIGS. 91 to 94, however, may not be limited thereto. This method may include processes substantially the same as or similar to those illustrated with reference to FIGS. 80 to 87 and FIGS. 5 to 34 and 1 to 3, and thus like reference numerals refer to like elements and detailed descriptions thereon are omitted herein.

First, processes substantially the same as or similar to those illustrated with reference to FIGS. 5 to 16 and 80 to 85 may be performed.

Referring to FIGS. 95 and 96, processes similar to those illustrated with reference to FIGS. 19 to 20 may be performed.

That is, the first lower electrode layer pattern 182 may be partially removed by a dry etching process using a photoresist pattern (not shown) to form a plurality of first lower electrodes 184 in the first direction, and an upper portion of the second insulation layer 150 may be partially removed. A space between the first lower electrodes 184 may be referred to as a first recess 181.

During the etching process, the sixth heat sink 238 extending in the first direction may be also partially removed to be transformed into a plurality of eighth heat sinks 240 arranged in the first direction.

Referring to FIGS. 97 and 98, processes substantially the same as or similar to those illustrated with reference to FIGS. 21 to 30 may be performed.

Thus, a first heat sink 232 may be formed between the first lower electrodes 184 adjacent to each other in the first direction, and the first heat sink 232 may be surrounded by the sixth insulation layer pattern 252. The first heat sink 232 may extend in the second direction, and a plurality of first heat sinks 232 may be formed in the first direction.

Processes substantially the same as or similar to those illustrated with reference to FIGS. 1 to 3 may be performed to manufacture the phase change memory device including the first and eighth heat sinks 232 and 240.

Figure 99:
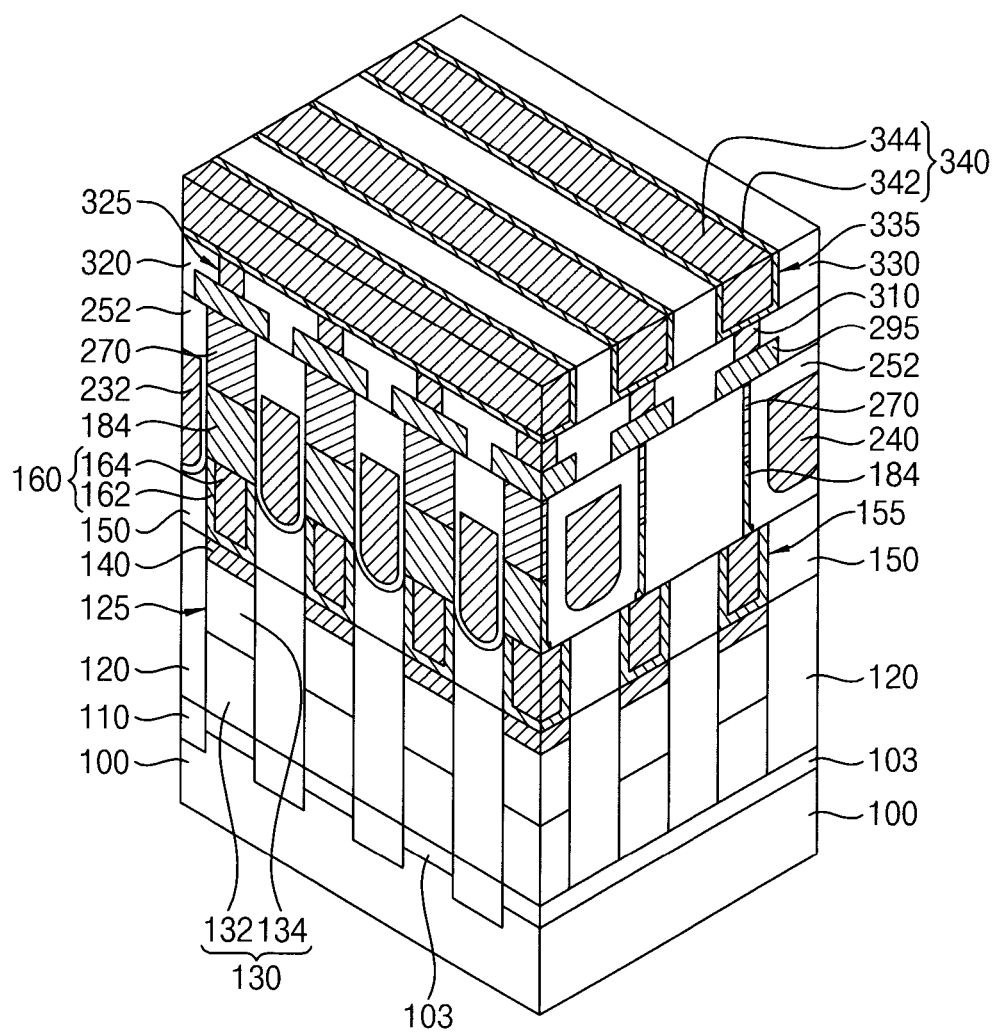
FIG. 99 is a perspective view illustrating a phase change memory device in accordance with some embodiments.
Figure 99:
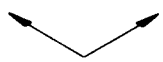

FIG. 99 is a perspective view illustrating a phase change memory device in accordance with some embodiments. The phase change memory device may be substantially the same as that illustrated with reference to FIGS. 91 to 94 except for the upper electrode and the bit line. Additionally, the upper electrode and the bit line may be substantially the same as or similar to those of the phase change memory device illustrated with reference to FIGS. 35 to 37. Thus, like reference numerals refer to like elements and detailed descriptions thereon are omitted herein.

Referring to FIG. 99, the phase change memory device may include a first lower electrode 184, a first phase change material layer pattern 270, a first heat sink 232, an eighth heat sink 240, a second upper electrode 295 and a second bit line 340.

Figure 100:
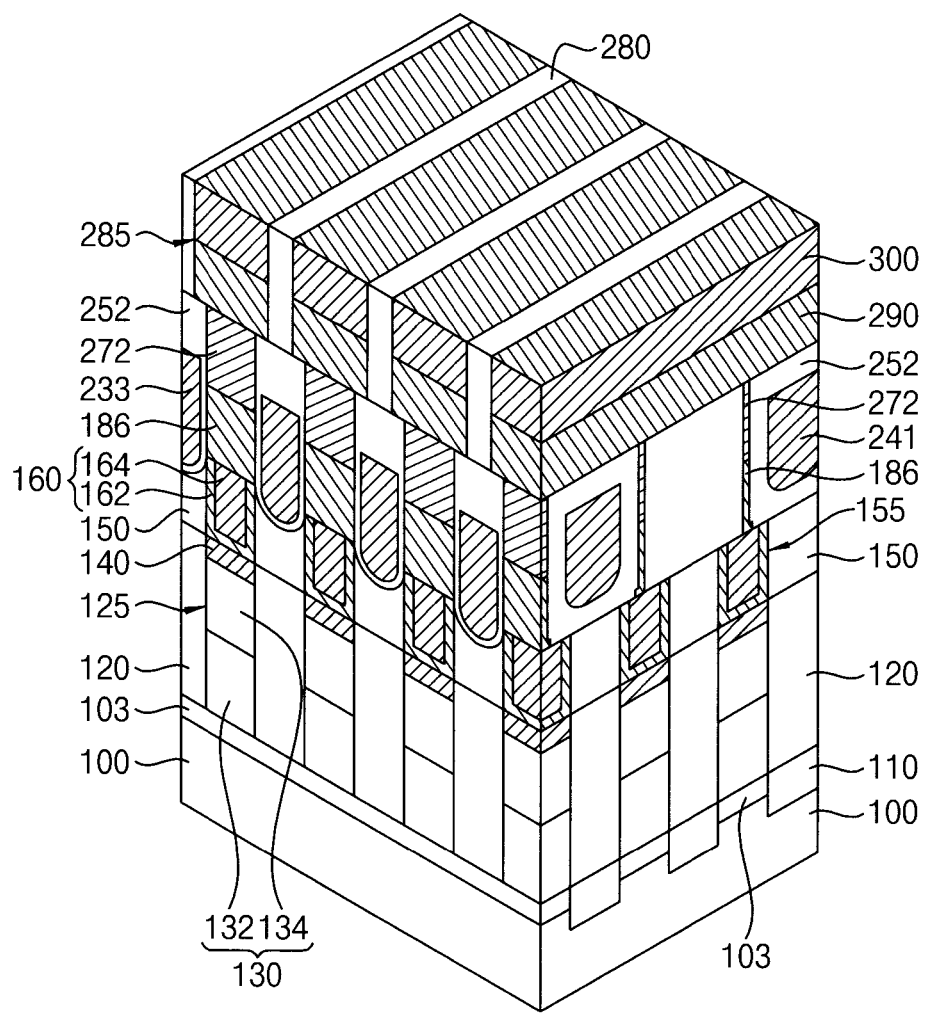
FIG. 100 is a perspective view illustrating a phase change memory device in accordance with some embodiments.

FIG. 100 is a perspective view illustrating a phase change memory device in accordance with some embodiments. The phase change memory device may be substantially the same as that illustrated with reference to FIGS. 91 to 94 except for the location and direction of the lower electrode, the phase change material layer pattern and the heat sink. Additionally, the location and direction of the upper electrode and the phase change material layer pattern may be substantially the same as or similar to those of the phase change memory device illustrated with reference to FIGS. 42 to 44. Thus, like reference numerals refer to like elements and detailed descriptions thereon are omitted herein.

Referring to FIG. 100, the phase change memory device may include a second lower electrode 186, a second phase change material layer pattern 272, a second heat sink 233, a ninth heat sink 241, a first upper electrode 290 and a first bit line 300.

A plurality of ninth heat sinks 241 may be formed both in the first and second directions to form a ninth heat sink array. In some embodiments, the ninth heat sink 241 may be formed only between the first lower electrodes 184 in the odd numbered column along the second direction and the first lower electrode 184 in the even numbered column along the second direction. That is, the ninth heat sinks 241 may be formed between the first lower electrode 184 in the first column and the first lower electrode 184 in the second column, between the first lower electrode 184 in the third column and the first lower electrode 184 in the fourth column, between the first lower electrode 184 in the fifth column and the first lower electrode 184 in the sixth column, and the like.

The phase change memory device may have both of the second and ninth heat sinks 233 and 241, thereby enhancing the effect of absorbing and releasing heat.

Figure 101:
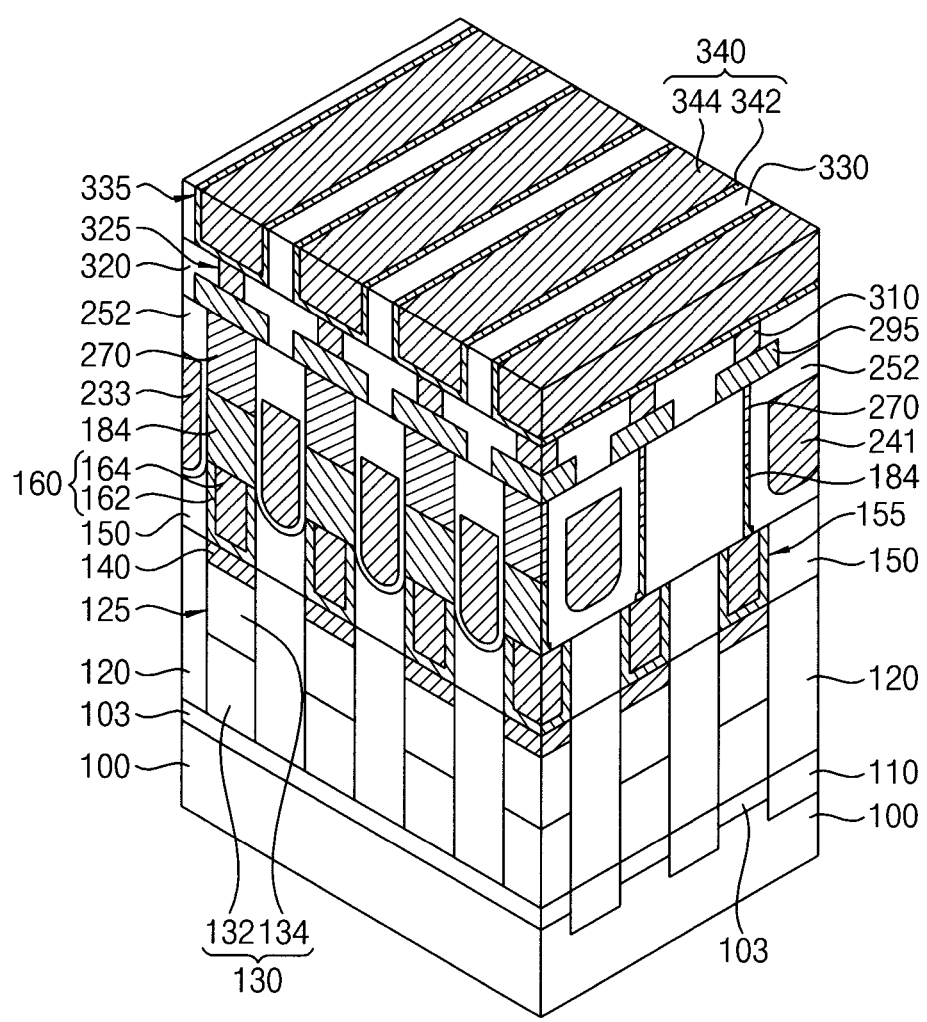
FIG. 101 is a perspective view illustrating a phase change memory device in accordance with some embodiments.

FIG. 101 is a perspective view illustrating a phase change memory device in accordance with some embodiments. The phase change memory device may be substantially the same as that illustrated with reference to FIG. 99 except for the location and direction of the lower electrode, the phase change material layer pattern and the heat sink. Additionally, the location and direction of the lower electrode, the phase change material layer pattern and the heat sink may be substantially the same as or similar to those of the phase change memory device illustrated with reference to FIG. 100. Thus, like reference numerals refer to like elements and detailed descriptions thereon are omitted herein.

Referring to FIG. 101, the phase change memory device may include a second lower electrode 186, a second phase change material layer pattern 272, a second heat sink 233, a ninth heat sink 241, a second upper electrode 295 and a second bit line 340.

Figure 102:
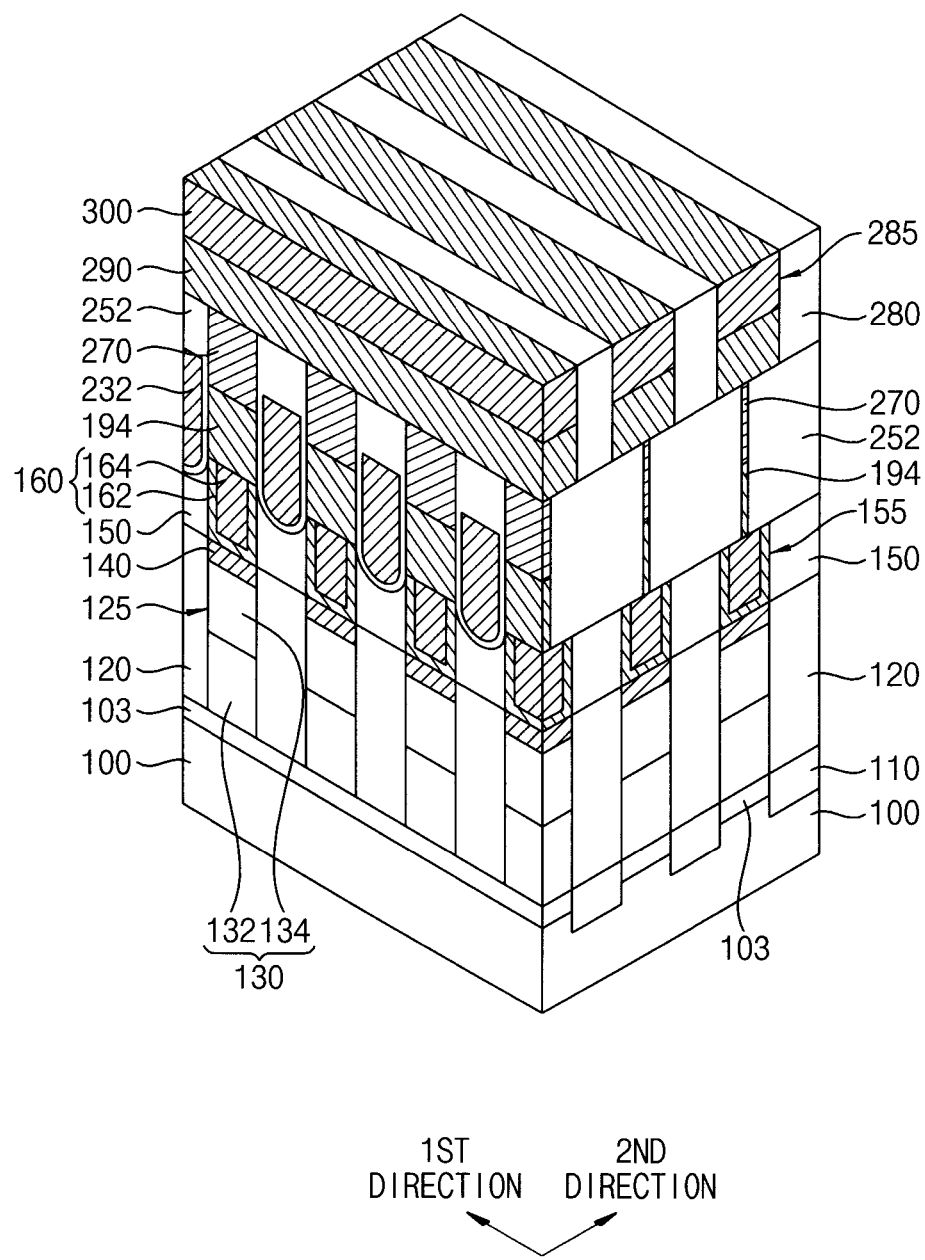
FIG. 102 is a perspective view illustrating a phase change memory device in accordance with some embodiments.

FIG. 102 is a perspective view illustrating a phase change memory device in accordance with some embodiments. The phase change memory device may be substantially the same as that illustrated with reference to FIGS. 1 to 4 except for the shape of the lower electrode. Thus, like reference numerals refer to like elements and detailed descriptions thereon are omitted herein.

Referring to FIG. 102, the phase change memory device may include a third lower electrode 194, a first phase change material layer pattern 270, a first heat sink 232, a first upper electrode 290 and a first bit line 300.

In some embodiments, the third lower electrode 194 may be formed on the plug 160 and beneath the first phase change material layer pattern 270, thereby heating the first phase change material layer pattern 270.

In some embodiments, the third lower electrode 194 may have a cross-sectional shape along the first direction that may be substantially a rectangle or trapezoid with a bottom surface wider than a top surface thereof. The third lower electrode 194 may have a cross-sectional shape along the second direction that may be substantially a bar shape or a rectangular shape.

In some embodiments, the third lower electrode 194 may have a first width along the first direction wider than a second width along the second direction, and a first distance between the third lower electrodes 194 adjacent to each other along the first direction may be smaller than a second distance between the third lower electrodes 194 adjacent to each other along the second direction.

In the phase change memory device, the third lower electrode 194 may have a cross-sectional shape along the second direction that may be substantially a bar shape, unlike the first lower electrode 184 of the phase change memory device illustrated with reference to FIGS. 1 to 4.

FIGS. 103 to 110 are cross-sectional views illustrating a method of manufacturing a phase change memory device in accordance with some embodiments. FIGS. 103, 105, 107 and 109 are cross-sectional views taken along the second direction, and FIGS. 104, 106, 108 and 110 are cross-sectional views taken along the first direction. This method may be used in manufacturing the phase change memory device of FIG. 102, however, may not be limited thereto. This method may include processes substantially the same as or similar to those illustrated with reference to FIGS. 5 to 34 and 1 to 3, and thus like reference numerals refer to like elements and detailed descriptions thereon are omitted herein.

First, processes substantially the same as or similar to those illustrated with reference to FIGS. 5 to 10 may be performed.

Figure 103:
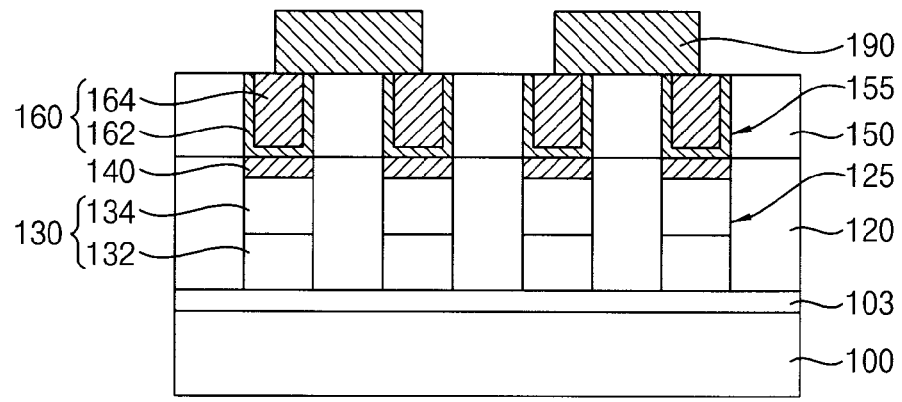
FIGS. 103 to 110 are cross-sectional views illustrating a method of manufacturing a phase change memory device in accordance with some embodiments.
Figure 104:
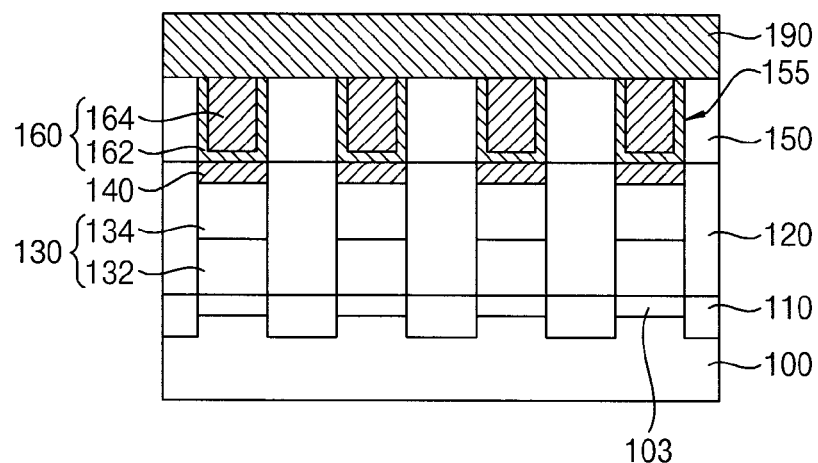

Referring now to FIGS. 103 and 104, a second lower electrode layer 190 may be formed on the plugs 106, the second insulation layer 150.

In some embodiments, the second lower electrode layer 190 may be formed to extend in the first direction, and a plurality of second lower electrode layer 190 may be formed in the second direction. In some embodiments, portions of top surfaces of adjacent two plugs 160 along the second direction may be covered by one second lower electrode layer 190. That is, each second lower electrode layer 190 may be formed to cover portions of top surfaces of adjacent two plugs 160 and a top surface of the second insulation layer 150 therebetween.

The second lower electrode layer 190 may be formed to include a metal or a metal compound such as a metal nitride, a metal silicon nitride, etc.

Figure 105:
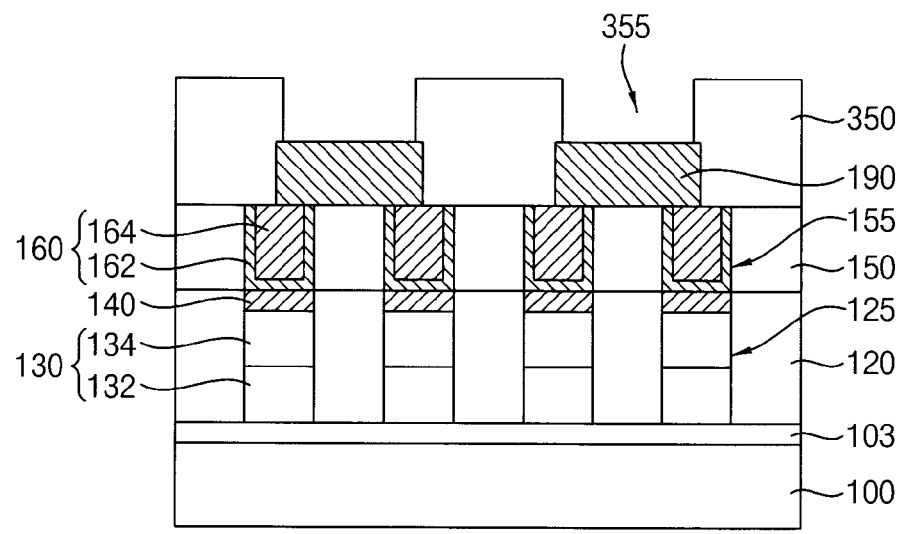
Figure 106:
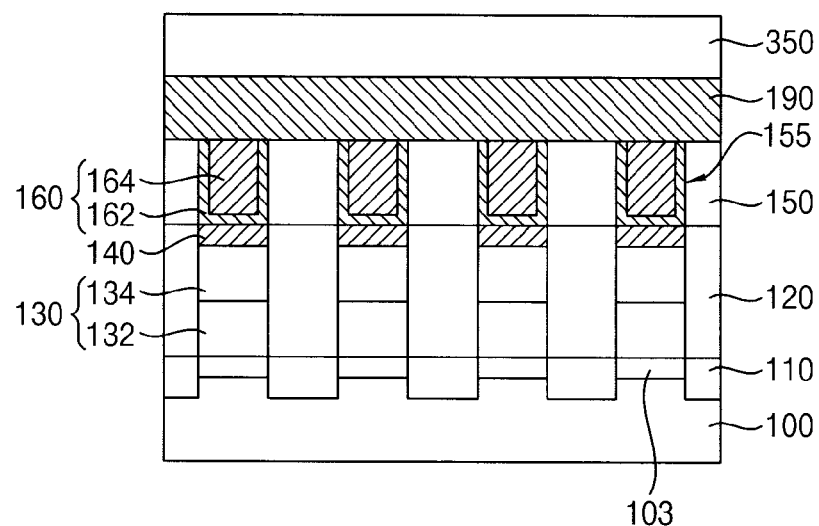

Referring to FIGS. 105 and 106, a photoresist pattern 350 covering a portion of the second lower electrode layer 190 may be formed on the second insulation layer 150 and the plugs 160.

In some embodiments, the photoresist pattern 350 may cover both lateral portions of the second lower electrode layer 190 when viewed along the first direction. Thus, a central portion of the second lower electrode layer 190 may be exposed by a seventh opening 355.

Figure 107:
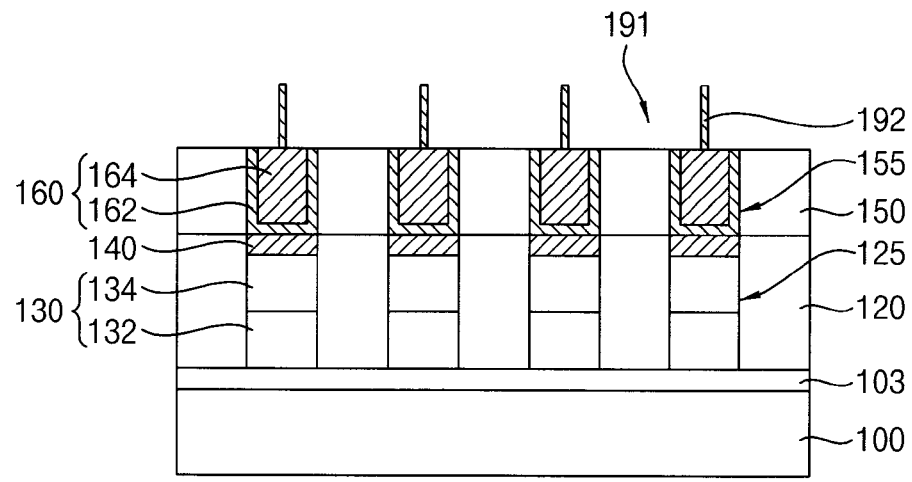
Figure 108:
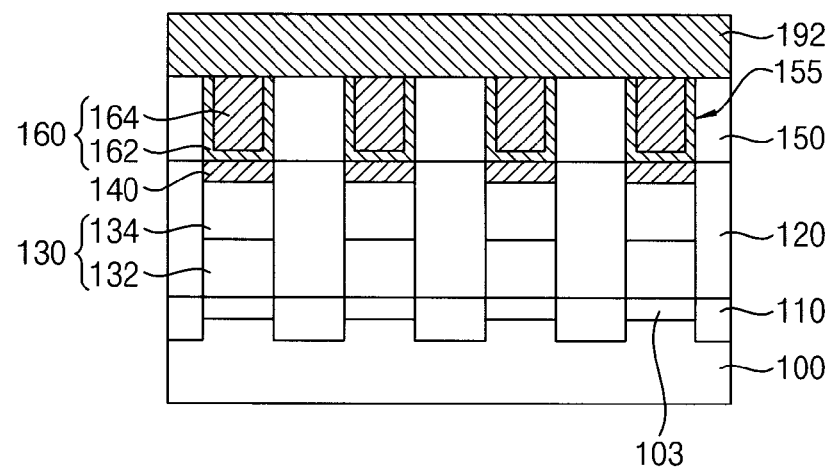

Referring to FIGS. 107 and 108, the second lower electrode layer 190 may be patterned using the photoresist pattern 350 as an etching mask to form a second lower electrode layer pattern 192, and thus an eighth opening 191 exposing portions of top surfaces of the plugs 160 and a top surface of the second insulation layer 150.

In some embodiments, the second lower electrode layer pattern 192 may be formed to extend in the first direction, and a plurality of second lower electrode layer patterns 192 may be formed in the second direction. That is, two second lower electrode layer patterns 192 may be generated from one second lower electrode layer 190. In some embodiments, each second lower electrode layer pattern 192 may be formed on a central region of a top surface of each plug 160 when viewed along the first direction, and may have a cross-sectional shape along the second direction that may be substantially a bar shape.

The photoresist pattern 350 may be removed. In some embodiments, the photoresist pattern 350 may be removed by an ashing process and/or a stripping process.

Figure 109:
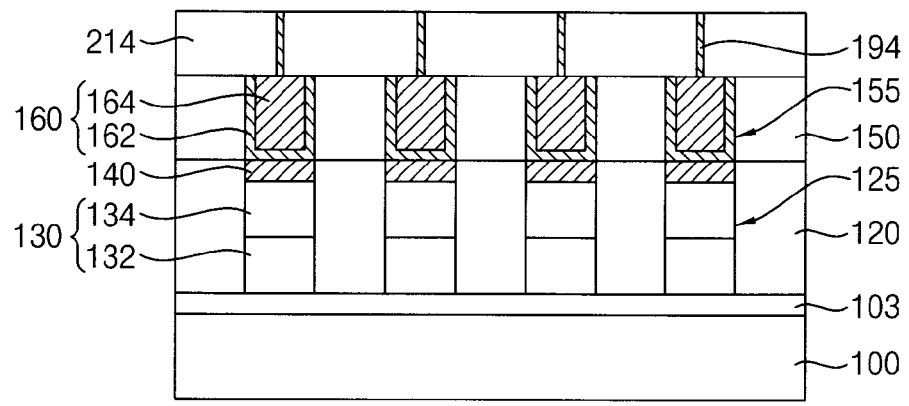
Figure 110:
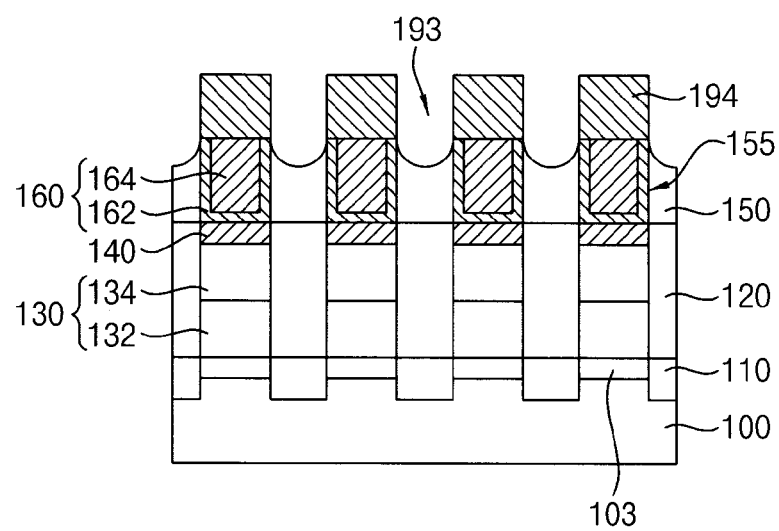

Referring to FIGS. 109 and 110, processes substantially the same as or similar to those illustrated with reference to FIGS. 17 to 20 may be performed.

That is, a fourteenth insulation layer 214 may be formed on the exposed top surfaces of the plugs 160 and the second insulation layer 150 and the second lower electrode layer patterns 192 to sufficiently fill the eighth opening 191, and the fourteenth insulation layer 214 may be planarized until top surfaces of the second lower electrode layer patterns 192 may be exposed.

The second lower electrode layer 192 may be partially removed to form an eighth recess 193 and a plurality of third lower electrodes 194 both in the first and second directions. Thus, a third lower electrode array may be formed.

Processes substantially the same as or similar to those illustrated with reference to FIGS. 21 to 34 and 1 to 3 may be performed to manufacture the phase change memory device.

Figure 111:
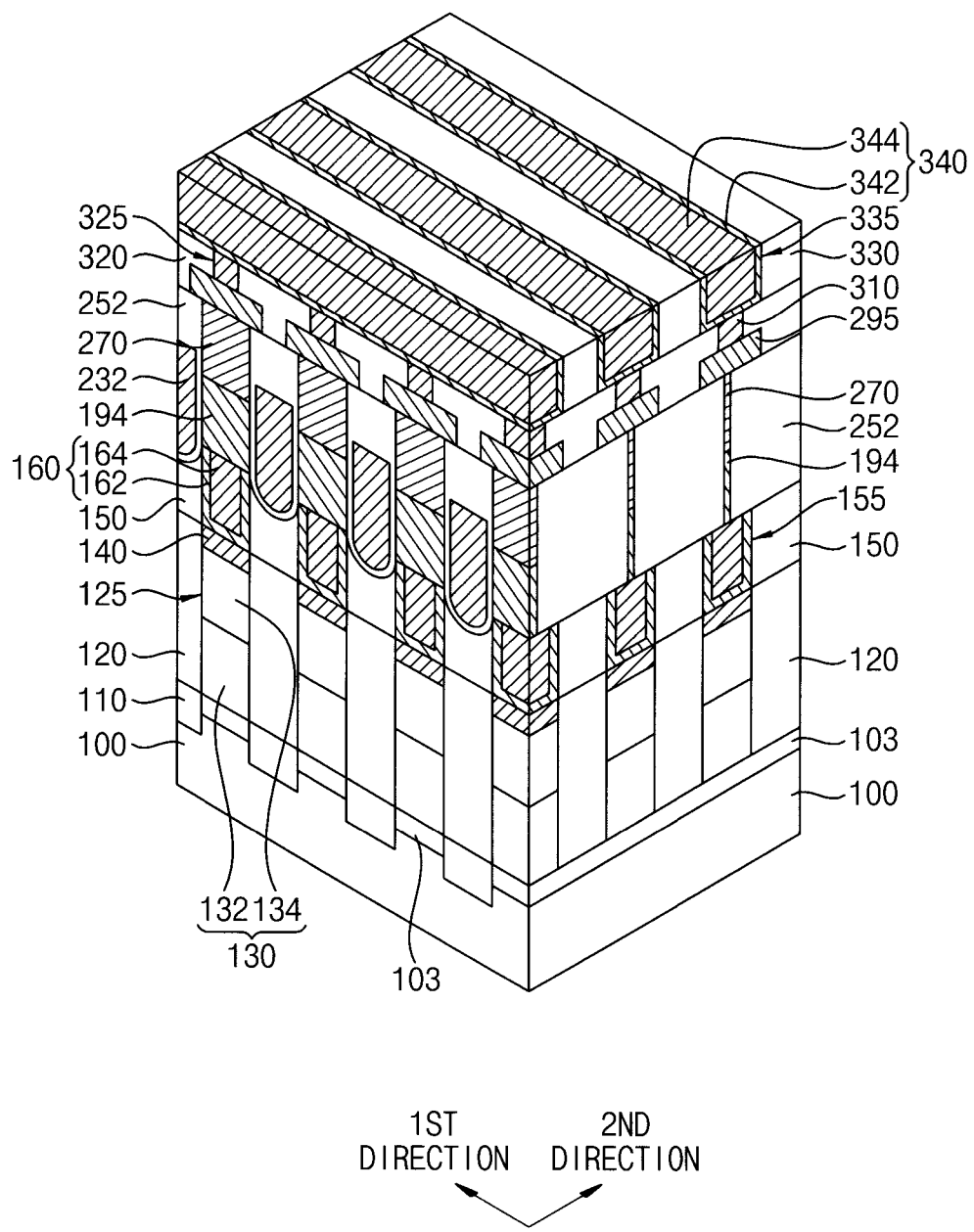
FIG. 111 is a perspective view illustrating a phase change memory device in accordance with some embodiments.

FIG. 111 is a perspective view illustrating a phase change memory device in accordance with some embodiments. The phase change memory device may be substantially the same as that illustrated with reference to FIG. 102 except for the upper electrode and the bit line. Additionally, the upper electrode and the bit line of the phase change memory device may be substantially the same as or similar to those of the phase change memory device illustrated with reference to FIGS. 35 to 37. Thus, like reference numerals refer to like elements and detailed descriptions thereon are omitted herein.

Referring to FIG. 111, the phase change memory device may include a third lower electrode 194, a first phase change material layer pattern 270, a first heat sink 232, a second upper electrode 295 and a second bit line 340.

Figure 112:
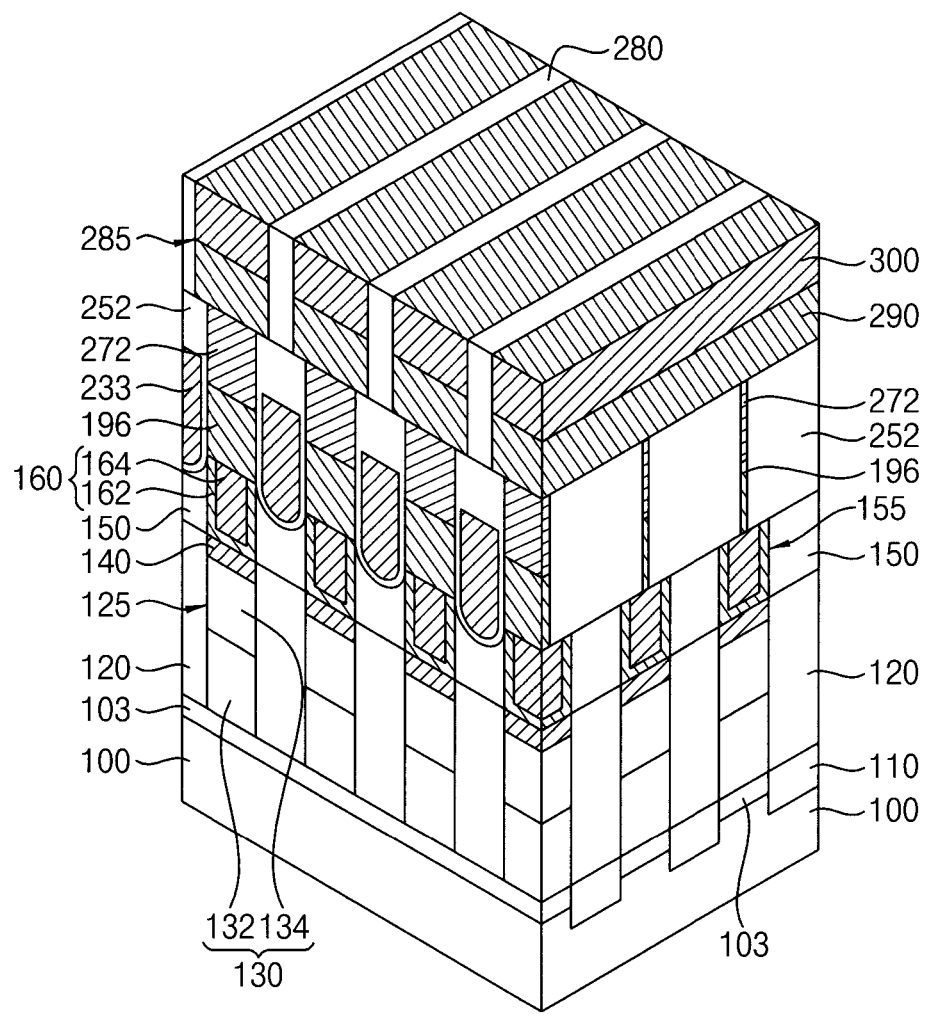
FIG. 112 is a perspective view illustrating a phase change memory device in accordance with some embodiments.
Figure 112:
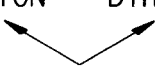

FIG. 112 is a perspective view illustrating a phase change memory device in accordance with some embodiments. The phase change memory device may be substantially the same as that illustrated with reference to FIG. 102 except for the location and direction of the lower electrode, the phase change material layer pattern and the heat sink. Additionally, the location and direction of the upper electrode and the phase change material layer pattern may be substantially the same as or similar to those of the phase change memory device illustrated with reference to FIGS. 42 to 44. Thus, like reference numerals refer to like elements and detailed descriptions thereon are omitted herein.

Referring to FIG. 112, the phase change memory device may include a fourth lower electrode 196, a second phase change material layer pattern 272, a second heat sink 233, a first upper electrode 290 and a first bit line 300.

In some embodiments, the fourth lower electrode 196 may be formed on the plug 160 and beneath the first phase change material layer pattern 270, thereby heating the first phase change material layer pattern 270.

In some embodiments, the fourth lower electrode 196 may have a cross-sectional shape along the second direction that may be substantially a rectangle or trapezoid with a bottom surface wider than a top surface thereof. Additionally, the fourth lower electrode 196 may have a cross-sectional shape along the first direction that may be substantially a bar shape.

In some embodiments, the fourth lower electrode 196 may have a second width along the second direction wider than a first width along the first direction, and a second distance between the fourth lower electrodes 196 along the second direction may be smaller than a first distance between the fourth lower electrodes 196 along the first direction.

Figure 113:
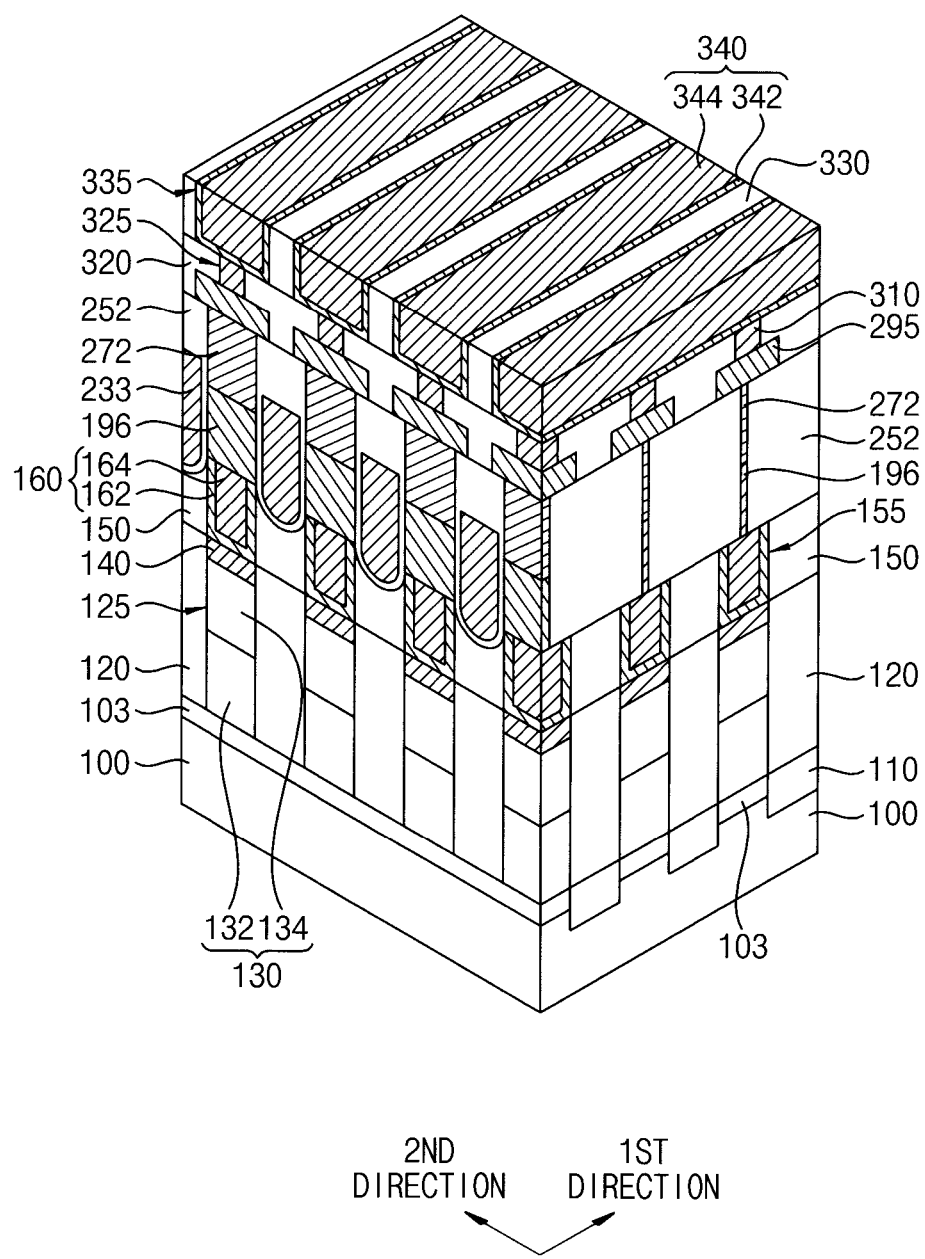
FIG. 113 is a perspective view illustrating a phase change memory device in accordance with some embodiments.

FIG. 113 is a perspective view illustrating a phase change memory device in accordance with some embodiments. The phase change memory device may be substantially the same as that illustrated with reference to FIG. 111 except for the location and direction of the lower electrode, the phase change material layer pattern and the heat sink. Additionally, the location and direction of the lower electrode, the phase change material layer pattern and the heat sink may be substantially the same as or similar to those of the phase change memory device illustrated with reference to FIG. 112. Thus, like reference numerals refer to like elements and detailed descriptions thereon are omitted herein.

Referring to FIG. 113, the phase change memory device may include a fourth lower electrode 196, a second phase change material layer pattern 272, a second heat sink 233, a second upper electrode 295 and a second bit line 340.

Figure 114:
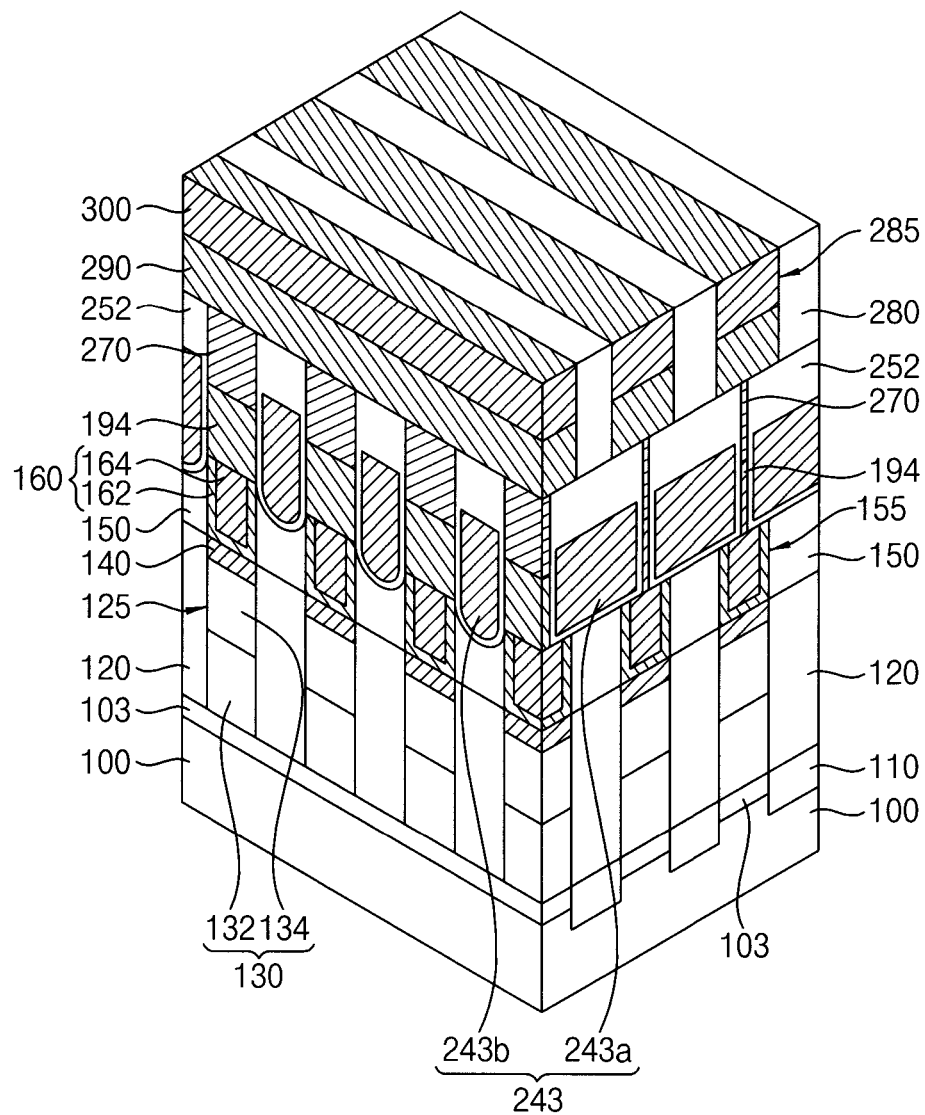
FIG. 114 is a perspective view illustrating a phase change memory device in accordance with some embodiments.
Figure 115:
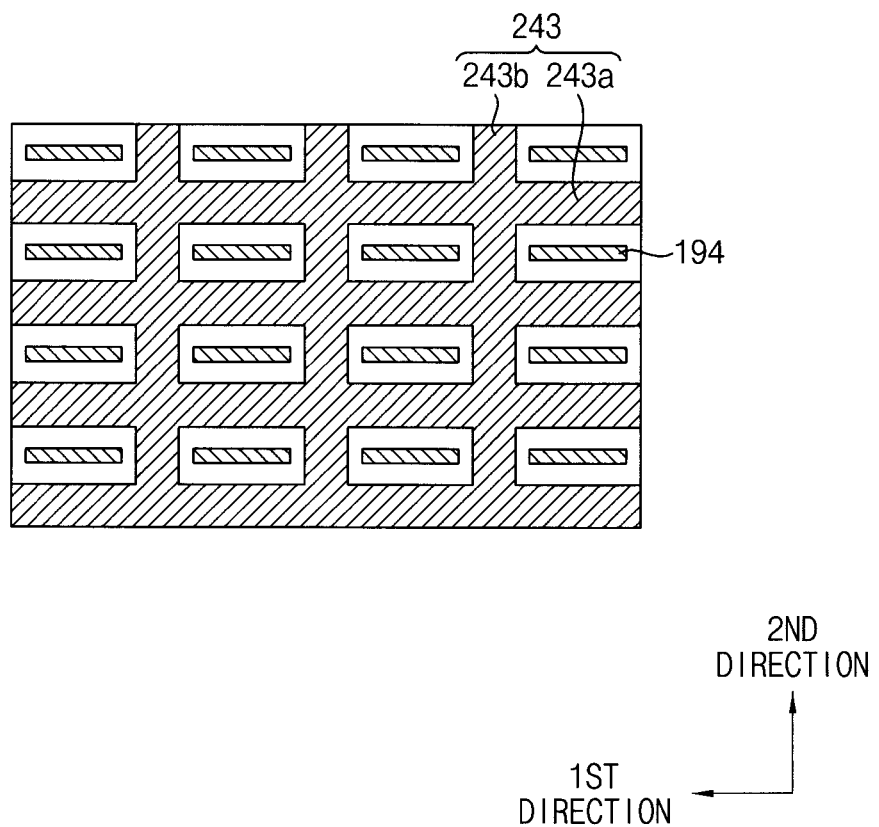
FIG. 115 is a plan view illustrating the positional relationship between lower electrodes and heat sinks of the phase change memory device.

FIG. 114 is a perspective view illustrating a phase change memory device in accordance with some embodiments, and FIG. 115 is a plan view illustrating the positional relationship between lower electrodes and heat sinks of the phase change memory device. The phase change memory device may be substantially the same as that illustrated with reference to FIG. 102 except for the location and shape of the heat sink. Thus, like reference numerals refer to like elements and detailed descriptions thereon are omitted herein.

Referring to FIGS. 114 to 115, the phase change memory device may include a third lower electrode 194, a first phase change material layer pattern 270, a tenth heat sink 243, a first upper electrode 290 and a first bit line 300.

The tenth heat sink 243 may have a shape similar to that of the third heat sink 234. That is, the tenth heat sink 243 may have a lattice shape surrounding sidewalls of the third lower electrodes 194 or the first phase change material layer patterns 270 when viewed from a top side. The tenth heat sink 243 may have a seventh extension portion 243*a* extending in the first direction and an eighth extension portion 243*b* extending in the second direction. The seventh and eighth extension portions 243a and 243b may cross each other.

The tenth heat sink 243 may be spaced apart or electrically insulated from the phase change memory unit, i.e., the third lower electrode 194, the first phase change material layer pattern 270 and the first upper electrode 290.

Unlike the third heat sink 234, a lower portion of the tenth heat sink 243 may not be crooked. That is, the seventh extension portion 243a of the tenth heat sink 243 may be formed adjacent to the third lower electrode 194 having the cross-section of a bar shape, thereby having a flat lower portion unlike the first extension portion 234a of the third heat sink 234. The eighth extension portion 243b may have a bottom surface lower than a bottom surface of the third lower electrode 194, and thus may be formed adjacent to an upper sidewall of the plug 160.

Figure 116:
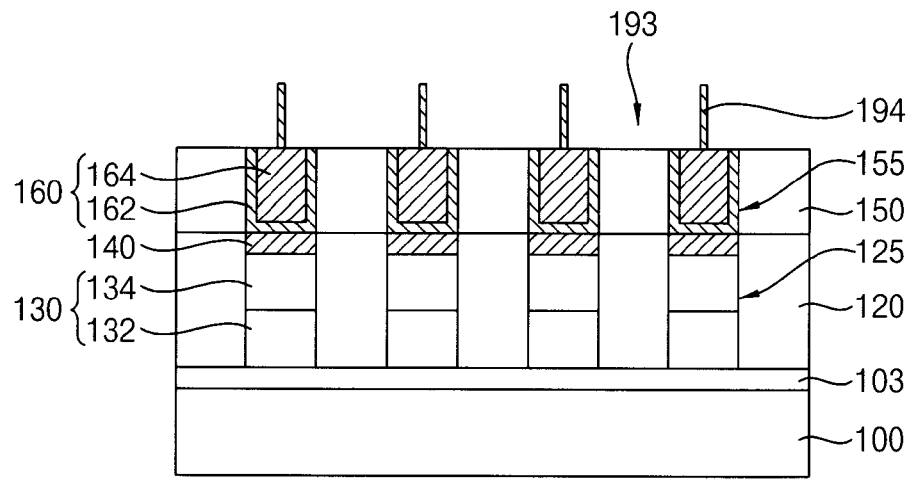
FIGS. 116 to 117 are cross-sectional views illustrating a method of manufacturing a phase change memory device in accordance with some embodiments.
Figure 117:
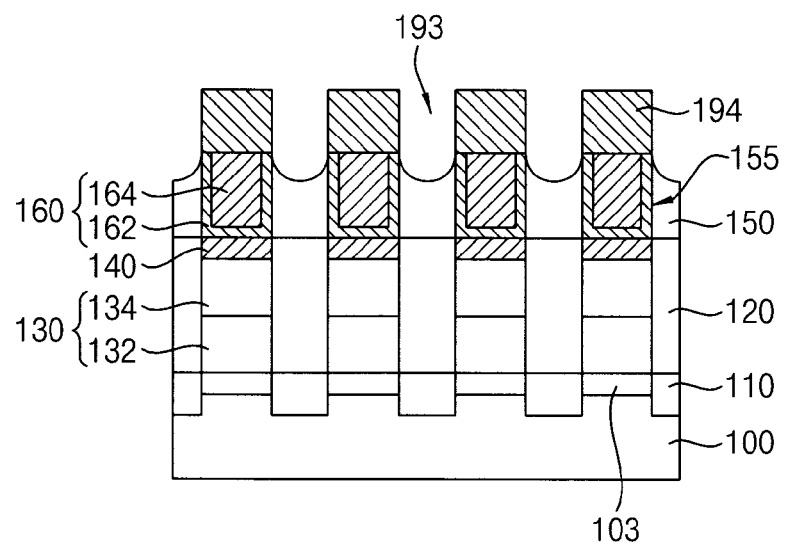

FIGS. 116 to 117 are cross-sectional views illustrating a method of manufacturing a phase change memory device in accordance with some embodiments. FIG. 116 is a cross-sectional view taken along the second direction, and FIG. 117 is a cross-sectional view taken along the first direction. This method may be used in manufacturing the phase change memory device of FIGS. 114 and 115, however, may not be limited thereto. This method may include processes substantially the same as or similar to those illustrated with reference to FIGS. 103 to 110 and those illustrated with reference to FIGS. 52 to 59 and 48 to 51, and thus like reference numerals refer to like elements and detailed descriptions thereon are omitted herein.

First, processes substantially the same as or similar to those illustrated with reference to FIGS. 103 to 108 may be performed.

Referring now to FIGS. 116 and 117, the second lower electrode layer patterns 192 may be partially etched to form an eighth recess 193, and a plurality of third lower electrodes 194 both in the first and second directions. Thus, a third lower electrode array may be formed.

Processes substantially the same as or similar to those illustrated with reference to FIGS. 54 to 59 and 48 to 50 may be performed to manufacture the phase change memory device.

Figure 118:
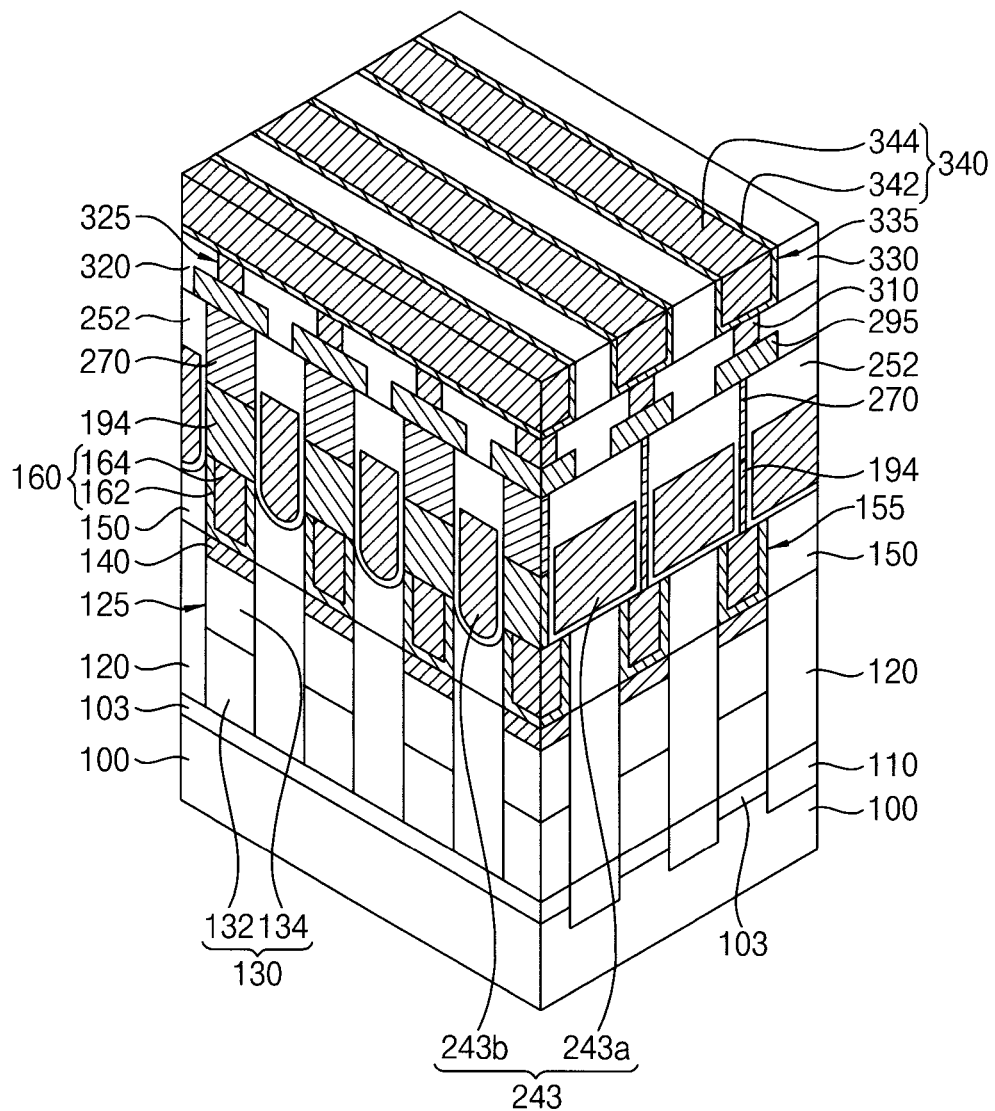
FIG. 118 is a perspective view illustrating a phase change memory device in accordance with some embodiments.

FIG. 118 is a perspective view illustrating a phase change memory device in accordance with some embodiments. The phase change memory device may be substantially the same as that illustrated with reference to FIGS. 114 and 115 except for the upper electrode and the bit line. Additionally, the upper electrode and the bit line of the phase change memory device may be substantially the same as or similar to those of the phase change memory device illustrated with reference to FIGS. 35 to 37. Thus, like reference numerals refer to like elements and detailed descriptions thereon are omitted herein.

Referring to FIG. 118, the phase change memory device may include a third lower electrode 194, a first phase change material layer pattern 270, a tenth heat sink 243, a second upper electrode 295 and a second bit line 340.

Figure 119:
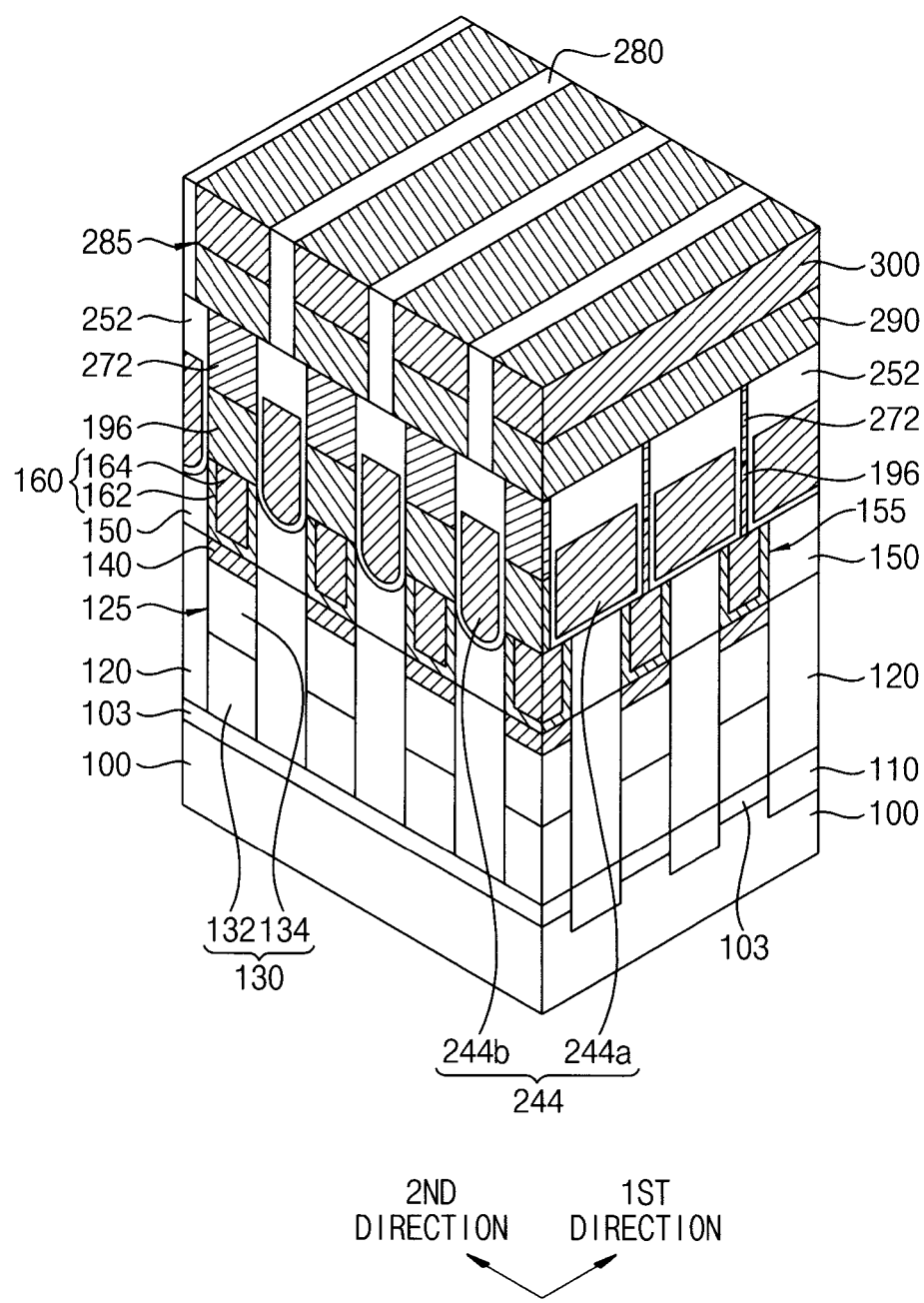
FIG. 119 is a perspective view illustrating a phase change memory device in accordance with some embodiments.

FIG. 119 is a perspective view illustrating a phase change memory device in accordance with some embodiments. The phase change memory device may be substantially the same as that illustrated with reference to FIG. 114 except for the location and direction of the lower electrode, the phase change material layer pattern and the heat sink. Additionally, the location and direction of the upper electrode and the phase change material layer pattern may be substantially the same as or similar to those of the phase change memory device illustrated with reference to FIG. 112. Thus, like reference numerals refer to like elements and detailed descriptions thereon are omitted herein.

Referring to FIG. 119, the phase change memory device may include a fourth lower electrode 196, a second phase change material layer pattern 272, an eleventh heat sink 244, a first upper electrode 290 and a first bit line 300.

In some embodiments, the fourth lower electrode 196 may be formed on the plug 160 and beneath the first phase change material layer pattern 270, thereby heating the first phase change material layer pattern 270.

The eleventh heat sink 244 may have a shape similar to that of the tenth heat sink 243, however, the direction thereof may be different from that of the tenth heat sink 243.

In some embodiments, the eleventh heat sink 244 may have a lattice shape surrounding sidewalls of the fourth lower electrodes 196 or the second phase change material layer patterns 272 when viewed from a top side. The eleventh heat sink 244 may have a ninth extension portion 244a extending in the second direction and a tenth extension portion 244b extending in the first direction. The ninth and tenth extension portions 244a and 244b may cross each other.

That is, the ninth and tenth extension portions 244a and 244b of the eleventh heat sink 244 may have shapes similar to those of the seventh and eighth extension portions 243a and 243b of the tenth heat sink 243, however, the directions may not be the same but perpendicular thereto. While the seventh extension portion 243a of the tenth heat sink 243 may extend in the direction in which the first bit line 300 may extend and the eighth extension portion 243b of the tenth heat sink 243 may extend in the direction in which the word line 103 may extend, the ninth extension portion 244a of the eleventh heat sink 244 may extend in the direction in which the word line 103 may extend and the ninth extension portion 244b of the eleventh heat sink 244 may extend in the direction in which the first bit line 300 may extend.

Figure 120:
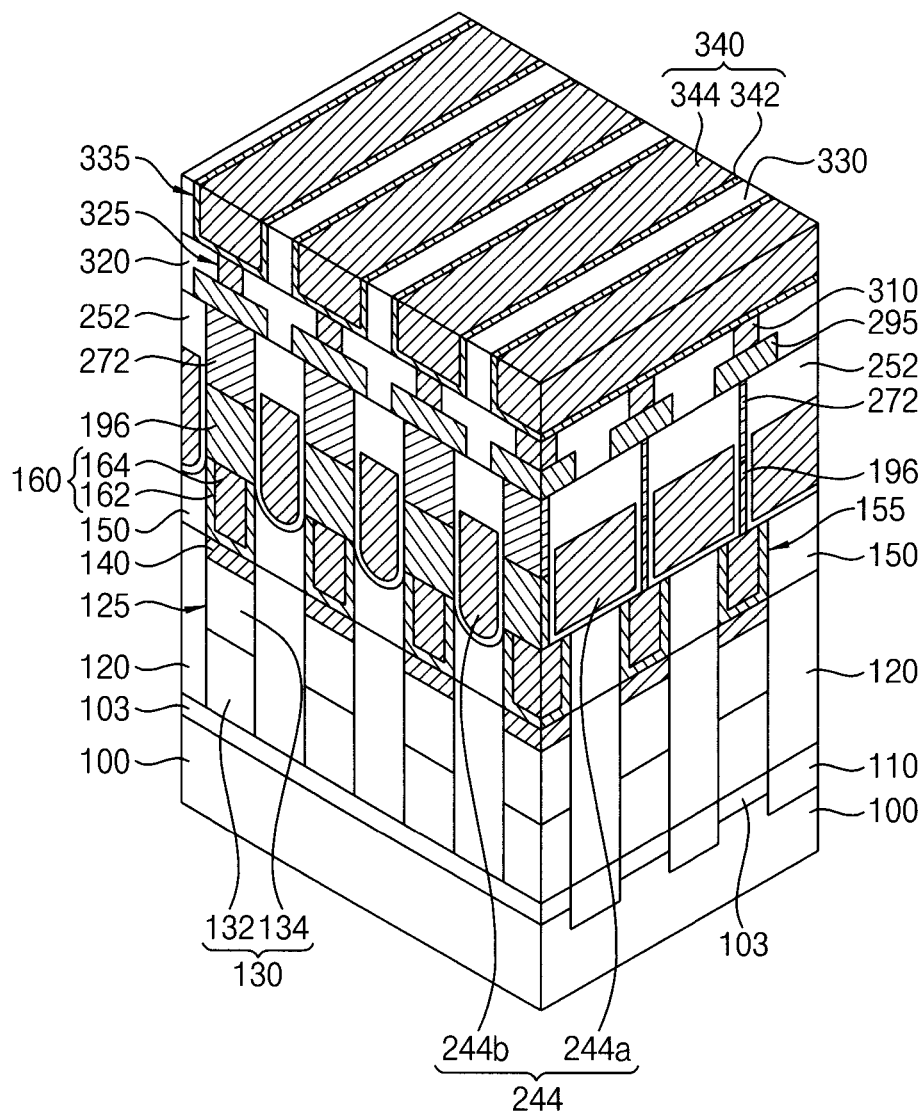
FIG. 120 is a perspective view illustrating a phase change memory device in accordance with some embodiments.

FIG. 120 is a perspective view illustrating a phase change memory device in accordance with some embodiments. The phase change memory device may be substantially the same as that illustrated with reference to FIG. 118 except for the location and direction of the lower electrode, the phase change material layer pattern and the heat sink. Additionally, the location and direction of the lower electrode, the phase change material layer pattern and the heat sink may be substantially the same as or similar to those of the phase change memory device illustrated with reference to FIG. 119. Thus, like reference numerals refer to like elements and detailed descriptions thereon are omitted herein.

Referring to FIG. 120, the phase change memory device may include a fourth lower electrode 196, a second phase change material layer pattern 272, an eleventh heat sink 244, a second upper electrode 295 and a second bit line 340.

Figure 121:
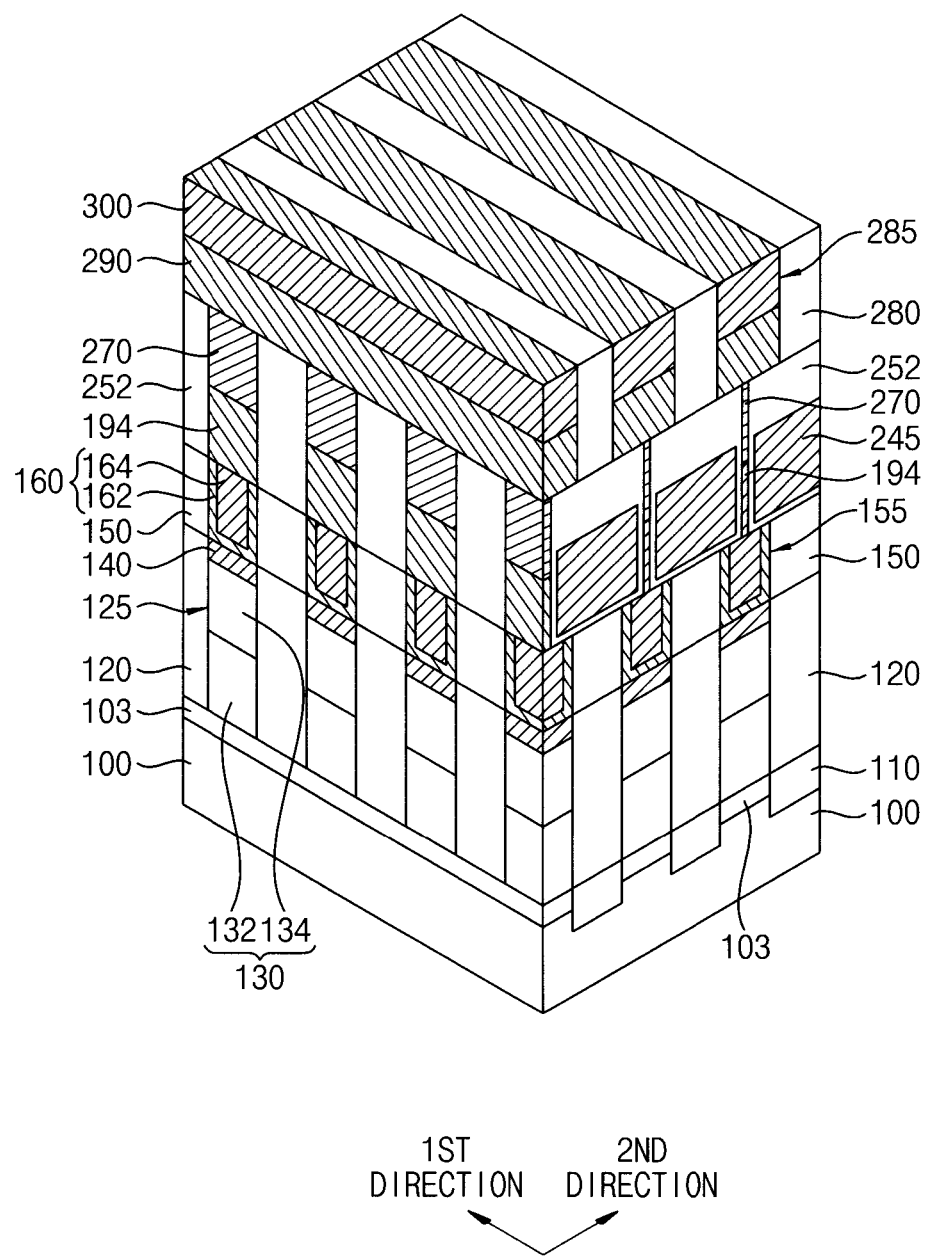
FIG. 121 is a perspective view illustrating a phase change memory device in accordance with some embodiments.
Figure 122:
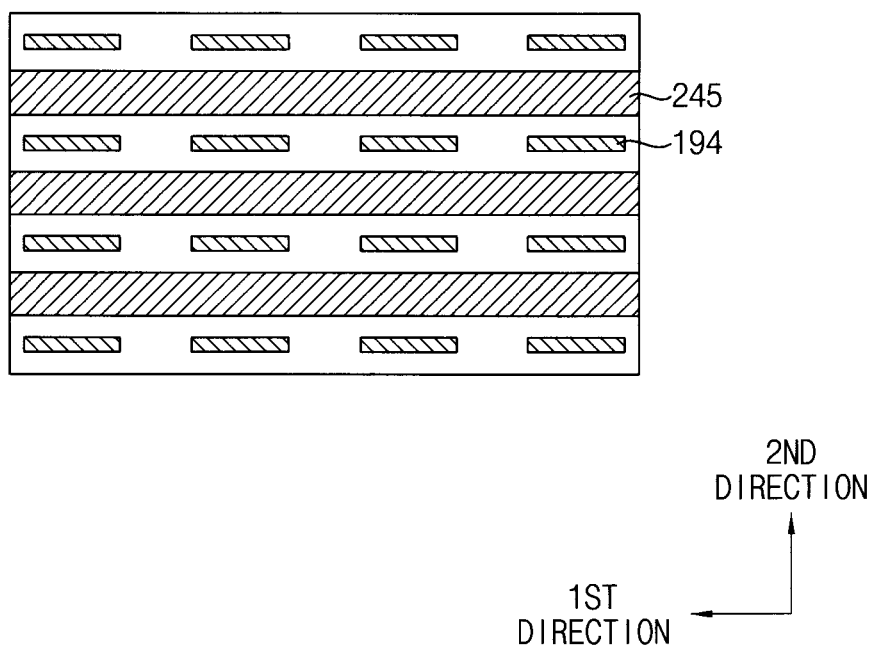
FIG. 122 is a plan view illustrating the positional relationship between lower electrodes and heat sinks of the phase change memory device.

FIG. 121 is a perspective view illustrating a phase change memory device in accordance with some embodiments, and FIG. 122 is a plan view illustrating the positional relationship between lower electrodes and heat sinks of the phase change memory device. The phase change memory device may be substantially the same as that illustrated with reference to FIG. 102 except for the location and shape of the heat sink. Thus, like reference numerals refer to like elements and detailed descriptions thereon are omitted herein.

Referring to FIGS. 121 to 122, the phase change memory device may include a third lower electrode 194, a first phase change material layer pattern 270, a twelfth heat sink 245, a first upper electrode 290 and a first bit line 300.

Unlike the first heat sink 232, the twelfth heat sink 245 may extend in the first direction and a plurality of twelfth heat sinks 232 may be formed in the second direction. That is, while the first heat sink 232 may be formed between the third lower electrodes 194 spaced apart from each other at a relatively short distance, the twelfth heat sink 245 may be formed between the third lower electrodes 194 spaced apart from each other at a relatively long distance.

In some embodiments, one twelfth heat sink 245 may be formed between the third lower electrodes 194 arranged in the second direction.

Figure 123:
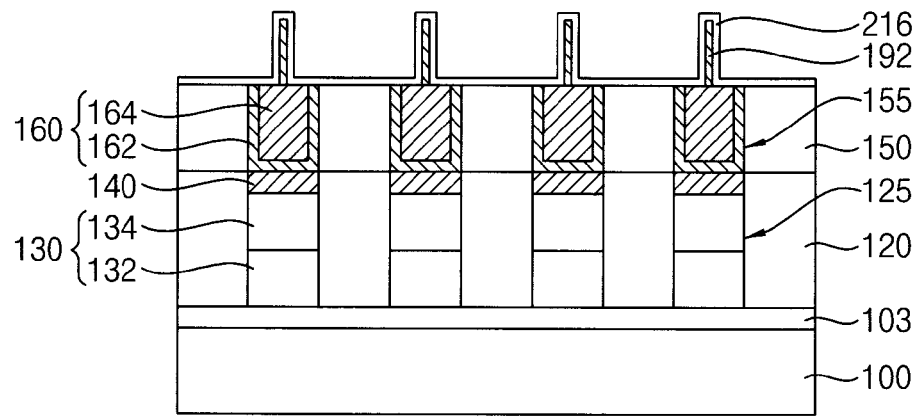
FIGS. 123 to 124 are cross-sectional views illustrating a method of manufacturing a phase change memory device in accordance with some embodiments.
Figure 124:
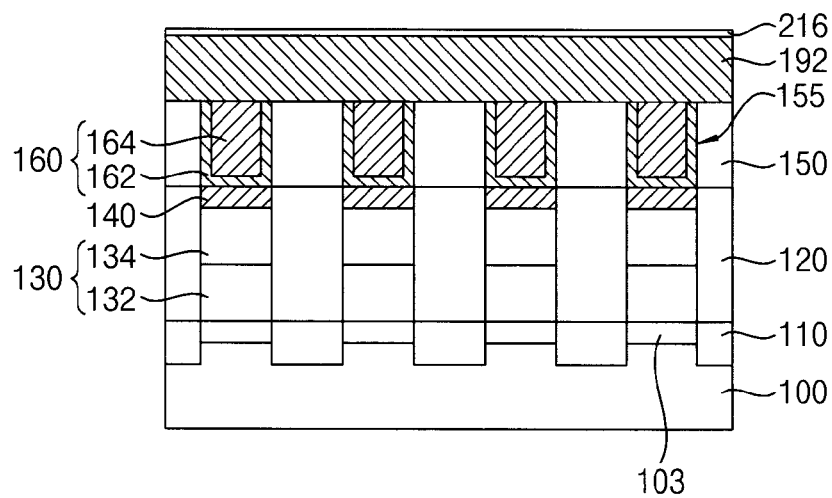

FIGS. 123 to 124 are cross-sectional views illustrating a method of manufacturing a phase change memory device in accordance with some embodiments. FIG. 123 is a cross-sectional view taken along the second direction, and FIG. 124 is a cross-sectional view taken along the first direction. This method may be used in manufacturing the phase change memory device of FIGS. 121 and 122, however, may not be limited thereto. This method may include processes substantially the same as or similar to those illustrated with reference to FIGS. 5 to 34, those illustrated with reference to FIGS. 103 to 110, and those illustrated with reference to FIGS. 80 to 87, and thus like reference numerals refer to like elements and detailed descriptions thereon are omitted herein.

First, processes substantially the same as or similar to those illustrated with reference to FIGS. 5 to 10 and 103 to 108 may be performed.

Referring now to FIGS. 123 and 124, a fifteenth insulation layer 216 may be formed on the second lower electrode layer pattern 192, the second insulation layer 150 and the plug 160.

The fifteenth insulation layer 216 may be formed to include a nitride, e.g., silicon nitride.

Processes substantially the same as or similar to those illustrated with reference to FIGS. 82 to 87 and 1 to 3 may be performed to manufacture the phase change memory device.

Figure 125:
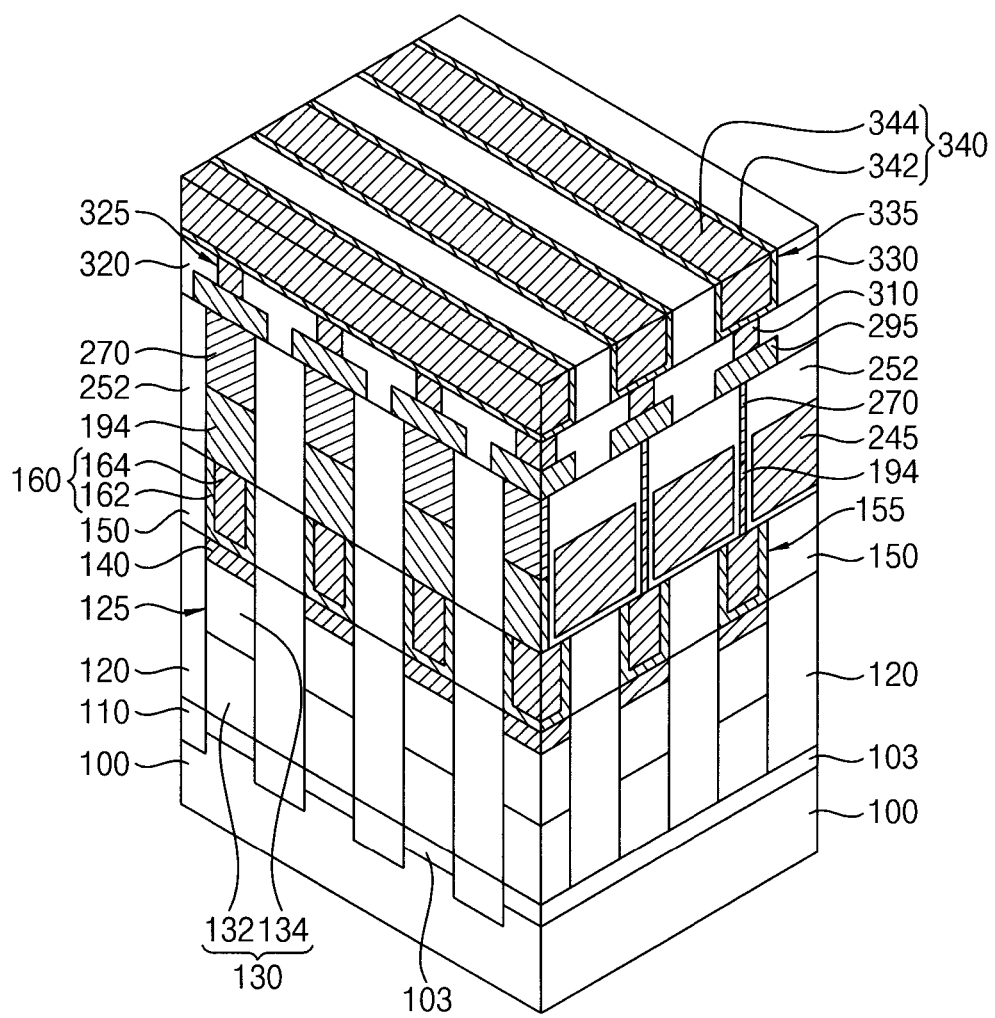
FIG. 125 is a perspective view illustrating a phase change memory device in accordance with some embodiments.

FIG. 125 is a perspective view illustrating a phase change memory device in accordance with some embodiments. The phase change memory device may be substantially the same as that illustrated with reference to FIGS. 121 and 122 except for the upper electrode and the bit line. Additionally, the upper electrode and the bit line of the phase change memory device may be substantially the same as or similar to those of the phase change memory device illustrated with reference to FIGS. 35 to 37. Thus, like reference numerals refer to like elements and detailed descriptions thereon are omitted herein.

Referring to FIG. 125, the phase change memory device may include a third lower electrode 194, a first phase change material layer pattern 270, a twelfth heat sink 245, a second upper electrode 295 and a second bit line 340.

Figure 126:
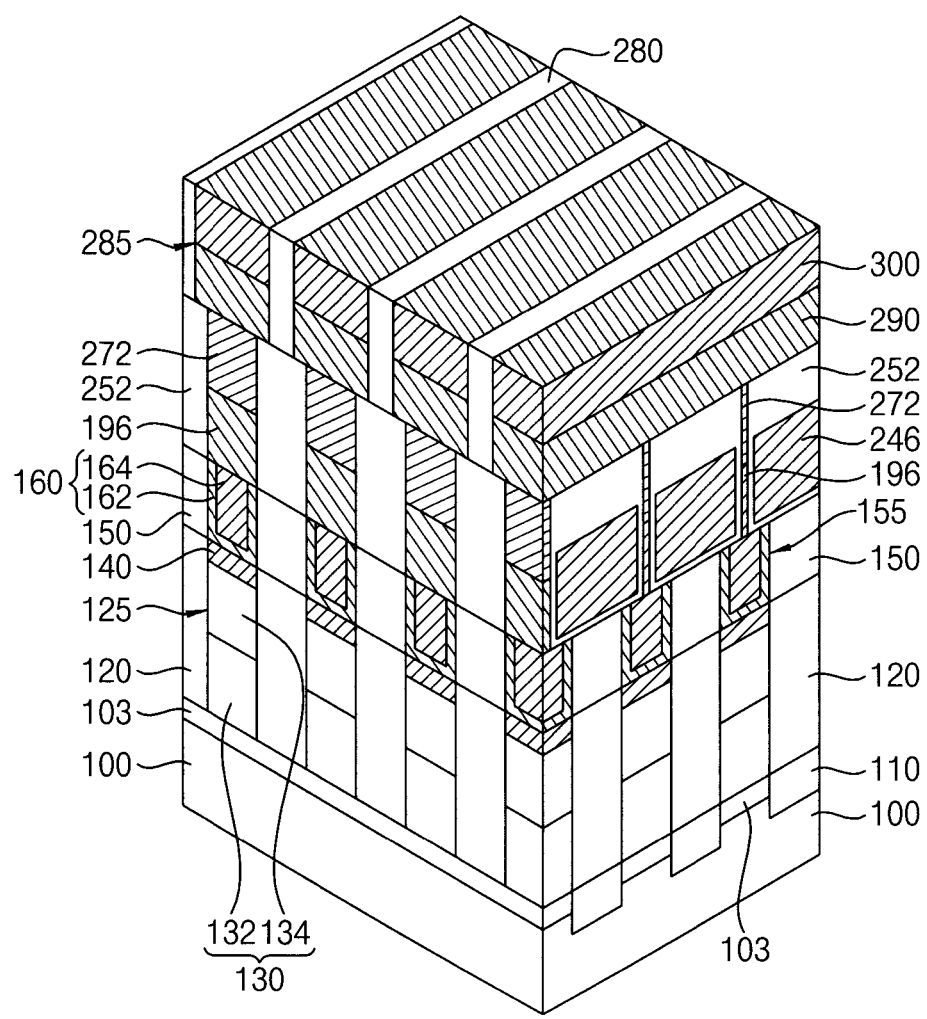
FIG. 126 is a perspective view illustrating a phase change memory device in accordance with some embodiments.

FIG. 126 is a perspective view illustrating a phase change memory device in accordance with some embodiments. The phase change memory device may be substantially the same as that illustrated with reference to FIGS. 121 and 122 except for the location and direction of the lower electrode, the phase change material layer pattern and the heat sink. Additionally, the location and direction of the upper electrode and the phase change material layer pattern may be substantially the same as or similar to those of the phase change memory device illustrated with reference to FIG. 112. Thus, like reference numerals refer to like elements and detailed descriptions thereon are omitted herein.

Referring to FIG. 126, the phase change memory device may include a fourth lower electrode 196, a second phase change material layer pattern 272, a thirteenth heat sink 246, a first upper electrode 290 and a first bit line 300.

The thirteenth heat sink 246 may extend in the second direction, and a plurality of thirteenth heat sinks 246 may be formed in the first direction. The thirteenth heat sink 246 may be formed between structures arranged in the first direction each of which may include the fourth lower electrodes 196 and the second phase change material layer patterns 272 disposed in the second direction.

In some embodiments, one thirteenth heat sink 246 may be formed between the fourth lower electrodes 196 arranged in the first direction.

In some embodiments, a top surface of the thirteenth heat sink 246 may be lower than a top surface of the second phase change material layer pattern 272, and thus may be lower than a bottom surface of the first upper electrode 290. Thus, the thirteenth heat sink 246 may be spaced apart from the first upper electrode 290. Additionally, the top surface of the thirteenth heat sink 246 may be higher at least than a bottom surface of the second phase change material layer pattern 272, and a bottom surface of the thirteenth heat sink 246 may be lower than a top surface of the fourth lower electrode 196. Thus, the thirteenth heat sink 246 may be formed adjacent to a region in which an exothermic reaction may occur vigorously according as the fourth lower electrode 196 heats the second phase change material layer pattern 272, that is, an interface between the fourth lower electrode 196 and the second phase change material layer pattern 272, so that the heat generated therefrom may be efficiently absorbed.

Figure 127:
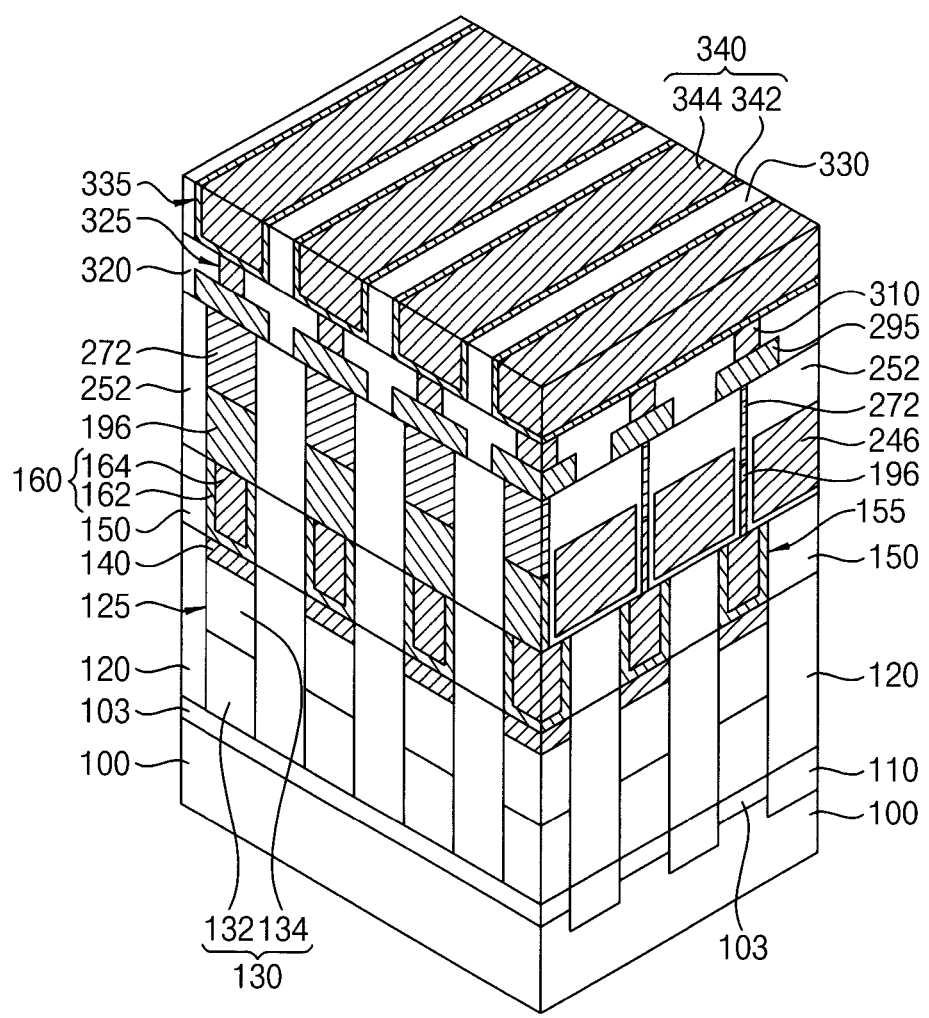
FIG. 127 is a perspective view illustrating a phase change memory device in accordance with some embodiments.

FIG. 127 is a perspective view illustrating a phase change memory device in accordance with some embodiments. The phase change memory device may be substantially the same as that illustrated with reference to FIG. 125 except for the location and direction of the lower electrode, the phase change material layer pattern and the heat sink. Additionally, the location and direction of the lower electrode, the phase change material layer pattern and the heat sink may be substantially the same as or similar to those of the phase change memory device illustrated with reference to FIG. 126. Thus, like reference numerals refer to like elements and detailed descriptions thereon are omitted herein.

Referring to FIG. 127, the phase change memory device may include a fourth lower electrode 196, a second phase change material layer pattern 272, a thirteenth heat sink 246, a second upper electrode 295 and a second bit line 340.

Figure 128:
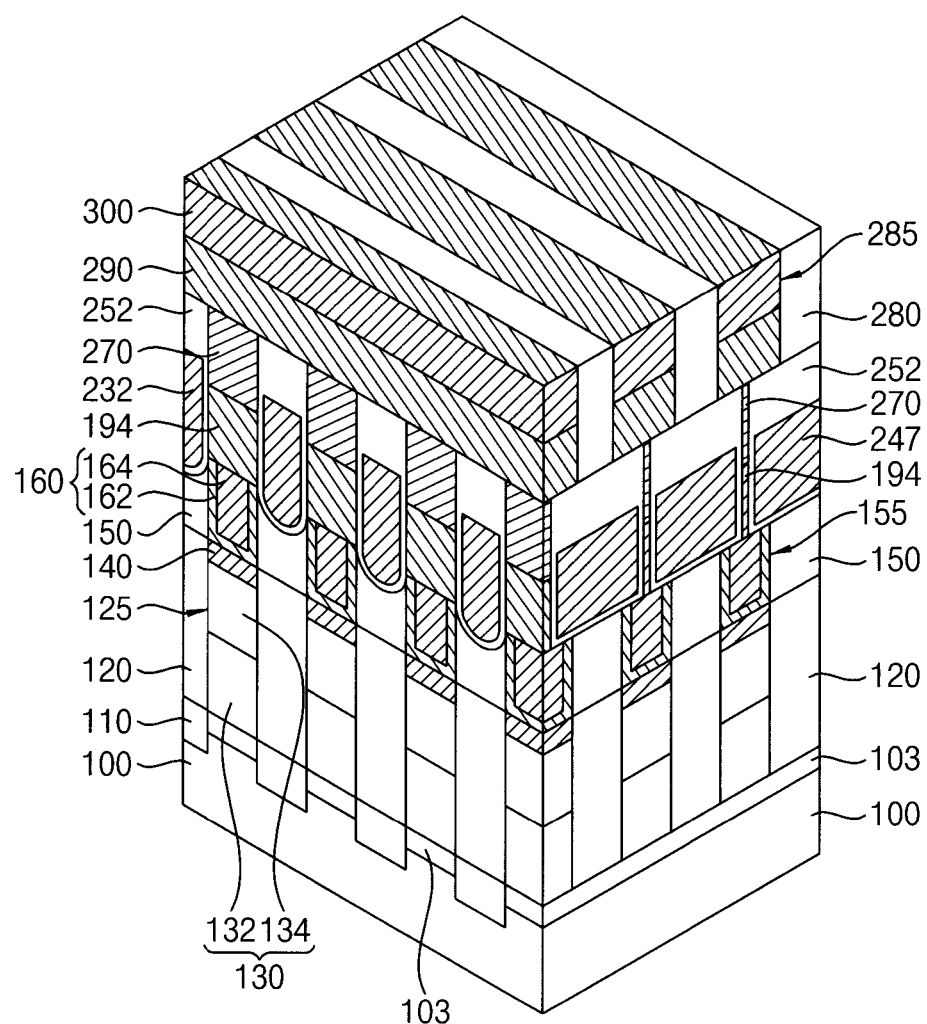
FIG. 128 is a perspective view illustrating a phase change memory device in accordance with some embodiments.
Figure 129:
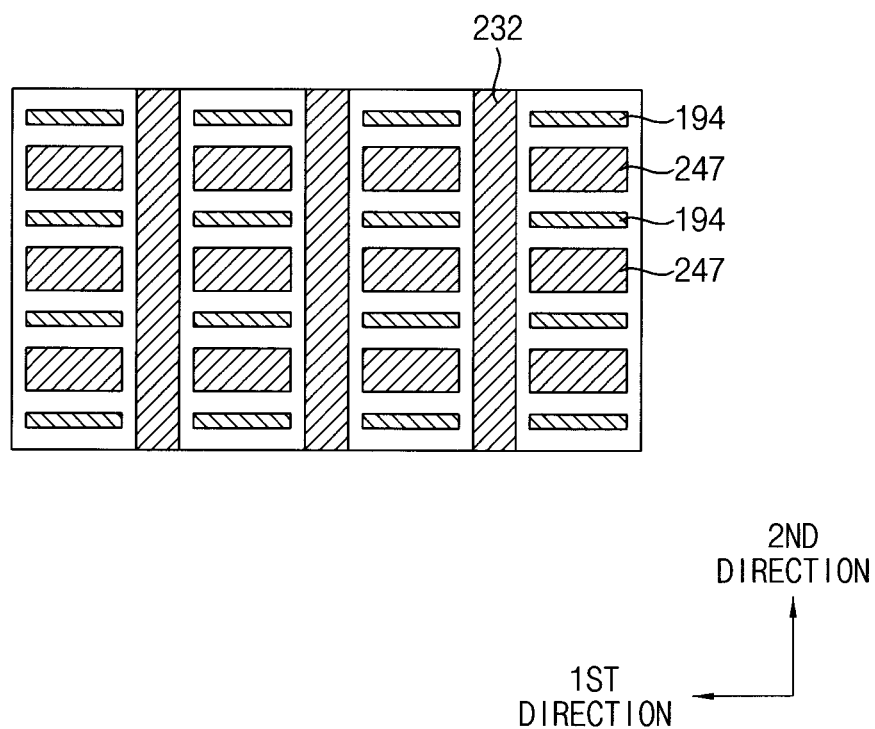
FIG. 129 is a plan view illustrating the positional relationship between lower electrodes and heat sinks of the phase change memory device.

FIG. 128 is a perspective view illustrating a phase change memory device in accordance with some embodiments, and FIG. 129 is a plan view illustrating the positional relationship between lower electrodes and heat sinks of the phase change memory device. The phase change memory device may be substantially the same as that illustrated with reference to FIG. 102 except for the location and shape of the heat sink. Thus, like reference numerals refer to like elements and detailed descriptions thereon are omitted herein.

Referring to FIGS. 128 to 129, the phase change memory device may include a third lower electrode 194, a first phase change material layer pattern 270, a first heat sink 232, a fourteenth heat sink 247, a first upper electrode 290 and a first bit line 300.

A plurality of fourteenth heat sinks 247 may be formed both in the first and second directions to form a fourteenth heat sink array. In some embodiments, one fourteenth heat sink 247 may be formed between the third lower electrodes 194 arranged in the second direction.

The phase change memory device may have both of the first and fourteenth heat sinks 232 and 247, thereby having an enhanced effect of absorbing and releasing heat.

Figure 130:
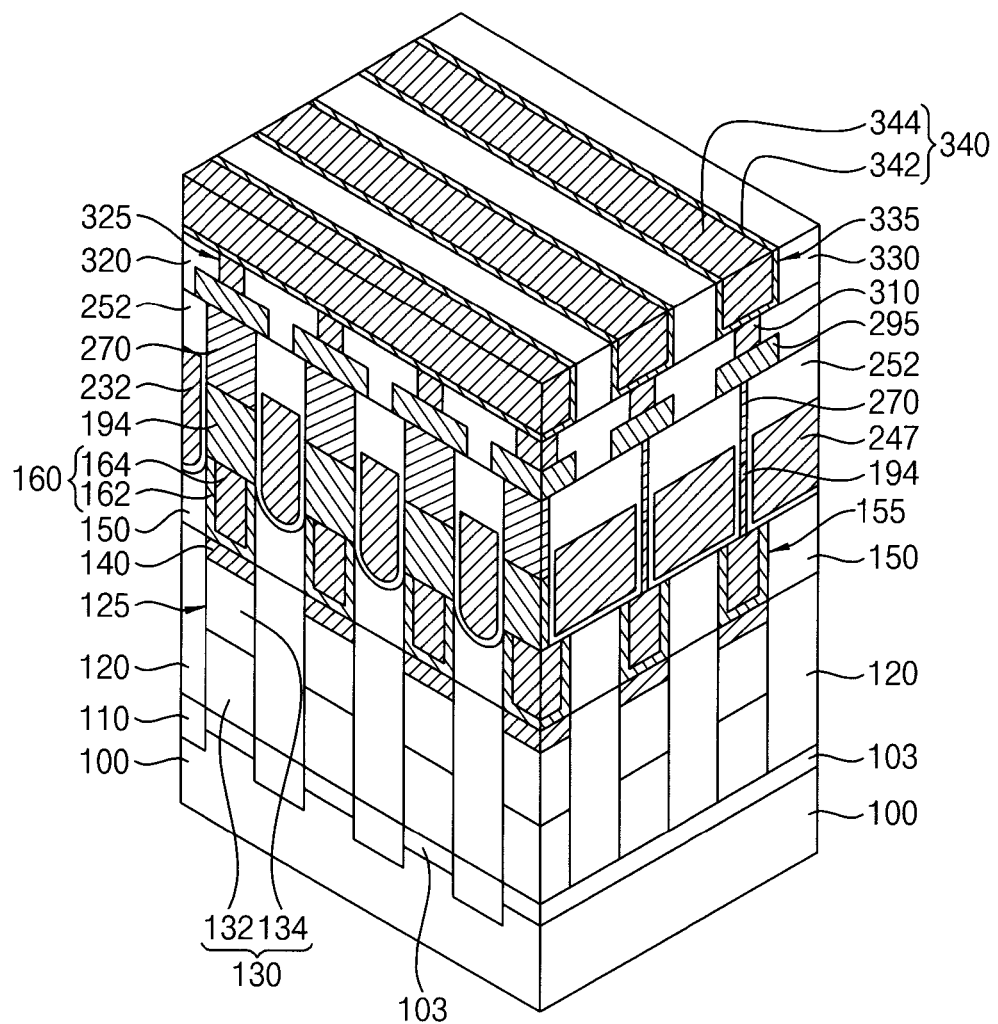
FIG. 130 is a perspective view illustrating a phase change memory device in accordance with some embodiments.

FIG. 130 is a perspective view illustrating a phase change memory device in accordance with some embodiments. The phase change memory device may be substantially the same as that illustrated with reference to FIGS. 128 and 129 except for the upper electrode and the bit line. Additionally, the upper electrode and the bit line of the phase change memory device may be substantially the same as or similar to those of the phase change memory device illustrated with reference to FIGS. 35 to 37. Thus, like reference numerals refer to like elements and detailed descriptions thereon are omitted herein.

Referring to FIG. 130, the phase change memory device may include a third lower electrode 194, a first phase change material layer pattern 270, a first heat sink 232, a fourteenth heat sink 247, a second upper electrode 295 and a second bit line 340.

Figure 131:
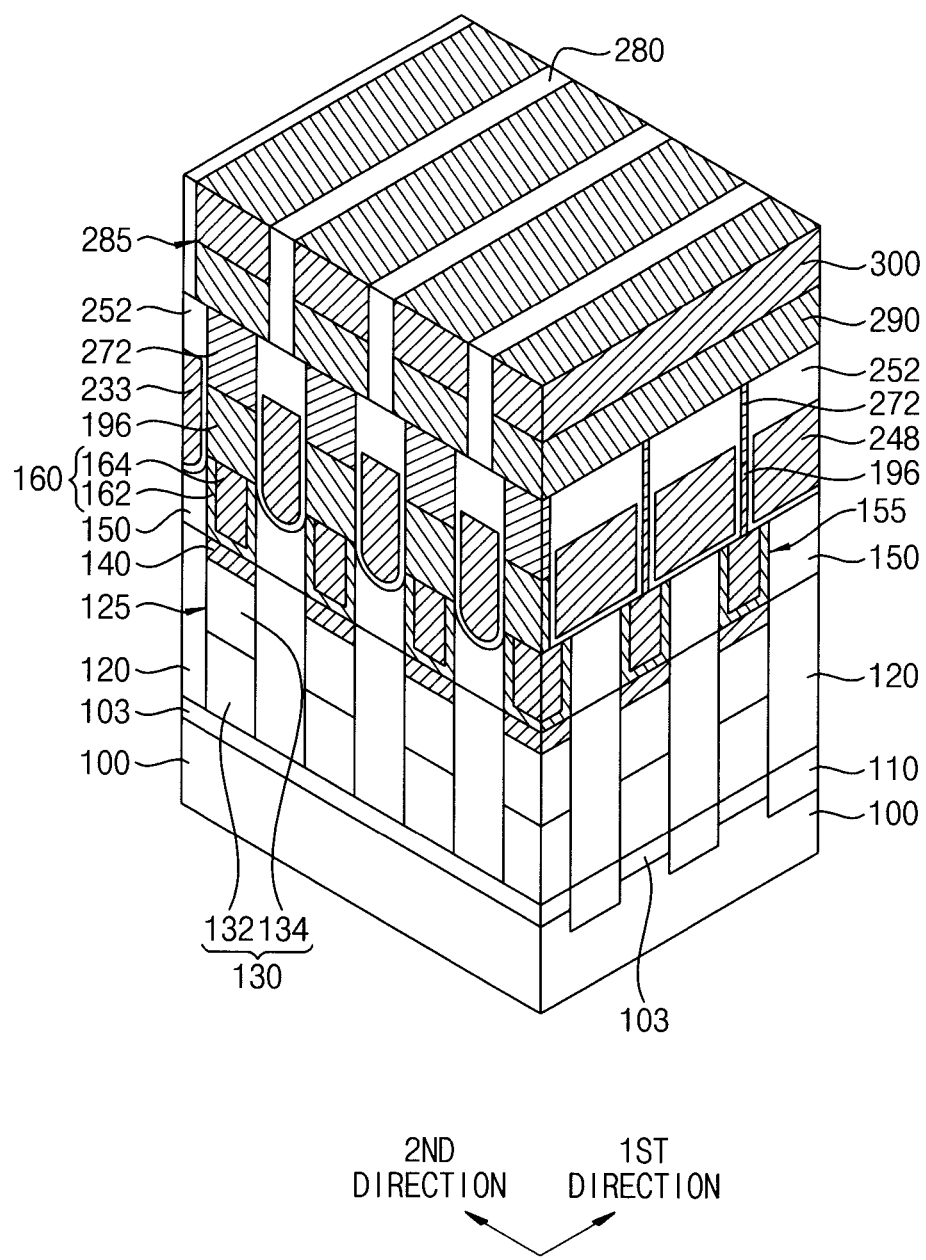
FIG. 131 is a perspective view illustrating a phase change memory device in accordance with some embodiments.

FIG. 131 is a perspective view illustrating a phase change memory device in accordance with some embodiments. The phase change memory device may be substantially the same as that illustrated with reference to FIGS. 128 and 129 except for the location and direction of the lower electrode, the phase change material layer pattern and the heat sink. Additionally, the location and direction of the upper electrode and the phase change material layer pattern may be substantially the same as or similar to those of the phase change memory device illustrated with reference to FIG. 112. Thus, like reference numerals refer to like elements and detailed descriptions thereon are omitted herein.

Referring to FIG. 131, the phase change memory device may include a fourth lower electrode 196, a second phase change material layer pattern 272, a second heat sink 233, a fifteenth heat sink 248, a first upper electrode 290 and a first bit line 300.

The fifteenth heat sink 248 may be formed both in the first and second directions to form a fifteenth heat sink array. In some embodiments, one fifteenth heat sink 248 may be formed between the fourth lower electrodes 196 arranged in the first direction.

The phase change memory device may have both of the second and fifteenth heat sinks 233 and 248, thereby having an enhanced effect of absorbing and releasing heat.

Figure 132:
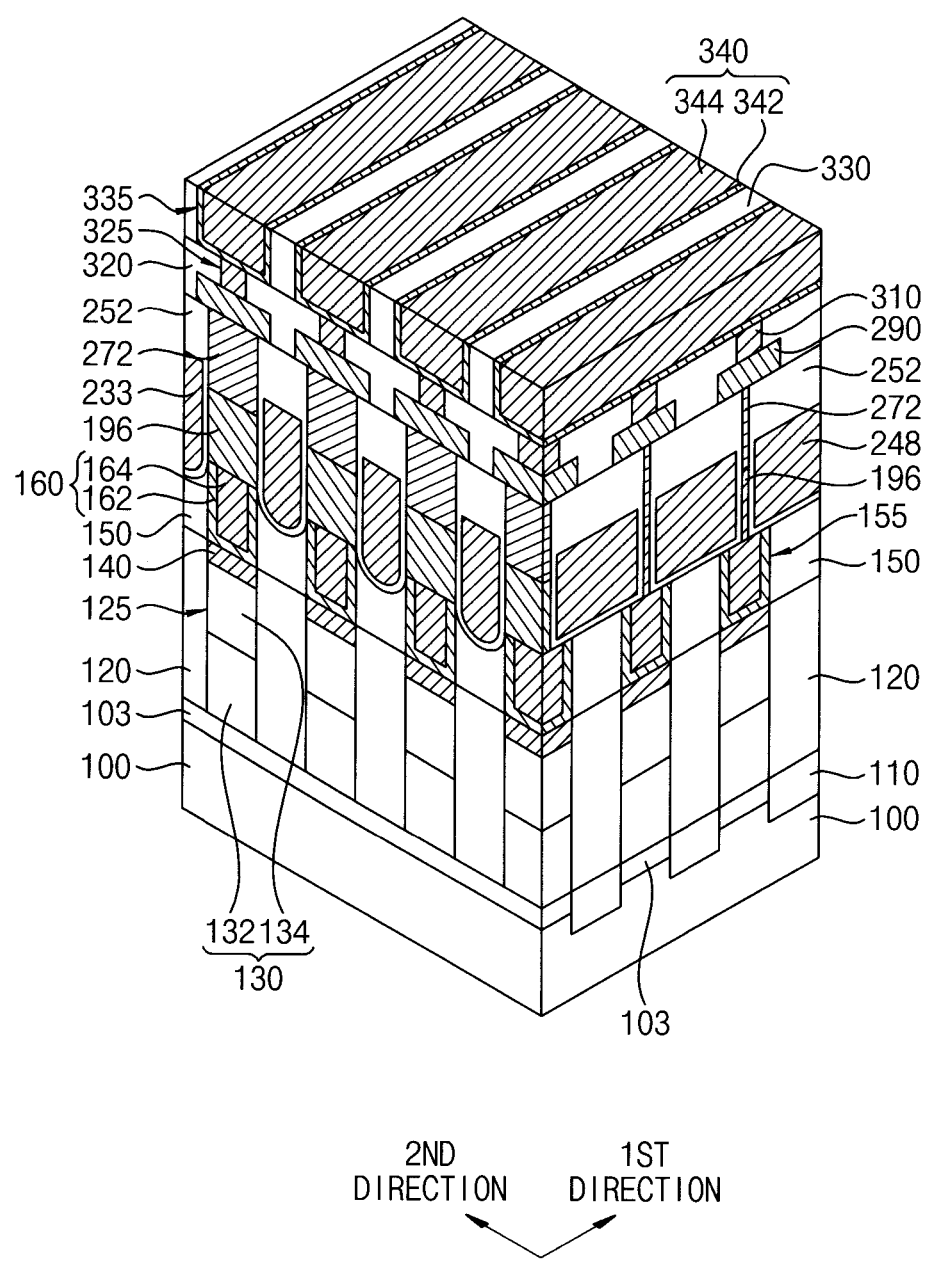

FIG. 132 is a perspective view illustrating a phase change memory device in accordance with some embodiments. The phase change memory device may be substantially the same as that illustrated with reference to FIG. 130 except for the location and direction of the lower electrode, the phase change material layer pattern and the heat sink. Additionally, the location and direction of the lower electrode, the phase change material layer pattern and the heat sink may be substantially the same as or similar to those of the phase change memory device illustrated with reference to FIG. 131. Thus, like reference numerals refer to like elements and detailed descriptions thereon are omitted herein.

Referring to FIG. 132, the phase change memory device may include a fourth lower electrode 196, a second phase change material layer pattern 272, a second heat sink 233, a fifteenth heat sink 248, a second upper electrode 295 and a second bit line 340.

According to some embodiments, the heat sink may be formed between the lower electrodes spaced apart from each other at a relatively short distance, so that the thermal disturbance between cells may be substantially reduced. Additionally, the heat sink may be electrically insulated and spaced apart from the phase change memory unit including the lower electrode, the phase change material layer pattern and the upper electrode, and thus a undesired conduction path may not be formed. Furthermore, the heat sink may be formed adjacent to the plug under the lower electrode, so that heat from the phase change memory unit may be easily transferred to the plug, thereby enhancing the absorption of heat. The above present inventive concept may be applied to various types of memory devices having circuit patterns in a narrow area.

The foregoing is illustrative of various embodiments and is not to be construed as limiting thereof. Although a some embodiments have been described, those skilled in the art will readily appreciate that many modifications are possible in the other embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of manufacturing a phase change memory device, the method comprising:
    forming a lower electrode on a substrate, including:
        forming a lower electrode layer pattern; and
        forming a first recess in the lower electrode layer pattern;
    forming a heat sink in the first recess adjacent to and spaced apart from the lower electrode, wherein forming the heat sink includes:
        forming a first insulation layer on the substrate to cover the lower electrode;
        forming a metal layer on the first insulation layer to sufficiently fill the first recess space adjacent the lower electrode; and
    removing an upper portion of the metal layer to a level lower than the top surface of the lower electrode;
    forming a phase change material layer pattern on the lower electrode; and
    forming an upper electrode on the phase change material layer pattern;
    wherein forming the heat sink includes forming the heat sink having a top surface lower than a top surface of the upper electrode.

2. The method of claim 1, further comprising
    forming a first insulation layer on the substrate to cover the lower electrode;
    forming the heat sink on a portion of the first insulation layer;
    forming a second insulation layer on the first insulation layer to cover the heat sink;
    removing upper portions of the first and second insulation layers to expose the lower electrode;
    removing an upper portion of the exposed lower electrode to form a second recess; and
    forming the phase change material layer pattern to fill the second recess.

3. The method of claim 1, wherein:
    forming the lower electrode includes forming a plurality of lower electrodes in both first and second directions to form a lower electrode array;
    forming the upper electrode includes forming a plurality of upper electrodes in the second direction, each upper electrode extending in the first direction; and
    forming the heat sink includes forming a plurality of heat sinks between structures arranged in the first direction, each structure including a corresponding lower electrode and a corresponding phase change material layer pattern disposed in the second direction, and each heat sink extending in the second direction.

4. The method of claim 3, further comprising:
prior to forming the lower electrodes, forming a plurality of word lines electrically connected to the plurality of lower electrodes, the word lines being formed in the first direction, and each word line extending in the second direction; and
after forming the upper electrodes, forming bit lines electrically connected to the upper electrodes, respectively, each bit line extending in the first direction.

5. The method of claim 1, wherein forming the heat sink includes:
removing an upper portion of the metal layer to form the heat sink filling a lower portion of the first recess.

6. The method of claim 1, wherein forming the phase change material layer pattern on the lower electrode comprises, after removing the upper portion of the metal layer to form the heat sink:
forming a second insulation layer on the first insulation layer to cover the heat sink;
removing upper portions of the first and second insulation layers to expose the lower electrode;
removing an upper portion of the exposed lower electrode to form a second recess; and
forming the phase change material layer pattern to fill the second recess.

7. A method of manufacturing a phase change memory device, the method comprising:
forming a first metal layer on a substrate;
patterning the first metal layer to form lower electrodes with first recesses between the lower electrodes;
forming a first insulating layer on the lower electrodes;
forming a second metal layer on the first insulating layer in the first recesses;
removing an upper portion of the second metal layer to form a heat sink;
forming a second insulating layer on the first insulating layer and the heat sink;
removing at least a portion of the first and second insulating layers to expose the lower electrode;
removing an upper portion of the lower electrodes to form second recesses; and
forming a phase change material in the second recesses.

* * * * *